US011398605B2

(12) United States Patent
Obana et al.

(10) Patent No.: US 11,398,605 B2
(45) Date of Patent: Jul. 26, 2022

(54) PHOTOELECTRIC CONVERSION ELEMENT AND SOLID-STATE IMAGING DEVICE

(71) Applicant: SONY CORPORATION, Tokyo (JP)

(72) Inventors: Yoshiaki Obana, Kanagawa (JP); Yosuke Saito, Tokyo (JP); Norikazu Nakayama, Kanagawa (JP); Yuki Negishi, Kanagawa (JP); Yuta Hasegawa, Kanagawa (JP); Ichiro Takemura, Kanagawa (JP); Osamu Enoki, Kanagawa (JP); Nobuyuki Matsuzawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/082,834

(22) PCT Filed: Mar. 14, 2017

(86) PCT No.: PCT/JP2017/010212
§ 371 (c)(1),
(2) Date: Sep. 6, 2018

(87) PCT Pub. No.: WO2017/159684
PCT Pub. Date: Sep. 21, 2017

(65) Prior Publication Data
US 2019/0081251 A1    Mar. 14, 2019

(30) Foreign Application Priority Data

Mar. 15, 2016 (JP) .............................. JP2016-051022
Nov. 10, 2016 (JP) .............................. JP2016-219444
Jan. 17, 2017 (WO) .................. PCT/JP2017/001354

(51) Int. Cl.
*H01L 51/00* (2006.01)
*H01L 51/42* (2006.01)
(Continued)

(52) U.S. Cl.
CPC .... *H01L 51/0074* (2013.01); *H01L 27/14603* (2013.01); *H01L 27/14609* (2013.01);
(Continued)

(58) Field of Classification Search
None
See application file for complete search history.

(56) References Cited

U.S. PATENT DOCUMENTS

| 4,222,739 | A |  | 9/1980 | Kagi |
| 5,864,044 | A | * | 1/1999 | Van Lier .............. C07D 487/22 546/13 |

(Continued)

FOREIGN PATENT DOCUMENTS

| CN | 102034933 A | 4/2011 |
| CN | 104412404 A | 3/2015 |

(Continued)

OTHER PUBLICATIONS

Machine language translation of WO 2007/125671 (Year: 2007).*

(Continued)

*Primary Examiner* — Erik Kielin
(74) *Attorney, Agent, or Firm* — Sheridan Ross P.C.

(57) ABSTRACT

A photoelectric conversion element according to the disclosure includes: a first electrode and a second electrode that are disposed to face each other; and a photoelectric conversion layer that is provided between the first electrode and the second electrode, and contains at least one kind of polycyclic aromatic compound represented by any one of the following general formula (1), the following general formula (2), and the following general formula (3):

(Continued)

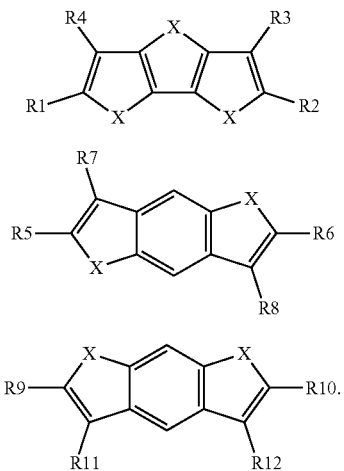

16 Claims, 20 Drawing Sheets

(51) Int. Cl.
  *H01L 27/30* (2006.01)
  *H01L 27/146* (2006.01)
  *H01L 51/44* (2006.01)
(52) U.S. Cl.
  CPC ........ *H01L 27/305* (2013.01); *H01L 51/0073* (2013.01); *H01L 51/4246* (2013.01); *H01L 51/441* (2013.01); *H01L 51/0046* (2013.01); *H01L 51/0078* (2013.01); *Y02E 10/549* (2013.01)

(56) References Cited

U.S. PATENT DOCUMENTS

| | | | |
|---|---|---|---|
| 2003/0021912 A1* | 1/2003 | Farrand | C07D 495/14 428/1.1 |
| 2011/0019042 A1* | 1/2011 | Yamaguchi | H01L 27/14632 348/280 |
| 2011/0049477 A1 | 3/2011 | Meng et al. | |
| 2011/0049478 A1* | 3/2011 | Meng | C07D 209/86 257/40 |
| 2012/0074396 A1 | 3/2012 | Meng et al. | |
| 2012/0193689 A1* | 8/2012 | Park | H01L 27/307 257/290 |
| 2013/0207081 A1 | 8/2013 | Adachi et al. | |
| 2013/0248839 A1 | 9/2013 | Meng et al. | |
| 2013/0333758 A1* | 12/2013 | Okabe | C07F 9/5329 136/263 |
| 2014/0127855 A1* | 5/2014 | Benwadih | H01L 51/0012 438/99 |
| 2015/0108409 A1 | 4/2015 | Meyer et al. | |
| 2015/0194469 A1* | 7/2015 | Joei | H01L 27/1461 257/40 |
| 2016/0020401 A1 | 1/2016 | Bulliard et al. | |
| 2016/0043318 A1* | 2/2016 | Yagi | H01L 51/008 257/40 |
| 2016/0204156 A1* | 7/2016 | Togashi | H01L 23/481 257/292 |
| 2016/0380222 A1* | 12/2016 | Satoh | H01L 51/448 257/40 |
| 2017/0054089 A1 | 2/2017 | Obana et al. | |

FOREIGN PATENT DOCUMENTS

| | | | | |
|---|---|---|---|---|
| EP | 1275651 | | 1/2003 | |
| JP | S54-63129 | | 5/1979 | |
| JP | 2006-089413 | | 4/2006 | |
| JP | 2013-191821 | | 9/2013 | |
| JP | 2015-521205 | | 7/2015 | |
| JP | 2015-233117 | | 12/2015 | |
| JP | 2016-009722 | | 1/2016 | |
| JP | 2016-025345 | | 2/2016 | |
| WO | WO 2007/125671 | | 11/2007 | |
| WO | WO-2014007132 A1 * | | 1/2014 | ........ H01L 27/14634 |
| WO | WO-2015025723 A1 * | | 2/2015 | |

OTHER PUBLICATIONS

Machine language translation of JP 2006-089413 A (Year: 2006).*
Lee, et al. "Green-Sensitive Organic Photodetectors with High Sensitivity and Spectral Selectivity Using Subphthalocyanine Derivatives", ACS Applied Materials & Interfaces, vol. 5, No. 24, 2013, p. 13089-13095 (Year: 2013).*
Sullivan, et al., "Halogenated Boron Subphthalocyanines as Light Harvesting Electron Acceptors in Organic Photovoltaics", Advanced Energy Materials, vol. 1, No. 3, May 2011, pp. 352-355. (Year: 2011).*
Liu et al., "High-Performance Solar Cells using a Solution-Processed Small Molecule Containing Benzodithiophene Unit," Advanced Materials, vol. 23, No. 45, 2011, pp. 5387-5391.
Fan et al., "A new molecule with indolone chromophore as the electron accepting unit for efficient organic solar cells," Dyes and Pigments, vol. 113, 2015, pp. 458-464.
Kwon et al., "Vacuum processable donor material based on dithieno[3,2-b:2',3'-d]thiophene and pyrene for efficient organic solar cells," RSC Advances, vol. 4, 2014, pp. 24453-24457.
Extended European Search Report for European Patent Application No. 17766682.3, dated Feb. 26, 2019, 9 pages.
International Search Report prepared by the Japan Patent Office dated May 23, 2017, for International Application No. PCT/JP2017/010212.
Official Action (with English translation) for Korea Patent Application No. 10-2018-7022336, dated Jan. 4, 2021, 9 pages.
Official Action (with English translation) for Japan Patent Application No. 2018-505953, dated Mar. 8, 2022, 8 pages.

* cited by examiner

[FIG. 2]
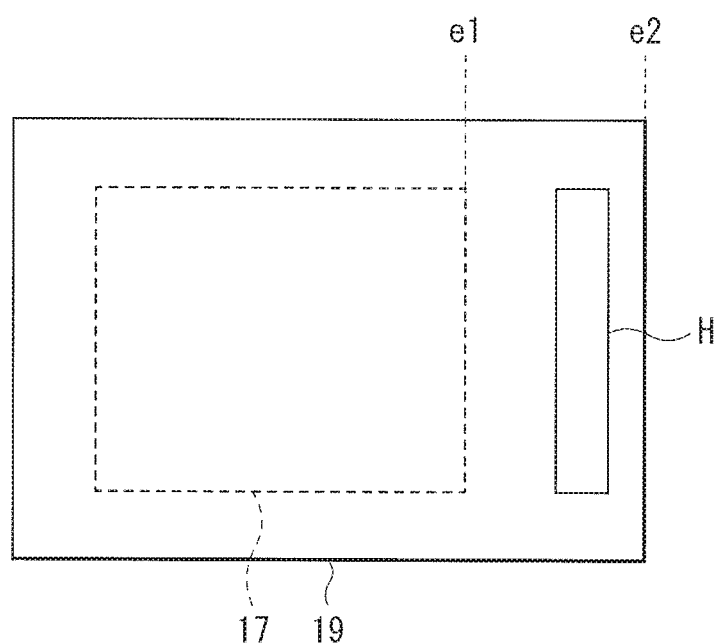

[ FIG. 3A ]
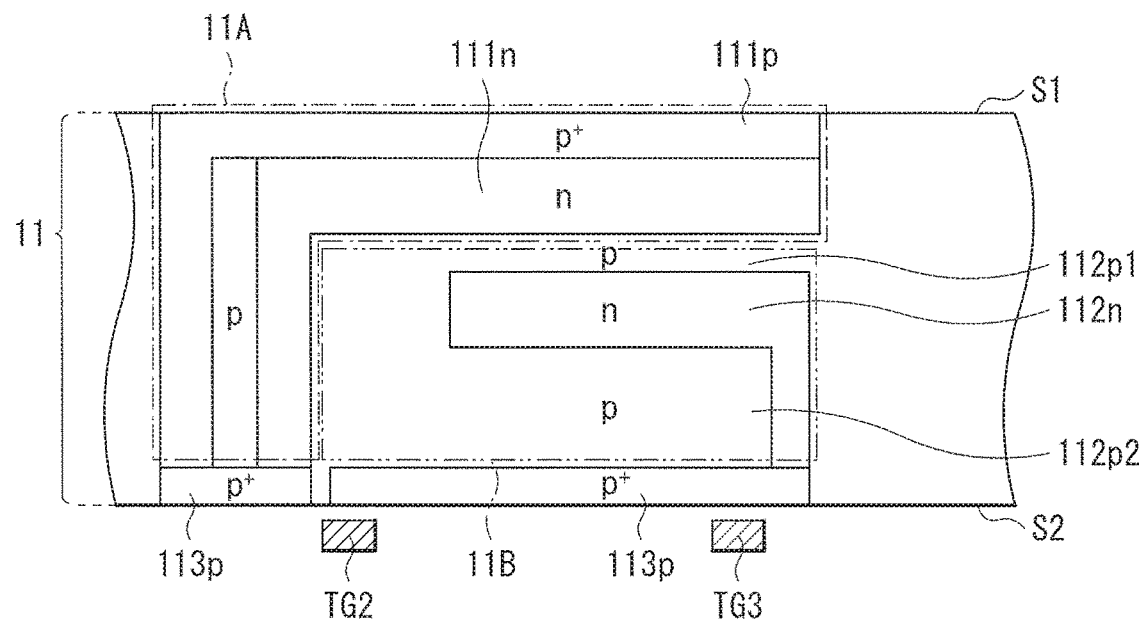
[ FIG. 3B ]
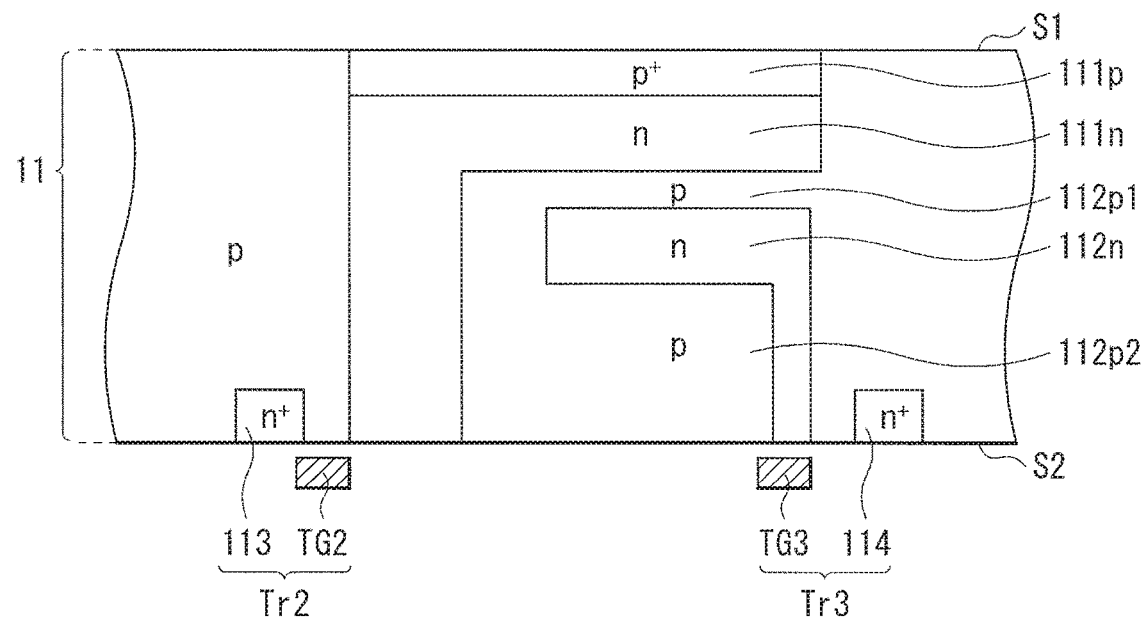

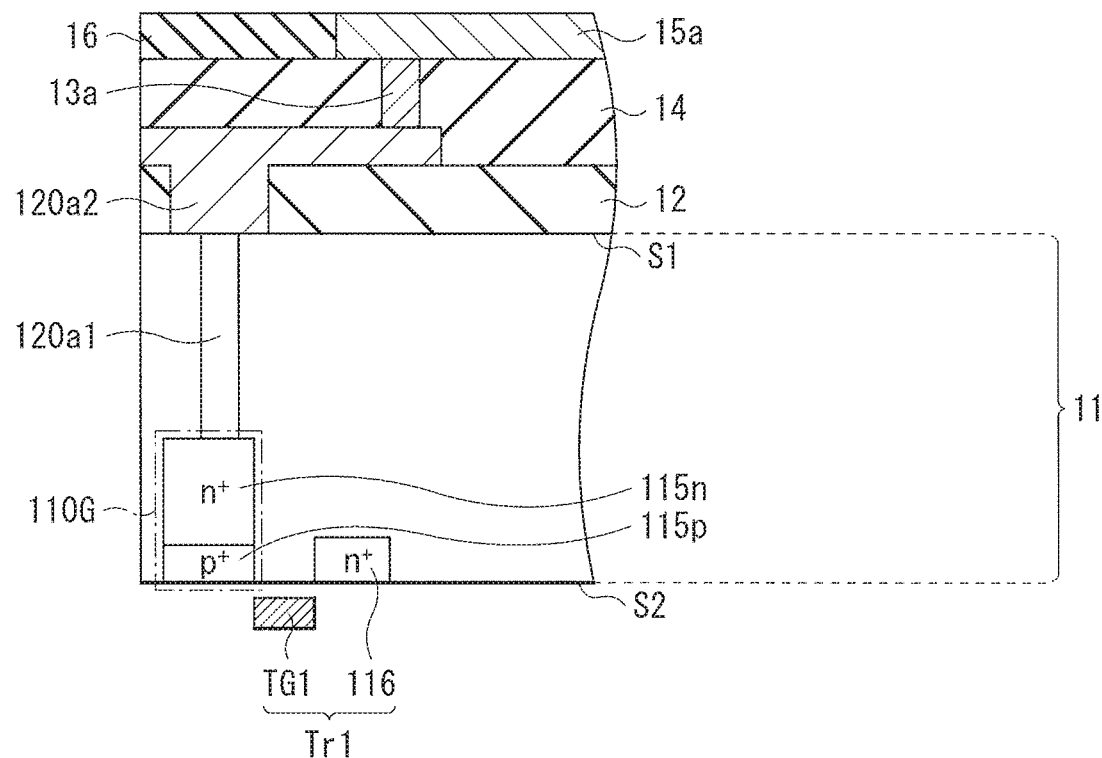
[ FIG. 4 ]

[ FIG. 5A ]
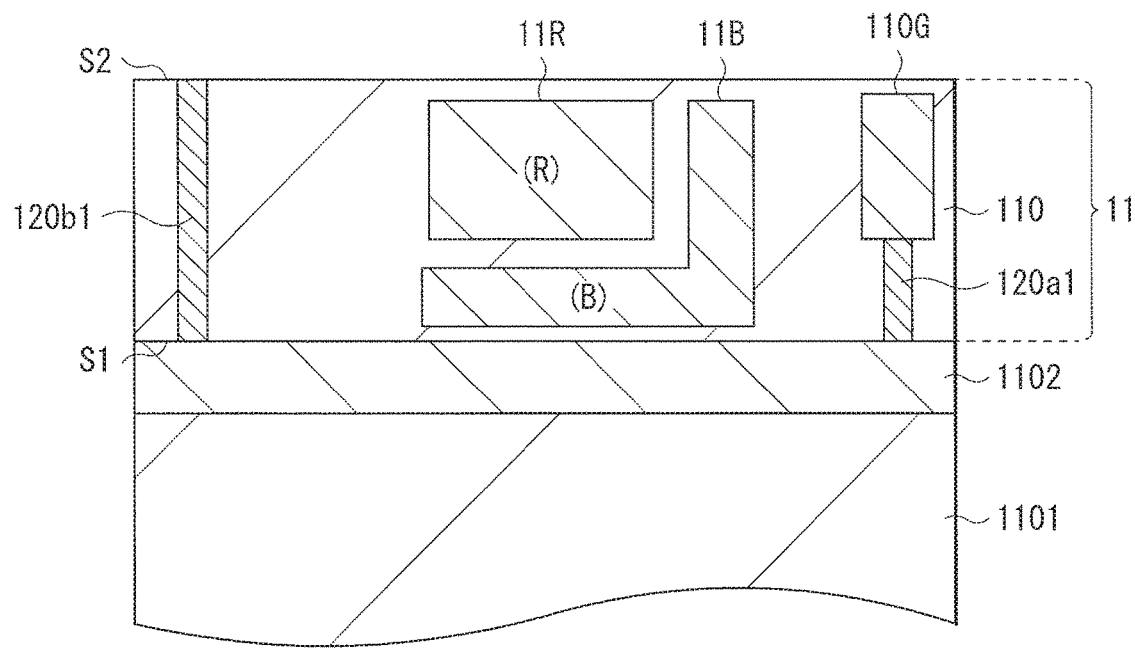
[ FIG. 5B ]
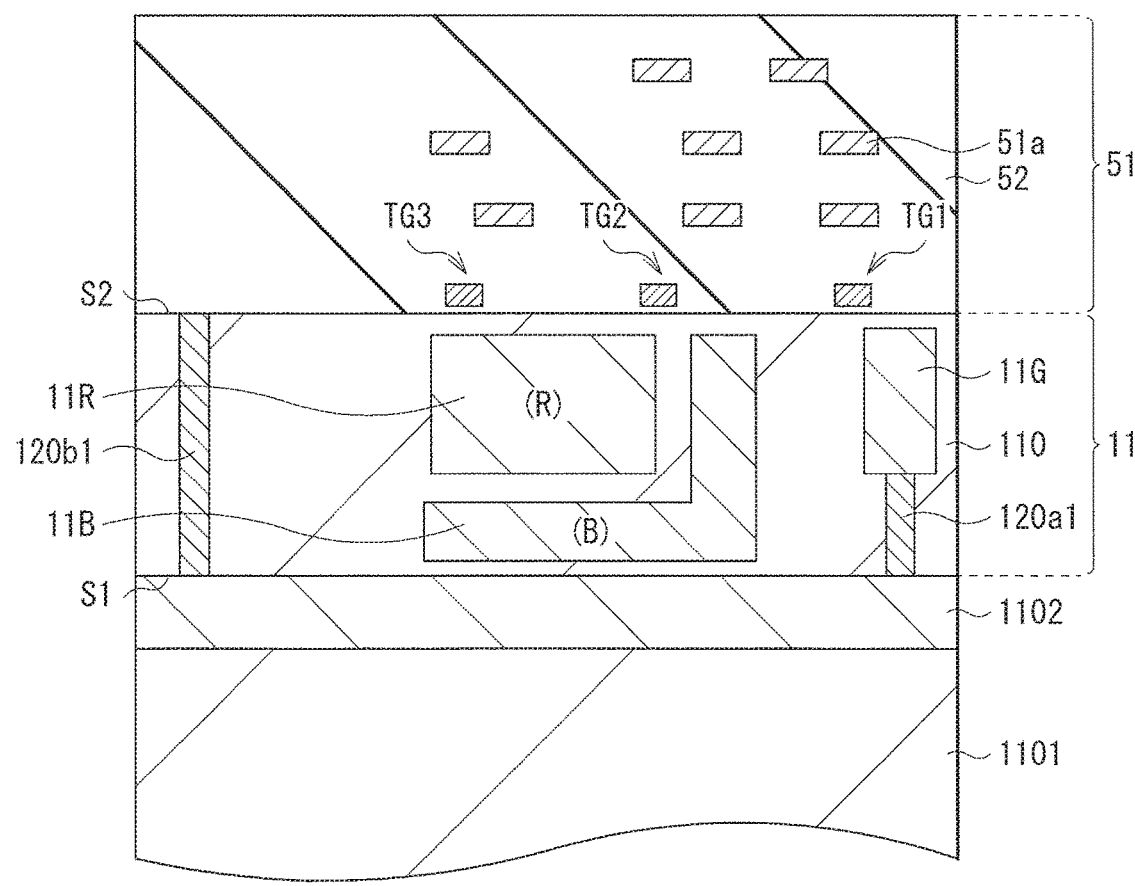

[ FIG. 6A ]
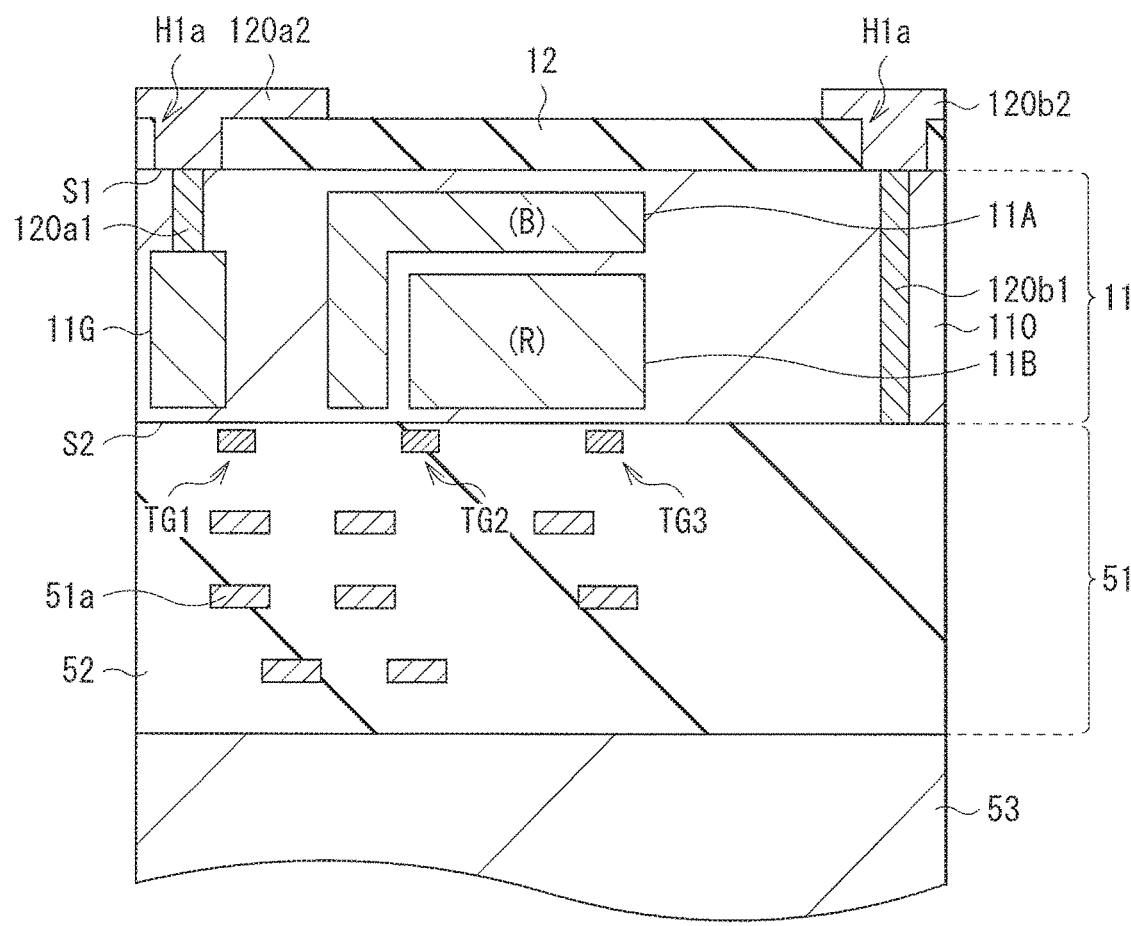

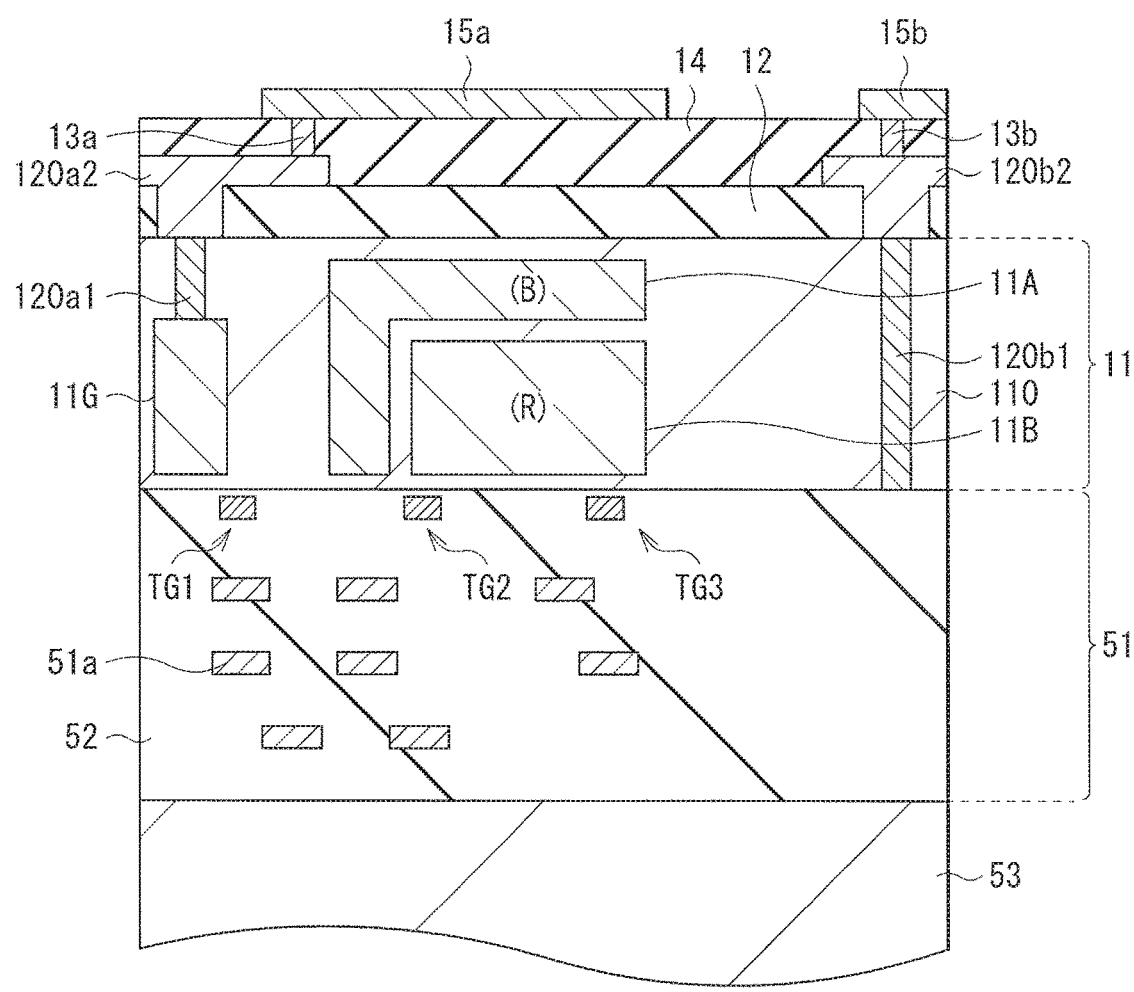
[FIG. 6B]

[FIG. 7A]
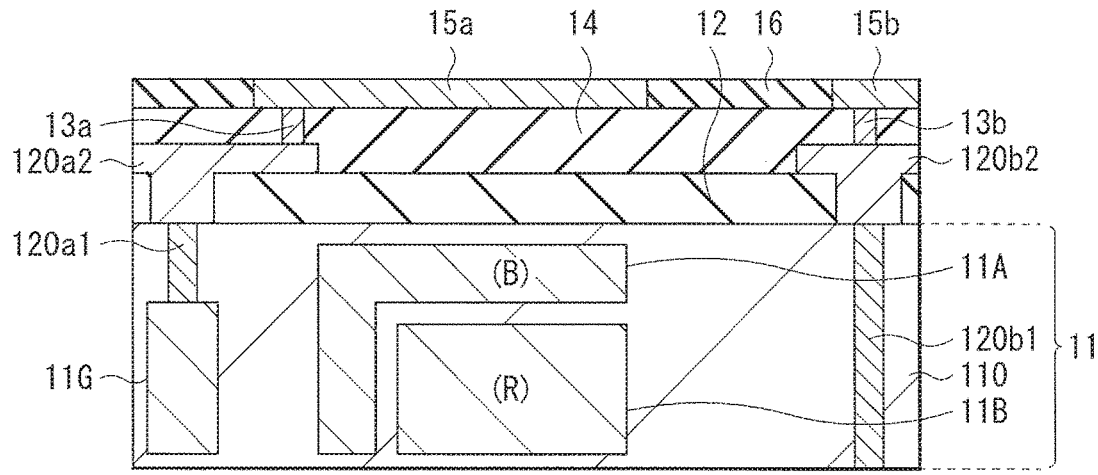
[FIG. 7B]
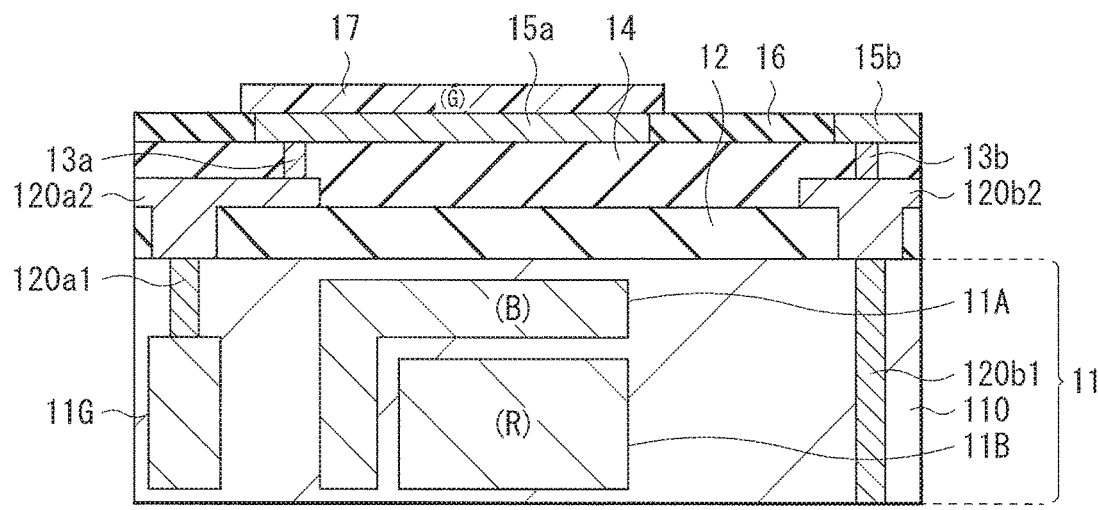
[FIG. 7C]
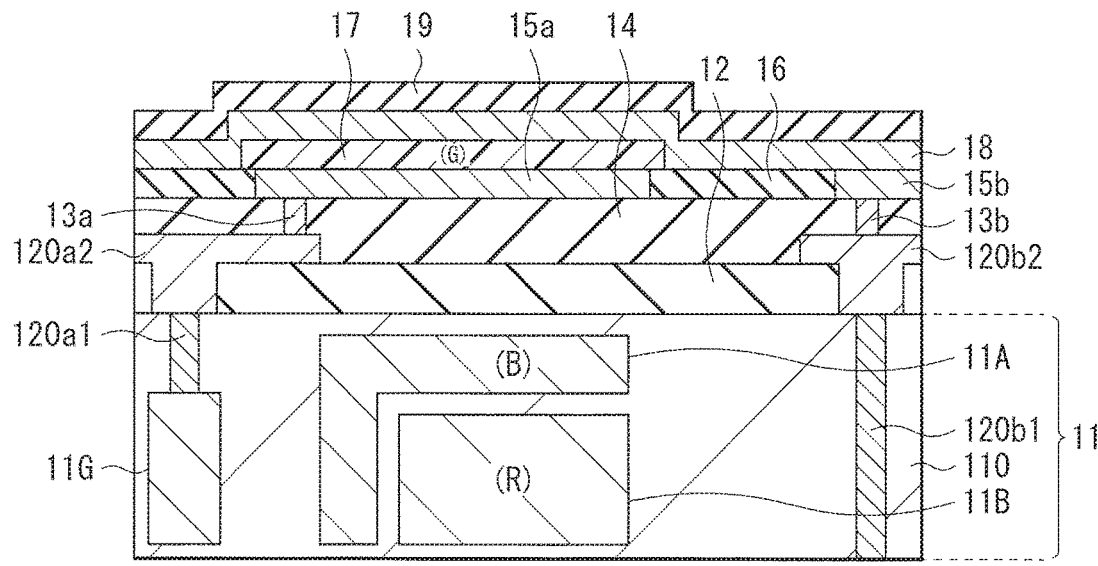

[ FIG. 8 ]
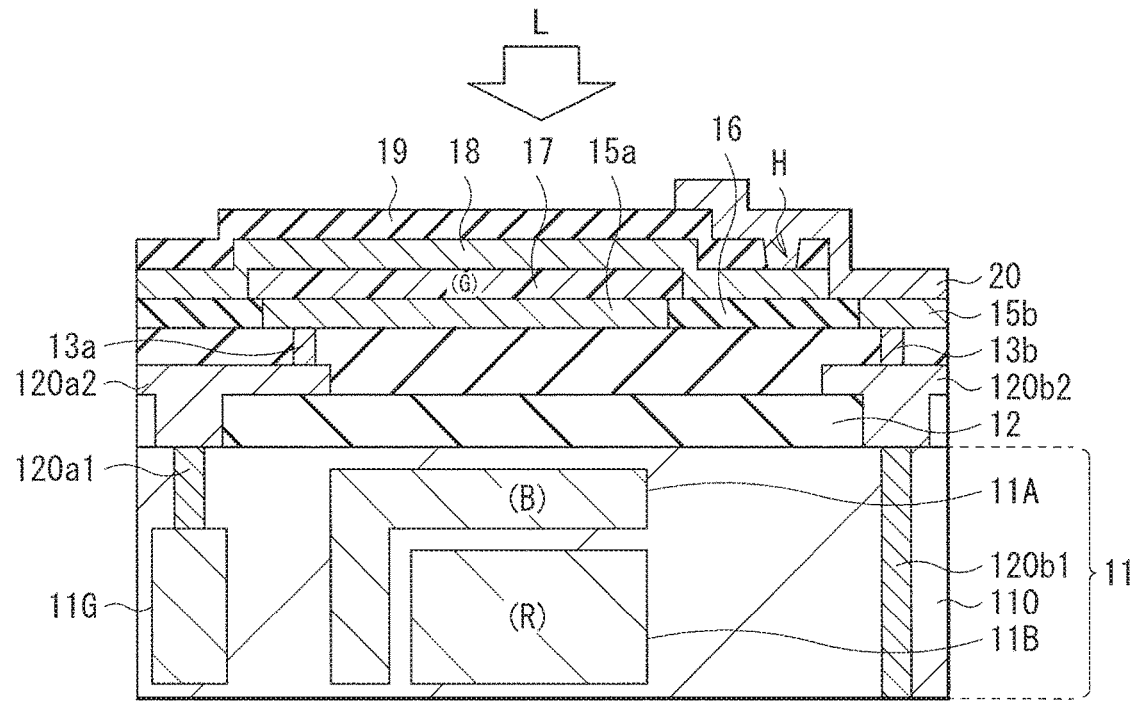
[ FIG. 9 ]
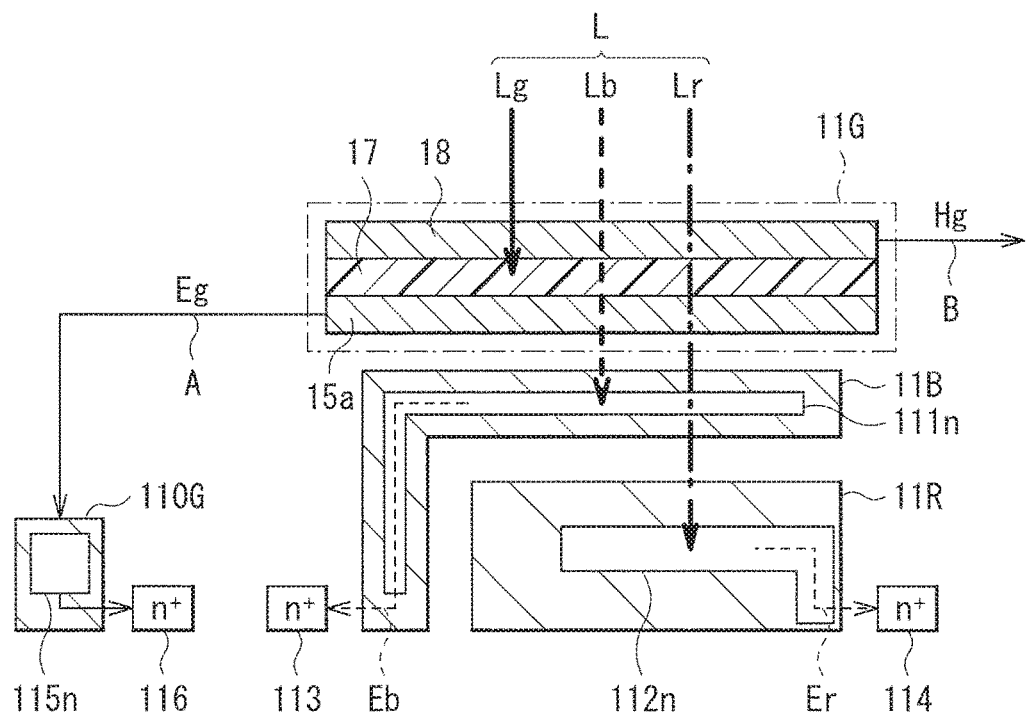

[ FIG. 10A ]
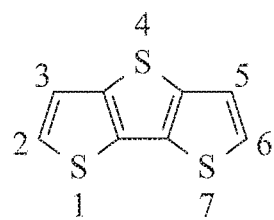
[ FIG. 10B ]
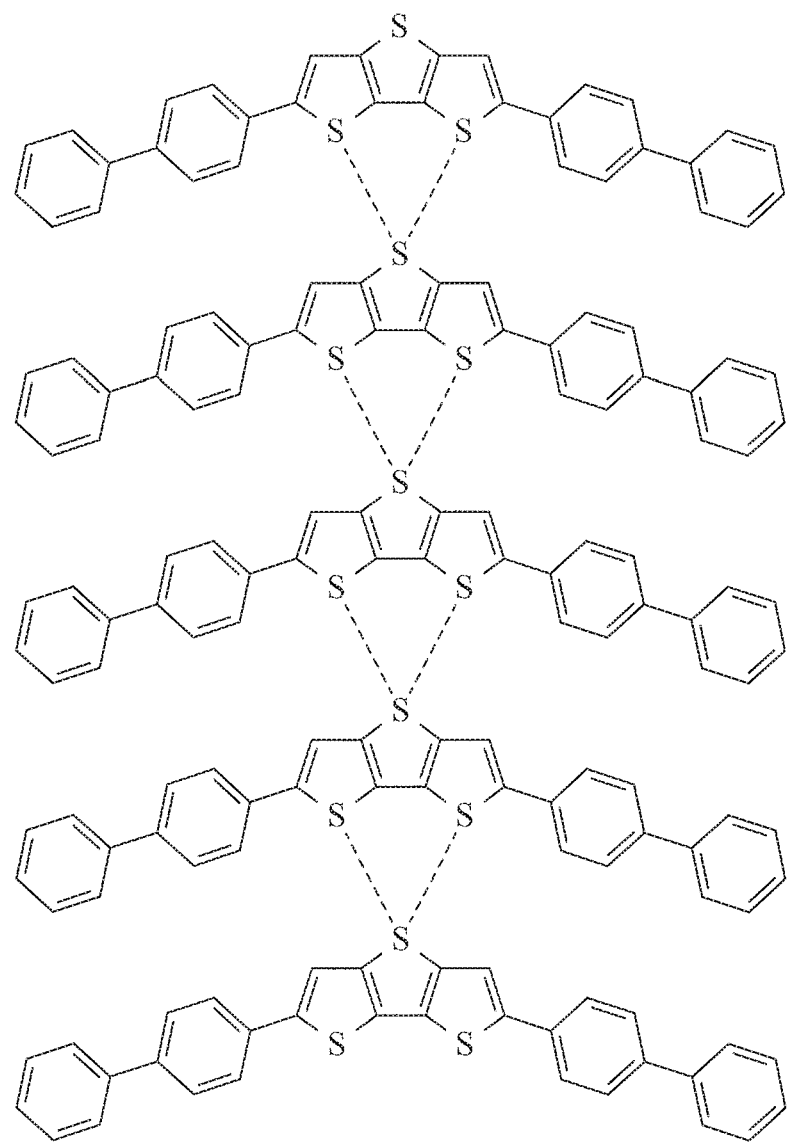

[ FIG. 17 ]
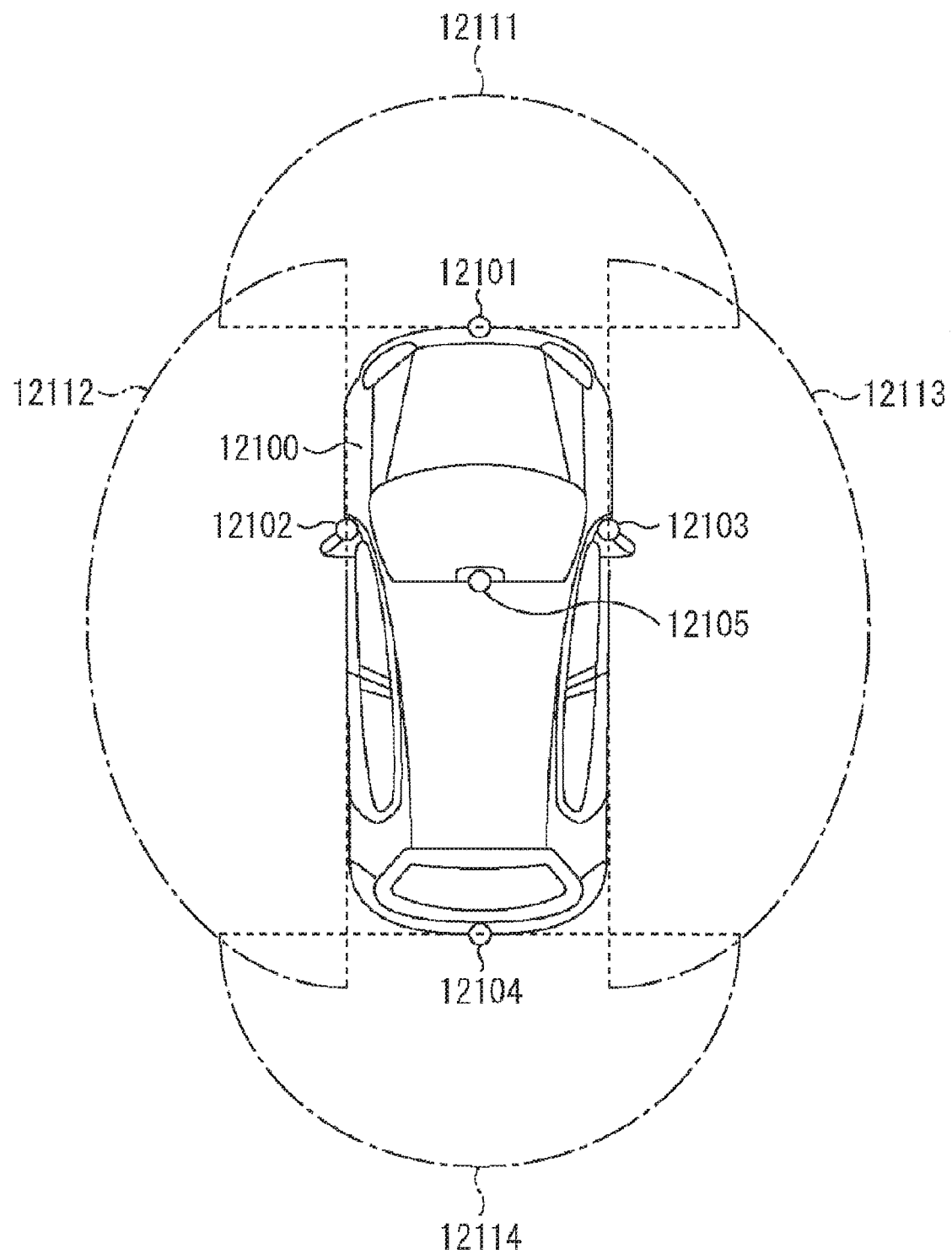

[ FIG. 18 ]
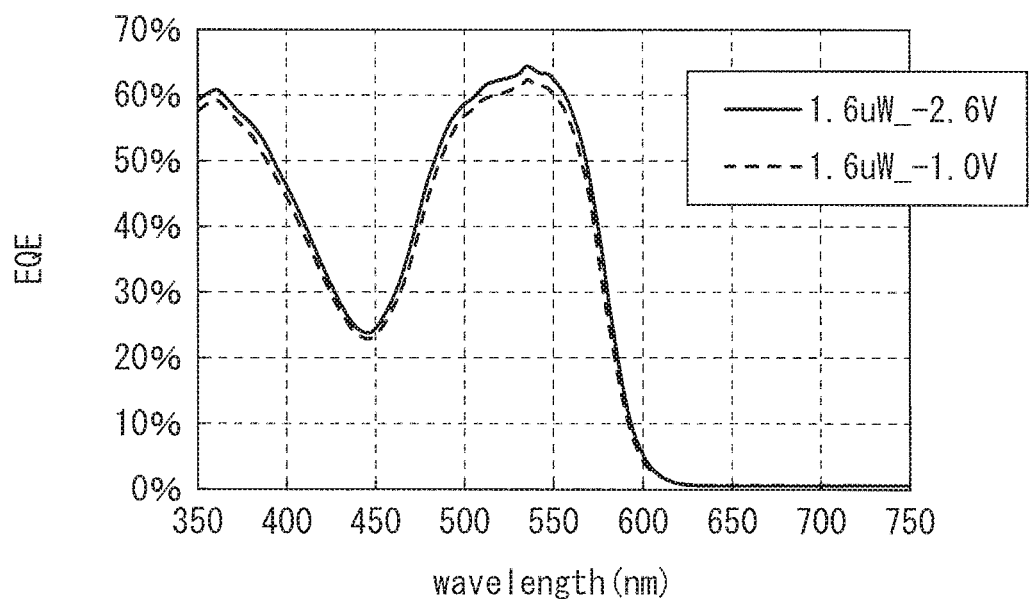
[ FIG. 19 ]
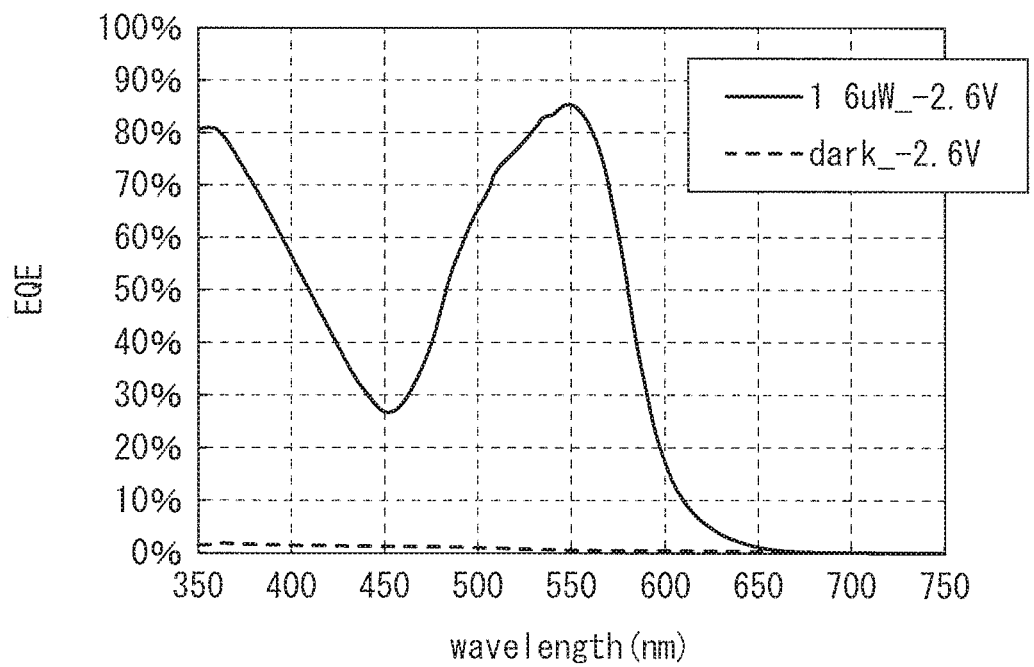

[ FIG. 20 ]
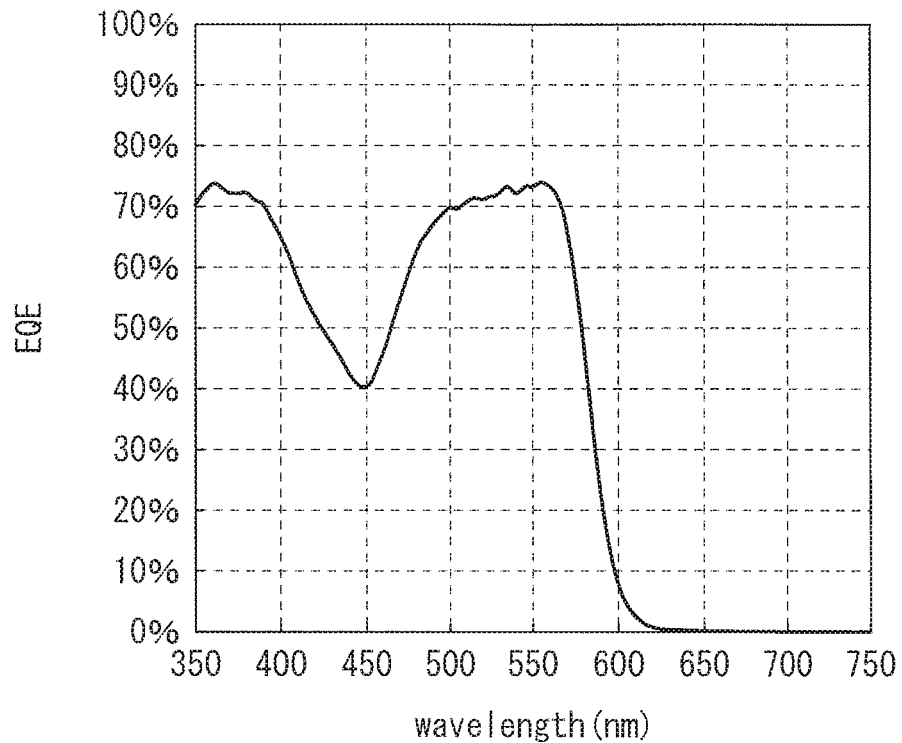
[ FIG. 21 ]
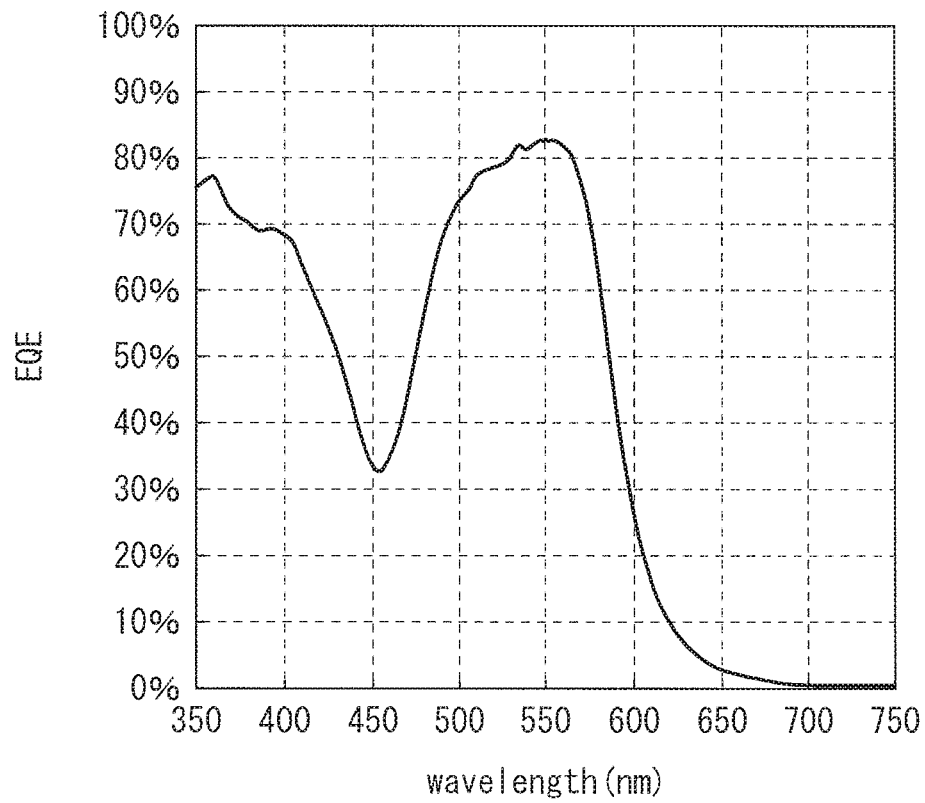

[ FIG. 22 ]
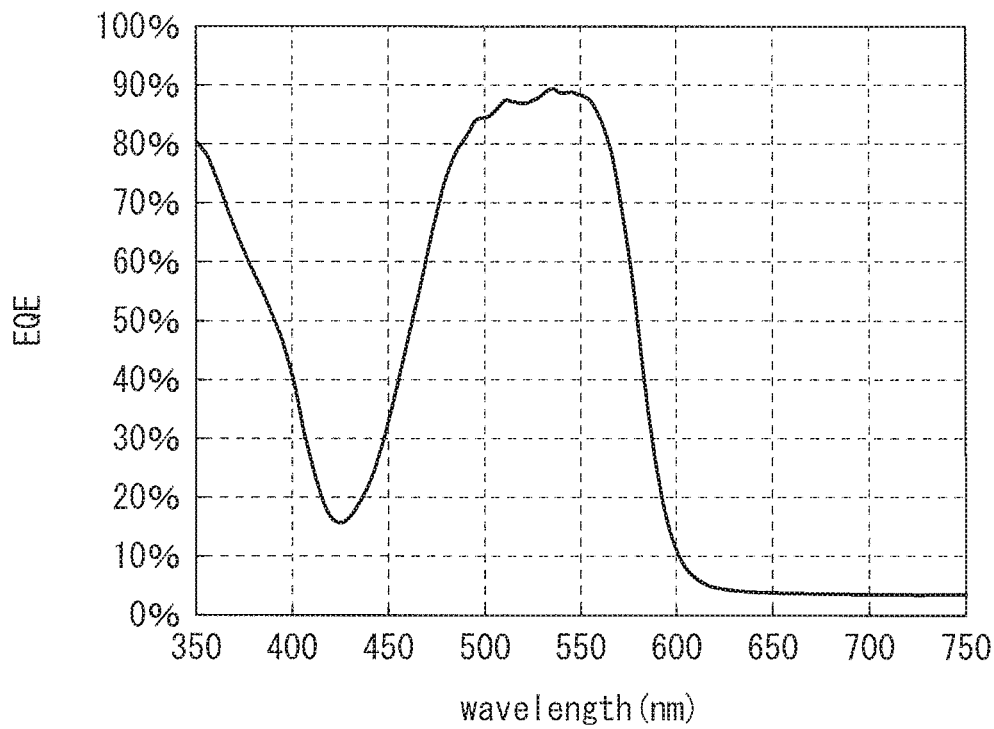
[ FIG. 23 ]
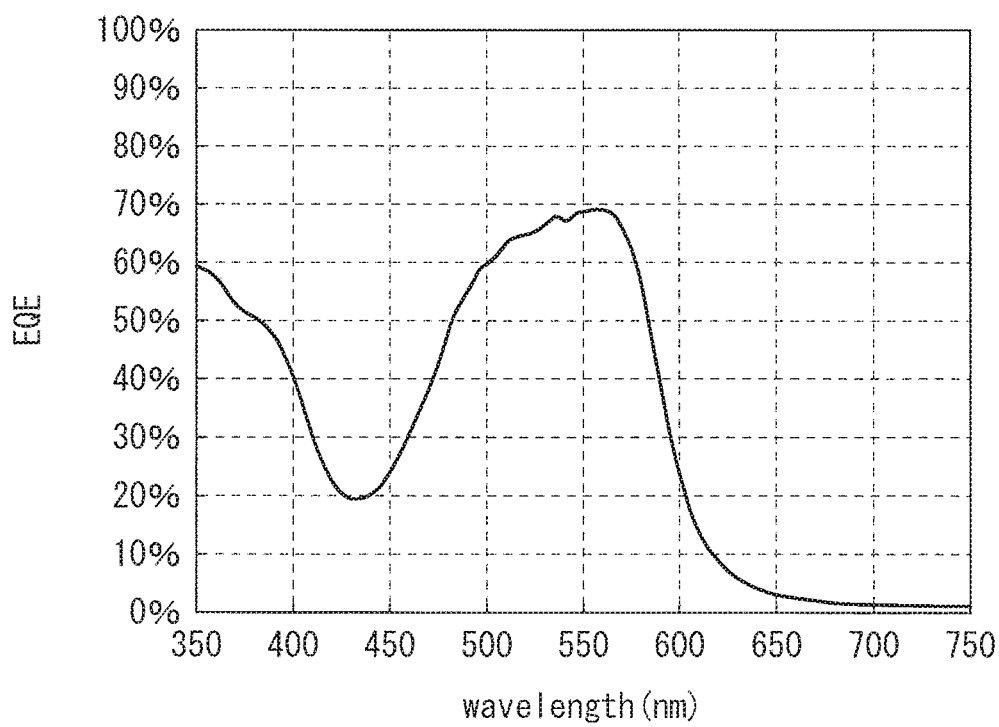

PHOTOELECTRIC CONVERSION ELEMENT AND SOLID-STATE IMAGING DEVICE

CROSS REFERENCE TO RELATED APPLICATIONS

This application is a national stage application under 35 U.S.C. 371 and claims the benefit of PCT Application No. PCT/JP2017/010212 having an international filing date of 14 Mar. 2017, which designated the United States, which PCT application claimed the benefit of Japanese Patent Application No. 2016-051022 filed 15 Mar. 2016, Japanese Patent Application No. 2016-219444 filed 10 Nov. 2016, and PCT Application No. PCT/JP2017/001354 filed 17 Jan. 2017, the entire disclosures of each of which are incorporated herein by reference.

TECHNICAL FIELD

The disclosure relates to a photoelectric conversion element using an organic semiconductor material and a solid-state imaging device including the same.

BACKGROUND ART

In recent years, there has been progress in miniaturization of a pixel size in a solid-state imaging device such as a CCD (charge coupled device) image sensor or a CMOS (complementary metal oxide semiconductor) image sensor. This causes reduction in the number of photons that enter a unit pixel, which contributes to lowered sensitivity as well as a lowered S/N ratio. Moreover, in a case where a color filter with a two-dimensional array of primary color filters of red, green and blue is used for colorization, green and blue light is absorbed by the color filter, for example, in a red pixel, which brings about lowered sensitivity as a whole. Further, an interpolation process is performed between pixels upon generation of each color signal, thus causing occurrence of a so-called false color.

Accordingly, for example, PTL 1 discloses an image sensor including an organic photoelectric conversion film having a multi-layer structure in which an organic photoelectric conversion film having sensitivity to blue light (B), an organic photoelectric conversion film having sensitivity to green light (G), and an organic photoelectric conversion film having sensitivity to red light (R) are sequentially stacked. This image sensor attempts to improve the sensitivity by separately extracting each of the B/G/R signals from one pixel. PTL 2 discloses an imaging element in which a single layer of organic photoelectric conversion film is formed, a signal of a single color is extracted with this organic photoelectric conversion film, and signals of two colors are extracted using a silicon (Si) bulk spectroscopy. In the imaging elements disclosed in PTLs 1 and 2, most of entering light is subjected to photoelectric conversion and read, allowing for nearly 100% efficiency of utilization of visible light. Further, color signals of three colors, R, G, and B, are obtained at each light-receiving unit, making it possible to generate an image with high sensitivity and high resolution (false color becomes unconspicuous).

CITATION LIST

Patent Literature

PTL 1: Japanese Unexamined Patent Application Publication No. 2003-234460

PTL 2: Japanese Unexamined Patent Application Publication No. 2005-303266

SUMMARY OF INVENTION

Now, what is desired for a photoelectric conversion element that constitutes a solid-state imaging device is a low dark current and high photoelectric conversion efficiency.

It is desirable to provide a photoelectric conversion element and a solid-state imaging device that make it possible to enhance photoelectric conversion efficiency while keeping a dark current low.

A photoelectric conversion element according to an embodiment of the disclosure includes: a first electrode and a second electrode that are disposed to face each other; and a photoelectric conversion layer that is provided between the first electrode and the second electrode; and contains at least one kind of polycyclic aromatic compound represented by any one of the following general formula (1), the following general formula (2), and the following general formula (3).

[Chem. 1]

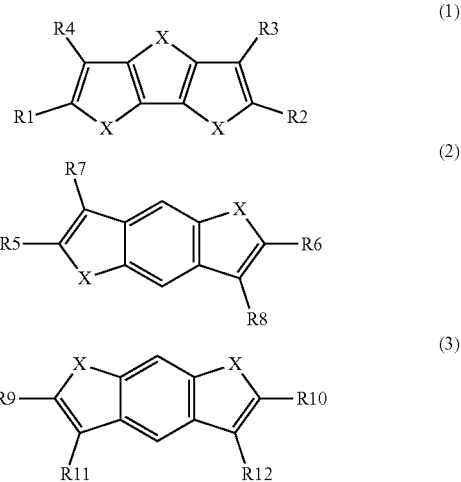

where X is any one of oxygen (O), sulfur (S), selenium (Se), and tellurium (Te). R1 to R12 are, each independently: hydrogen atom; halogen atom; linear, branched, or cyclic alkyl group; aryl group; or a derivative thereof. Any adjacent members from among R1 to R12 may form a condensed aliphatic ring or a condensed aromatic ring by being bonded to each other. The condensed aliphatic ring or the condensed aromatic ring may contain one or more atoms of nitrogen (N), sulfur (S), selenium (Set, and tellurium (Te).

A solid-state imaging device according to an embodiment of the disclosure in which pixels each include one or more organic photoelectric conversion sections, includes the photoelectric conversion element according to the embodiment of the disclosure as mentioned above, as the organic photoelectric conversion section.

In the photoelectric conversion element and the solid-state imaging device according to the respective embodiments of the disclosure, the organic photoelectric conversion layer provided between the first electrode and the second electrode that are disposed to face each other is formed using at least one kind of the polycyclic aromatic compound represented by any one of the general formula (1), the general formula (2), and the general formula (3) as mentioned above. This makes it possible to quickly separate an exciton generated by light absorption into carriers, and to allow the carriers generated to promptly reach the electrodes (the first electrode or the second electrode).

According to the photoelectric conversion element and the solid-state imaging device of the respective embodiments of the disclosure, the organic photoelectric conversion layer is formed using at least one kind of the polycyclic aromatic compound represented by any one of the general formula (1), the general formula (2), and the general formula (3) as mentioned above. This makes it possible to quickly perform separation of the exciton generated by the light absorption into the carriers, and movement of the carriers to the electrodes. Hence, it is possible to enhance the photoelectric conversion efficiency while keeping the dark current low.

It is to be noted that effects of the disclosure are not necessarily limited to the effects described above, and may be any of the effects described in the disclosure.

BRIEF DESCRIPTION OF DRAWINGS

FIG. 2 is a plan view of relation of formation positions of an organic photoelectric conversion layer, a protective layer (top electrode), and a contact hole.

FIG. 3A is a cross-sectional view of a configuration example of an inorganic photoelectric conversion section.

FIG. 3B is another cross-sectional view of the inorganic photoelectric conversion section illustrated in FIG. 3A.

FIG. 4 is a cross-sectional view of a configuration (extraction of electrons on lower side) of an electric charge (electron) accumulation layer of an organic photoelectric conversion section.

FIG. 5A is a cross-sectional view describing a method of manufacturing the photoelectric conversion element illustrated in FIG. 1.

FIG. 5B is a cross-sectional view of a process subsequent to FIG. 5A.

FIG. 6A is a cross-sectional view of a process subsequent to FIG. 5B.

FIG. 6B is a cross-sectional view of a process subsequent to FIG. 6A.

FIG. 7A is a cross-sectional view of a process subsequent to FIG. 6B.

FIG. 7B is a cross-sectional view of a process subsequent to FIG. 7A.

FIG. 7C is a cross-sectional view of a process subsequent to FIG. 7B.

FIG. 8 is a cross-sectional view of a main part describing workings of the photoelectric conversion element illustrated in FIG. 1.

FIG. 9 is a schematic diagram describing the workings of the photoelectric conversion element illustrated in FIG. 1.

FIG. 10A is a diagram of position numbering in a molecular skeleton of DTT.

FIG. 10B is a schematic diagram illustrating an example of an arrangement of a DTT derivative inside the organic photoelectric conversion layer.

FIG. 17 is a diagram of assistance in explaining an example of installation positions of an imaging section.

FIG. 18 is a characteristic graph illustrating external quantum efficiency in a visible region in Experiment Example 1.

FIG. 19 is a characteristic graph illustrating the external quantum efficiency in the visible region in Experiment Example 23.

FIG. 20 is a characteristic graph illustrating the external quantum efficiency in the visible region in Experiment Example 24.

FIG. 21 is a characteristic graph illustrating the external quantum efficiency in the visible region in Experiment Example 30.

FIG. 22 is a characteristic graph illustrating the external quantum efficiency in the visible region in Experiment Example 25.

FIG. 23 is a characteristic graph illustrating the external quantum efficiency in the visible region in Experiment Example 31.

MODES FOR CARRYING OUT THE INVENTION

In the following, some embodiments of the disclosure are described in detail with reference to drawings. It is to be noted that description is given in the following order.

1. First Embodiment (a photoelectric conversion element including an organic photoelectric conversion layer containing a DTT derivative)
1-1. Configuration of Photoelectric Conversion Element
1-2. Manufacturing Method of Photoelectric Conversion Element
1-3. Workings and Effects
2. Second Embodiment (a photoelectric conversion element including an organic photoelectric conversion layer containing a BDT-based derivative)
2-1. Configuration of Organic Photoelectric Conversion Layer
2-2. Workings and Effects
3. Modification Example (a photoelectric conversion element in which a plurality of organic photoelectric conversion sections are stacked)
4. Application Examples
5. Examples

1. FIRST EMBODIMENT

Figure 1:
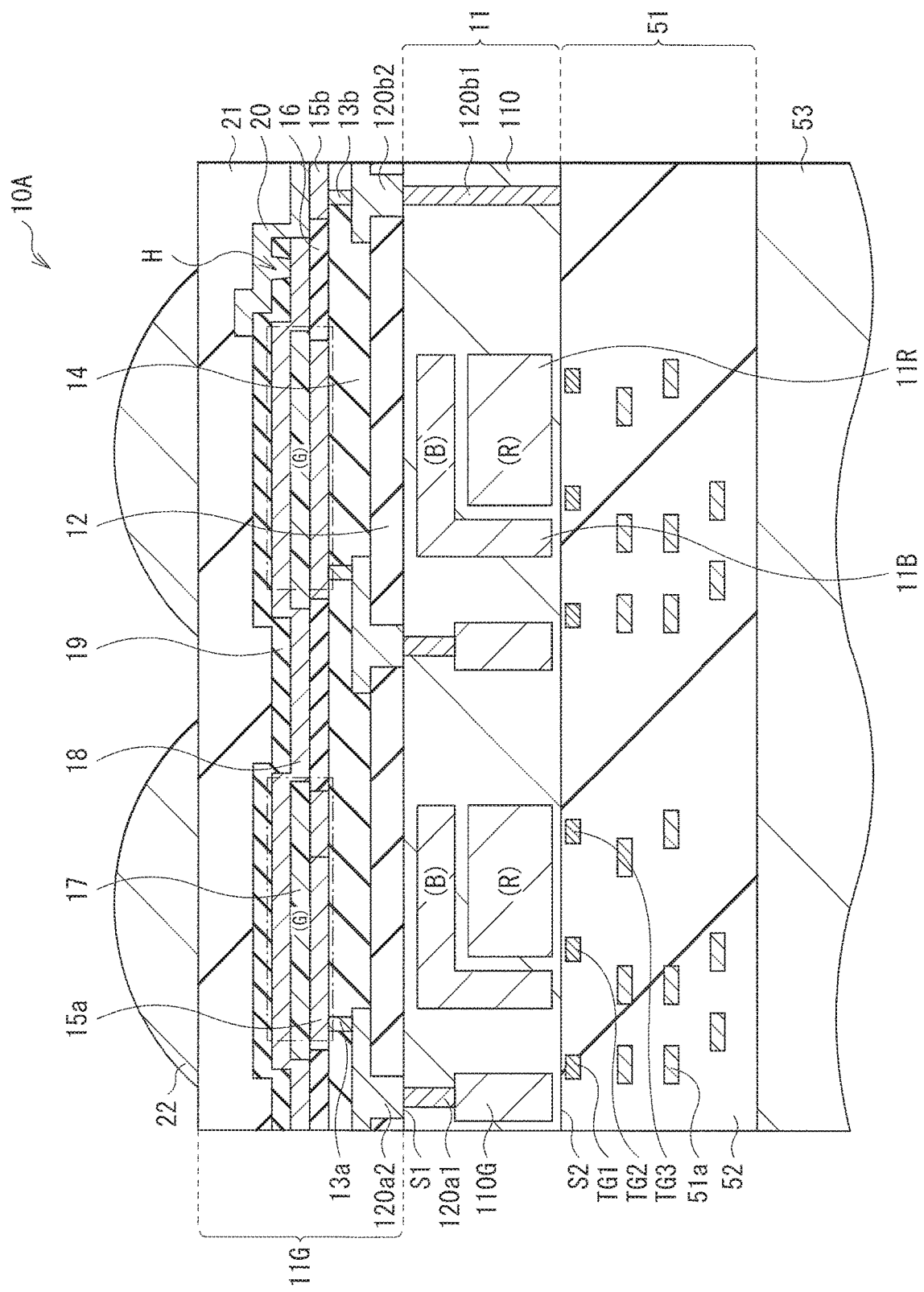
FIG. 1 is a cross-sectional view of a schematic configuration of a photoelectric conversion element according to a first embodiment of the disclosure.

FIG. 1 illustrates a cross-sectional configuration of a photoelectric conversion element (photoelectric conversion element 10A) according to a first embodiment of the disclosure. The photoelectric conversion element 10A constitutes a single pixel (unit pixel P) in, for example, a solid-state imaging device (solid-state imaging, device 1) such as a CCD image sensor or a CMOS image sensor (for both, refer to FIG. 13). FIG. 1 illustrates an example in which the two photoelectric conversion elements 10A are disposed in adjacency. The photoelectric conversion element 10A includes pixel transistors (inclusive of transfer transistors Tr1 to Tr3 described later) and a multi-layer wiring layer (multi-layer wiring layer 51), on front-surface (surface S2 on opposite side to a light-receiving surface (surface S1)) side of a semiconductor substrate 11.

The photoelectric conversion element 10A of this embodiment has a structure in which an organic photoelectric conversion section 11G and two inorganic photoelectric conversion sections 11B and 11R are stacked in a vertical direction. The organic photoelectric conversion section 11G and the inorganic photoelectric conversion sections 11B and 11R each selectively detect corresponding one of pieces of light of different wavelength regions to perform photoelectric conversion. The organic photoelectric conversion section 11G includes a dithienothiophene (DTT) derivative out of polycyclic aromatic compounds.

(1-1. Configuration of Photoelectric Conversion Element)

The photoelectric conversion element 10A has a stacked structure of the single organic photoelectric conversion section 11G and the two inorganic photoelectric conversion sections 11B and 11R. This allows for acquisition of respective color signals of red (R), green (KG), and blue (B) with a single element. The organic photoelectric conversion section 11G is formed on a back surface (surface S1) of the semiconductor substrate 11. The inorganic photoelectric conversion sections 11B and 11R are formed to be embedded inside the semiconductor substrate 11. In the following, description is given of a configuration of each section.

(Organic Photoelectric Conversion Section 11G)

The organic photoelectric conversion section 11G absorbs, with the use of an organic semiconductor, light of a selective wavelength region (here, green light), thus generating an electron-hole pair. The organic photoelectric conversion section 11G has a configuration in which an organic photoelectric conversion layer 17 is interposed between a pair of electrodes (bottom electrode 15a and top electrode 18) that extract a signal electric charge. As described later, the bottom electrode 15a and the top electrode 18 are electrically coupled to electrically-conductive plugs 120a1 and 120b1 each embedded inside the semiconductor substrate 11, through a wiring layer (undepicted) and a contact metal layer 20. It is to be noted that the organic photoelectric conversion layer 17 is a specific example of an "organic semiconductor layer" in the disclosure.

Specifically, in the organic photoelectric conversion section 11G, interlayer insulating films 12 and 14 are formed on the surface S1 of the semiconductor substrate 11. The interlayer insulating film 12 has through-holes provided in respective regions that face the later-described electrically-conductive plugs 120a1 and 120b1. The through-holes are filled with electrically-conductive plugs 120a2 and 120b2. In the interlayer insulating film 14, wiring layers 13a and 13b are embedded in respective regions that face the electrically-conductive plugs 120a2 and 120b2. The bottom electrode 15a and a wiring layer 15b electrically separated from the bottom electrode 15a by an insulating film 16 are provided on the interlayer insulating film 14. Among those, the organic photoelectric conversion layer 17 is formed on the bottom electrode 15a, and the top electrode 18 is so formed as to cover the organic photoelectric conversion layer 17. A protective layer 19 is so formed on the top electrode 18 as to cover a surface of the top electrode 18, although details are described later. A contact hole H is provided in a predetermined region of the protective layer 19. On the protective layer 19, formed is the contact metal layer 20 that fills the contact hole H and extends to an upper surface of the wiring layer 15b.

The electrically-conductive plug 120a2 functions as a connector together with the electrically-conductive plug 120a1, and forms, together with the electrically-conductive plug 120a1 and the wiring layer 13a, a transmission path of an electric charge (electron) from the bottom electrode 15a to a later-described electricity storage layer for green 110G. The electrically-conductive plug 120b2 functions as a connector together with the electrically-conductive plug 120b1, and forms, together with the electrically-conductive plug 120b1, the wiring layer 13b, the wiring layer 15b, and the contact metal layer 20, a discharge path of an electric charge (hole) from the top electrode 18. The electrically-conductive plugs 120a2 and 120b2 are desirably configured by, for example, a stacked film of metal materials such as titanium (Ti), titanium nitride (TiN), and tungsten (W), in order to allow the electrically-conductive plugs 120a2 and 120b2 to function also as a light-shielding film. Further, the use of such a stacked film is desirable because this enables a contact with silicon to be secured even in a case where the electrically-conductive plugs 120a1 and 120b1 are each formed as an n-type or p-type semiconductor layer.

The interlayer insulating film 12 is desirably configured by an insulating film having a small interface state in order to reduce an interface state with the semiconductor substrate 11 (silicon layer 110) and to suppress occurrence of a dark current from an interface with the silicon layer 110. As such an insulating film, for example, a stacked film of a hafnium oxide ($HfO_2$) film and a silicon oxide ($SiO_2$) film may be used. The interlayer insulating film 14 is configured by, for example, a monolayer film containing one kind of, for example, silicon oxide, silicon nitride, or silicon oxynitride (SiON), or alternatively, the interlayer insulating film 14 is configured by a stacked film containing two or more kinds thereof.

The insulating film 16 is configured by, for example, a monolayer film containing one kind of, for example, silicon oxide, silicon nitride, or silicon oxynitride, or alternatively, the insulating film 16 is configured by a stacked film containing two or more kinds thereof. The insulating film 16 has, for example, a planarized surface and has a substantially stepless shape and pattern with respect to the bottom electrode 15a. The insulating film 16 has a function of electrically separating the bottom electrodes 15a of the respective pixels from one another in a case where the photoelectric conversion element 10A is used as the pixel of the solid-state imaging device. Specifically, as illustrated in FIG. 1, the insulating film 16 is so structured as to be disposed between the bottom electrodes 15a of the two photoelectric conversion elements 10A disposed in adjacency.

The bottom electrode 15a is provided at a region that faces light-receiving surfaces of the inorganic photoelectric conversion sections 11B and 11R formed inside the semiconductor substrate 11 and covers the light-receiving surfaces. The bottom electrode 15a is configured by an electrically-conductive film having light-transmissivity, and includes ITO (indium tin oxide), for example. However, as a constituent material of the bottom electrode 15a, a dopant-doped tin oxide ($SnO_2$)-based material or a zinc oxide-based material in which aluminum zinc oxide (ZnO) is doped with a dopant may be used, besides the ITO. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). Moreover, besides, for example, CuI, $InSbO_4$, ZnMgO, $CuInO_2$, $MgIN_2O_4$, CdO, and $ZnSnO_3$ may be used. It is to be noted that, in this embodiment, the signal electric charge (electron) is extracted from the bottom electrode 15a. Therefore, in the later-described solid-state imaging device using the photoelectric conversion element 10A as the pixel, the bottom electrode 15a is formed to be separated on a pixel-by-pixel basis, as illustrated in FIG. 1.

The organic photoelectric conversion layer 17 of this embodiment includes one or more kinds of the dithienothiophene (DTT) derivative represented by the following formula (I). Moreover, the organic photoelectric conversion layer 17 preferably includes both a p-type semiconductor and an n-type semiconductor. Preferably, one of the p-type semiconductor and the n-type semiconductor is a transparent material, while the other of the p-type semiconductor and the n-type semiconductor is a material that performs photoelectric conversion of light of a selective wavelength region. A film thickness in a stacking direction (hereinafter simply referred to as a thickness) of the organic photoelectric conversion layer 17 is, for example, 50 nm to 500 nm both inclusive.

[Chem. 2]

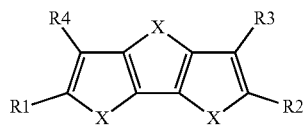

(1)

where X is any one of oxygen (O), sulfur (S), selenium (Se), and tellurium (Te). R1 to R4 are, each independently: hydrogen atom; halogen atom; linear, branched, or cyclic alkyl group; aryl group; or a derivative thereof. Any adjacent members from among R1 to R4 may form a condensed aliphatic ring or a condensed aromatic ring by being bonded to each other. The condensed aliphatic ring or the condensed aromatic ring may contain one or more atoms of nitrogen (N), sulfur (S), selenium (Se), and tellurium (Te).

The DTT derivative is preferably, for example, transparent. Specifically, the DTT derivative is preferably devoid of a maximum absorption wavelength in a wavelength region of 500 nm to 600 nm both inclusive. Moreover, energy levels of a highest occupied molecular orbital (HOMO) and a lowest unoccupied molecular orbital (LUMO) of the DTT derivative are preferably levels at which a photoelectric conversion mechanism smoothly works with respect to other materials that constitute the organic photoelectric conversion layer 17. This is for purposes of the quick separation of the exciton generated inside the organic photoelectric conversion layer 17 by light absorption, into the carriers, and furthermore, for purposes of the prompt movement of the carrier generated, to the bottom electrode 15a, for example. Specifically, a HOMO level of the DTT derivative is preferably, for example, −6.6 eV to −4.8 eV both inclusive, and more preferably, −6.0 eV to −5.0 eV both inclusive. It is to be noted that an absolute value of the energy level of the HOMO corresponds to an ionization potential, i.e., energy involved in extracting an electron from the HOMO to an outside (in vacuum). As to a measurement method of a HOMO value, for example, measurement may be made with, for example, a photoelectron spectroscopy device using ultraviolet photoelectron spectroscopy (UPS) that includes depositing a thin film made of an organic material on a substrate of an electrically-conductive film (e.g., ITO or Si), and irradiating the thin film with ultraviolet rays.

As such a DTT derivative, preferably, R1 and R2 have, each independently, an aryl group. Moreover, R3 and R4 are each preferably a hydrogen atom. Examples of the aryl group include a group having polycyclic aromatic hydrocarbon such as: phenyl group; biphenyl group; triphenyl group; terphenyl group; stilbene group; naphthyl group; anthracenyl group; phenanthrenyl group; pyrenyl group; perylenyl group; tetracenyl group: chrycenyl group; fluorenyl group; acenaphthacenyl group; triphenylene group; fluoranthene group; or a derivative thereof, each of which has a carbon number of 6 to 60 both inclusive. Specifically, examples include a substituent group represented by the following chemical formulae 3 to 7. Among them, preferably, R1 and R2 are, each independently: biphenyl group; terphenyl group; telphenyl group; or a derivative thereof, each of which has a structure in which two or more phenyl groups are covalent-bonded to one another with a single bond. In particular, what includes phenyl groups or their derivatives bonded to one another at their para-positions is desirable. This is because packing of molecules is improved in formation of a bulk hetero layer that constitutes the organic photoelectric conversion layer 17, leading to easy formation of grains having few crystal defects.

[Chem. 3]

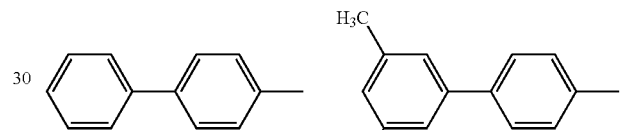

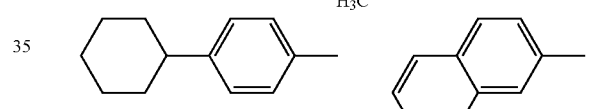

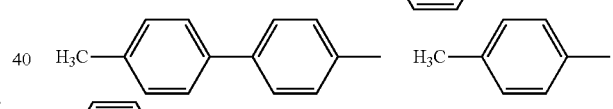

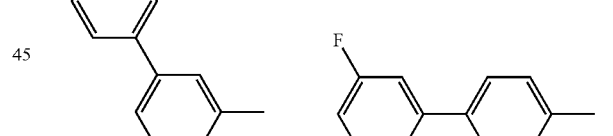

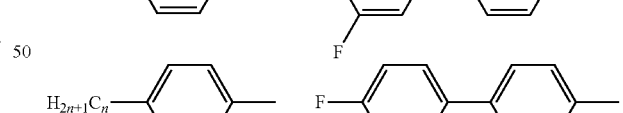

[Chem. 4]

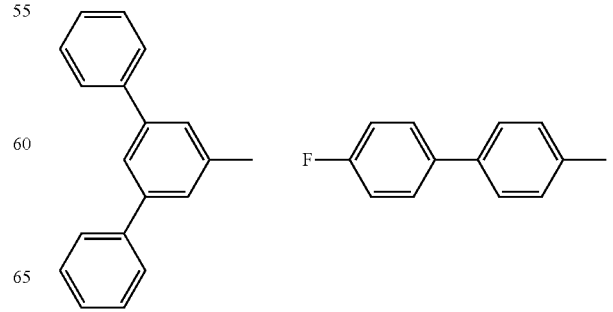

-continued
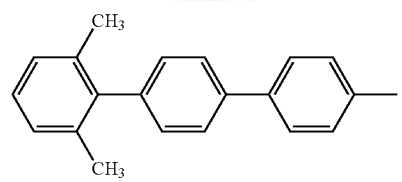
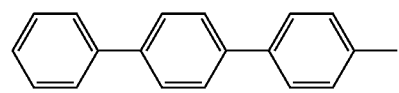
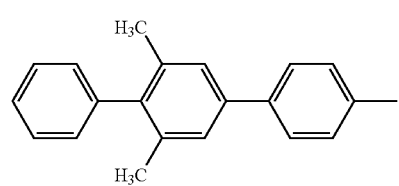
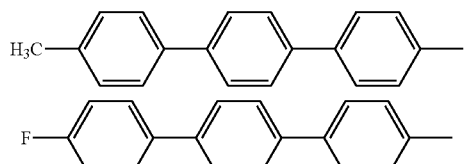
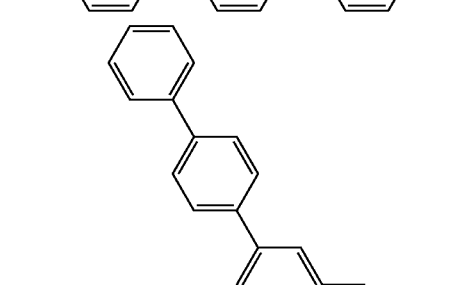
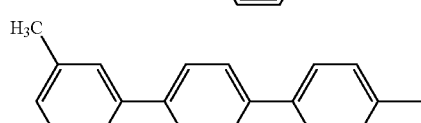
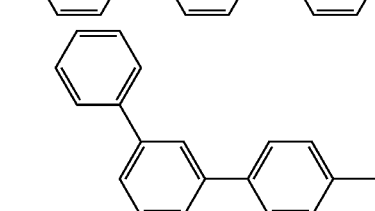
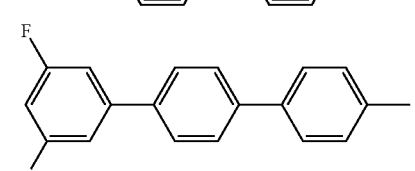
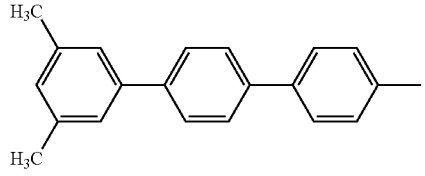
-continued
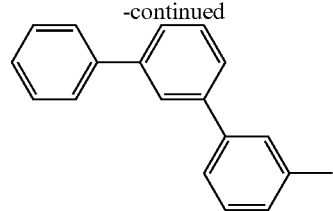
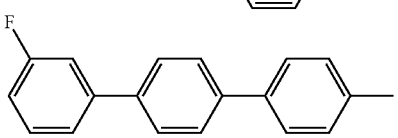
[Chem. 5]
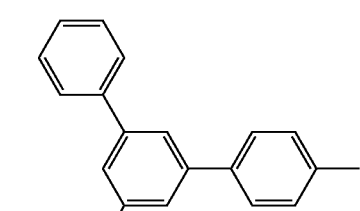
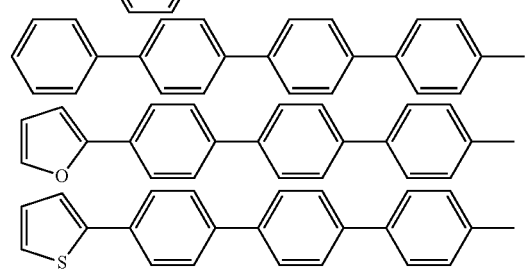
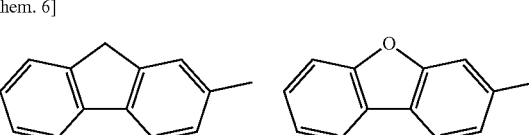
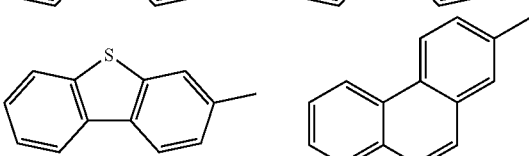
[Chem. 6]
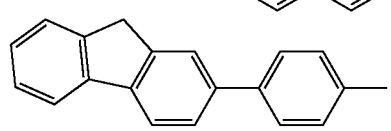
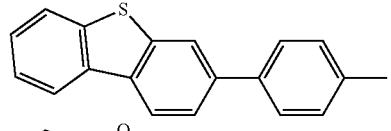
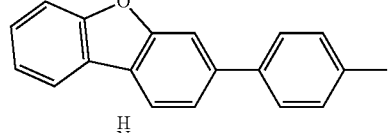
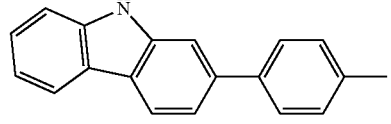

-continued
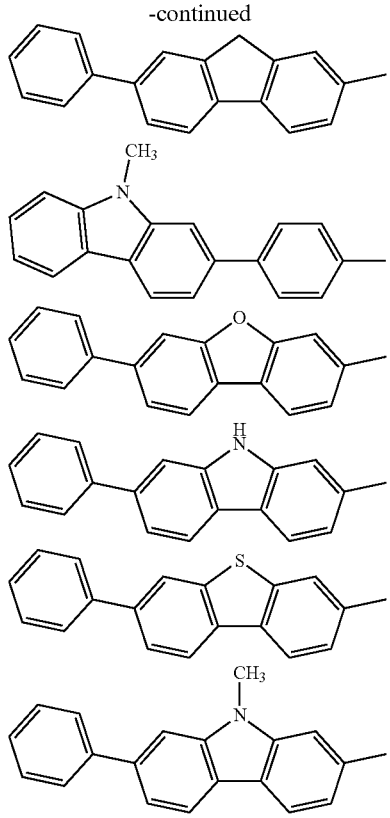
[Chem. 7]
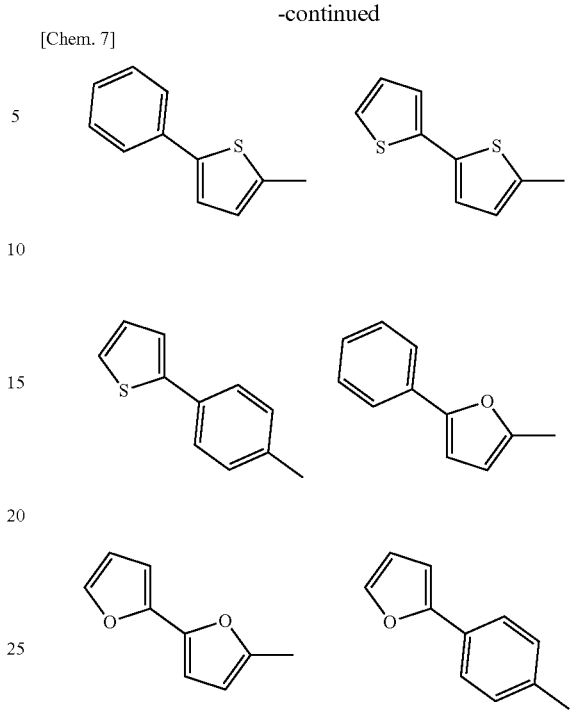
Specific examples of the DTT derivative include compounds represented by the following formulae (1-1) to (1-11).
[Chem. 8]
(1-1)
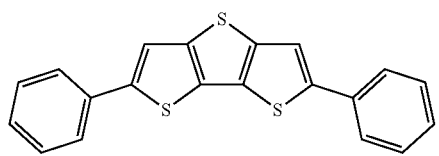
(1-2)
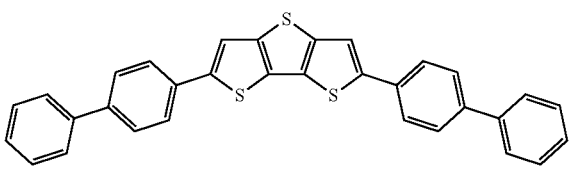
(1-3)
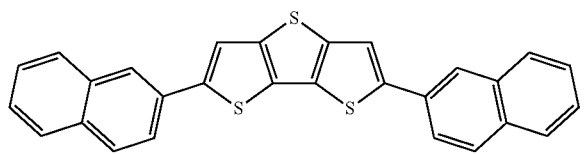
(1-4)
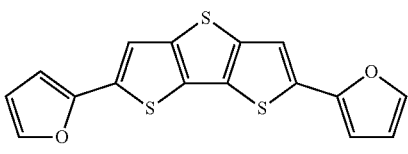
(1-5)
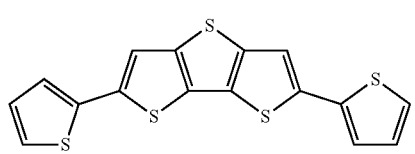
(1-6)
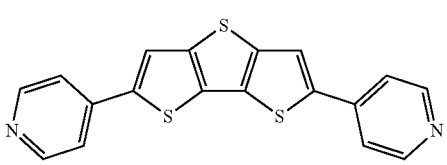
(1-7)
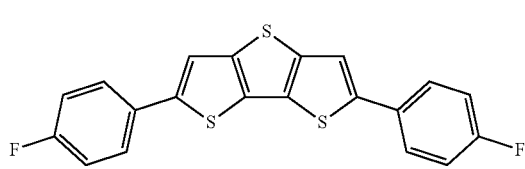
(1-8)
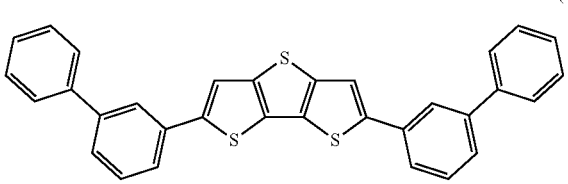

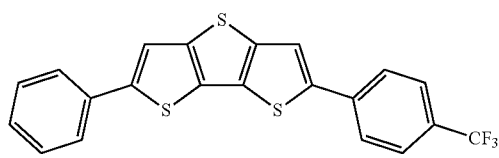
(1-9)

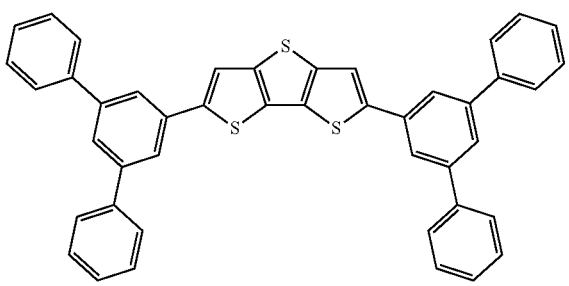
(1-10)

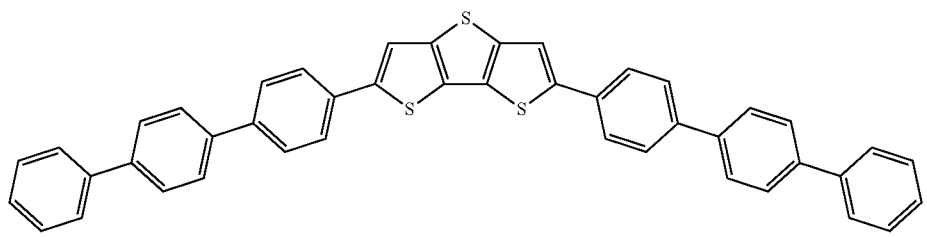
(1-11)

In addition, adjacent members in the forgoing general formula (1), i.e., R1 and R4, and/or R2 and R3, may form a condensed aromatic ring by being bonded to each other. Examples of such a DTT derivative include the following formulae (1-12) to (1-14). Moreover, the DTT derivative used in this embodiment may form a dimer. Examples include a compound represented by the following formula (1-15).

It is to be noted that the DTT derivative may have an asymmetric structure in which different substituent groups from one another are coupled to R1, R2, R3, and R4 in the forgoing general formula (I). Examples of such a DTT derivative include compounds represented by the following formulae (1-16) to (1-19).

[Chem. 9]

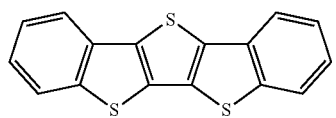
(1-12)

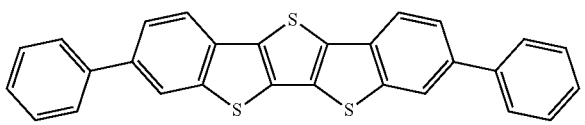
(1-13)

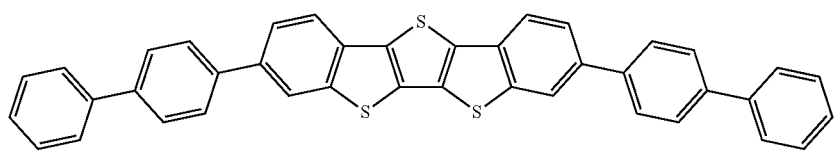
(1-14)

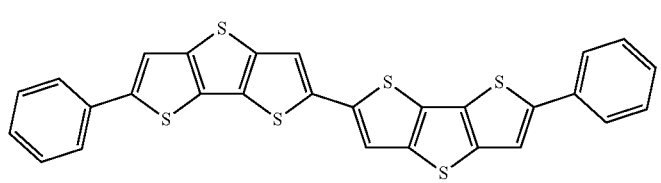
(1-15)

[Chem. 10]

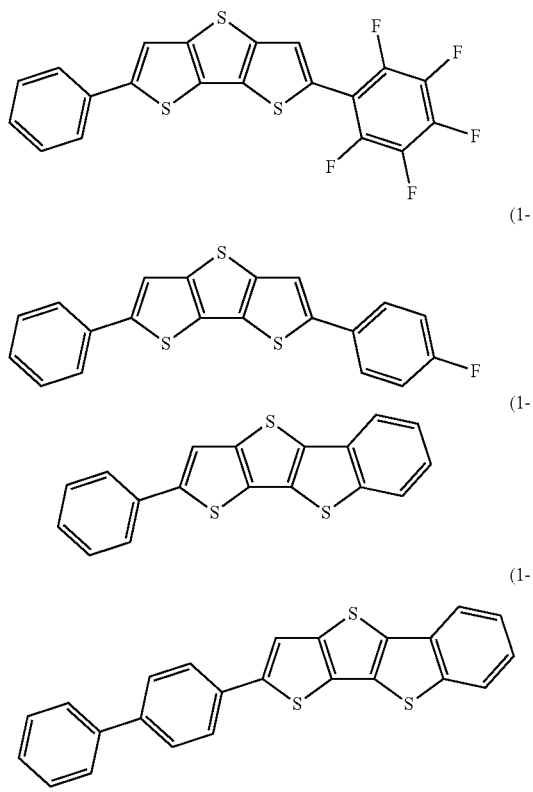

(1-16)

(1-17)

(1-18)

(1-19)

The organic photoelectric conversion layer 17 preferably uses, in addition to the forgoing DTT derivative, the material that performs the photoelectric conversion of the light of the selective wavelength region (light absorber). Specifically, an organic semiconductor material is preferably used that has a maximum absorption wavelength in the wavelength region of, for example, 500 nm to 600 nm both inclusive. This makes it possible to selectively perform photoelectric conversion of green light in the organic photoelectric conversion section 11G. Examples of such a material include subphthalocyanine or a derivative thereof represented by the following general formula (4).

[Chem. 11]

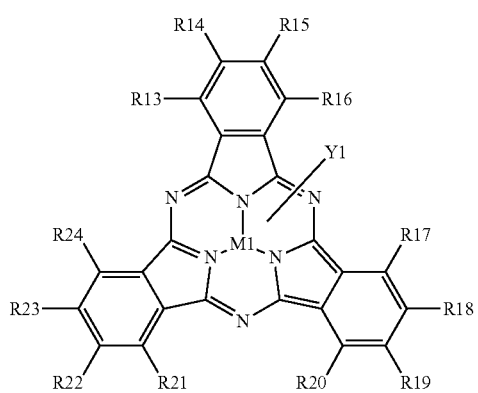

(4)

where R13 to R41 are, each independently, selected from a group consisting of: hydrogen atom; halogen atom; linear, branched, or cyclic alkyl group; thioalkyl group; thioaryl group; arylsulfonyl group; alkylsulfonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; and nitro group. Moreover, any adjacent members from among R13 to R24 may be a portion of a condensed aliphatic ring or a condensed aromatic ring. The condensed aliphatic ring or the condensed aromatic ring may include one or more atoms other than carbon. M1 is boron, or a divalent or trivalent metal. Y1 is any substituent group selected from a group consisting of: halogen; hydroxy group; thiol group; imide group; substituted or unsubstituted alkoxy group; substituted or unsubstituted aryloxy group; substituted or unsubstituted alkyl group; substituted or unsubstituted alkylthio group; and substituted or unsubstituted arylthio group.

The organic photoelectric conversion layer 17 further uses, preferably, for example, C60 fullerene or a derivative thereof represented by the following general formula (5), or C70 fullerene or a derivative thereof represented by the following general formula (6). Using at least one kind out of the fullerene 60 and the fullerene 70 or their derivatives allows for further enhancement in the photoelectric conversion efficiency and reduction in the dark current.

[Chem. 12]

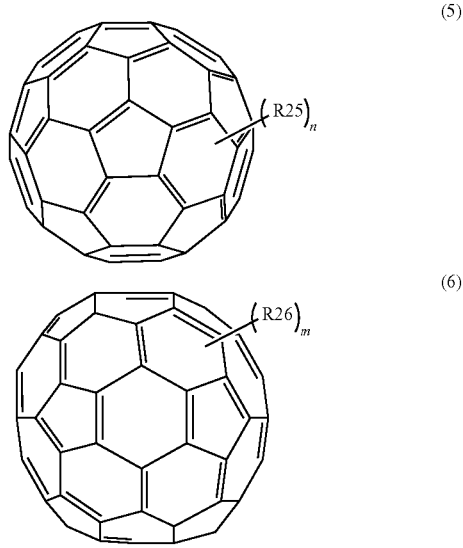

(5)

(6)

where R25 and R26 are each: hydrogen atom; halogen atom; linear, branched, or cyclic alkyl group; phenyl group; group including a linear or condensed aromatic compound; group including a halide; partial fluoroalkyl group; perfluoroalkyl group; silylalkyl group; silylalkoxy group; arylsilyl group; arylsulfanyl group; alkylsulfanyl group; arylsulfonyl group; alkylsulfonyl group; arylsulfide group; alkylsulfide group; amino group; alkylamino group; arylamino group; hydroxy group; alkoxy group; acylamino group; acyloxy group; carbonyl group; carboxy group; carboxoamide group; carboalkoxy group; acyl group; sulfonyl group; cyano group; nitro group; group including a chalcogenide; phosphine group; and phosphono group; or a derivative thereof. n and m are each an integer of 2 or more.

The DTT derivative, the subphthalocyanine or its derivative, and the fullerene 60, the fullerene 70, or their derivatives as mentioned above function as the p-type semiconductor or the n-type semiconductor, depending on a material to be combined with.

Any other unillustrated layer may be provided between the organic photoelectric conversion layer 17 and the bottom electrode 15a, and between the organic photoelectric conversion layer 17 and the top electrode 18. For example, an underlying film, a hole transport layer, an electron blocking film, the organic photoelectric conversion layer 17, a hole blocking film, a buffer film, an electron transport layer, and a work function adjustment film may be stacked in order from side on the bottom electrode 15a is disposed. For the electron blocking film, the hole blocking film, the electron transport layer, and the hole transport layer, the compound as mentioned above may be used.

The top electrode 18 is configured by an electrically-conductive having light-transmissivity similar to that of the bottom electrode 15a. In the solid-state imaging device using the photoelectric conversion element 10A as the pixel, the top electrode 18 may be separated on the pixel-by-pixel basis, or may be formed as an electrode common to the respective pixels. A thickness of the top electrode 18 is, for example, 10 nm to 200 nm both inclusive.

The protective layer 19 includes a material having light-transmissivity. The protective layer 19 is, for example, a monolayer film containing any one of, for example, silicon oxide, silicon nitride, or silicon oxynitride, or a stacked film containing two or more kinds thereof. A thickness of the protective layer 19 is, for example, 100 nm to 30000 nm both inclusive.

The contact metal layer 20 includes any one of, for example, titanium, tungsten, titanium nitride, and aluminum, or alternatively, the contact metal layer 20 is configured by a stacked film including two or more kinds thereof.

The top electrode 18 and the protective film 19 are so provided as to cover the organic photoelectric conversion layer 17, for example. FIG. 2 illustrates a plan configuration of the organic photoelectric conversion layer 17, the protective film 19 (top electrode 18), and the contact hole H.

Specifically, a peripheral part e2 of the protective layer 19 (applicable likewise to the top electrode 18) is located outside a peripheral part e1 of the organic photoelectric conversion layer 17. The protective layer 19 and the top electrode 18 are formed to be expanded outward beyond the organic photoelectric conversion layer 17. In detail, the top electrode 18 is so formed as to cover an upper surface and side surfaces of the organic photoelectric conversion layer 17 and to extend to over the insulating film 16. The protective layer 19 is formed to cover an upper surface of the top electrode 18 as mentioned above, and to have a planar shape equivalent to that of the top electrode 18. The contact hole H is provided in a non-opposed region to the organic photo photoelectric conversion layer 17, within the protective layer 19 (region outside the peripheral part e1), causing a portion of a surface of the top electrode 18 to be exposed. A distance between the peripheral parts e1 and e2 is, for example, 1 μm to 500 μm, although the distance is not particularly limited. It is to be noted that, although FIG. 2 illustrates a single rectangular contact hole H provided along an edge side of the organic photoelectric conversion layer 17, there is no limitation on the shape and the number of the contact holes H. Other shapes (e.g., circular shape and square shape) r ray be adopted, and a plurality of the contact holes H may be provided.

A planarization layer 21 is so formed on the protective layer 19 and the contact metal layer 20 as to cover their entire surfaces. An on-chip lens 22 (microlens) is provided on the planarization layer 21. The on-chip lens 22 condenses light entering from above to each light-receiving surface of the organic photoelectric conversion section 11G and the inorganic photoelectric conversion sections 11B and 11R. In this embodiment, the multi-layer wiring layer 51 is formed on surface-S2 side of the semiconductor substrate 11, thus making it possible to allow the respective light-receiving surfaces of the organic photoelectric conversion section 11G and the inorganic photoelectric conversion sections 11B and 11R to be disposed closer to one another. Thus, it becomes possible to reduce variations in sensitivity among respective colors occurring depending on an F value of the on-chip lens 22.

It is to be noted that, in the photoelectric conversion element 10A according to this embodiment, the signal electric charge (electron, in this embodiment) is extracted from the bottom electrode 15a. Therefore, in the solid-state imaging device using the photoelectric conversion element 10A as the pixel, the top electrode 18 may serve as a common electrode. In this case, it suffices to form the above-described transmission path including the contact hole H, the contact metal layer 20, the wiring layers 15b and 13b, and the electrically-conductive plugs 120b1 and 120b2 at, at least, one location for all the pixels.

In the semiconductor substrate 11, for example, the inorganic photoelectric conversion sections 11B and 11R, and the electricity storage layer for green 110G are formed to be embedded in a predetermined region of the n-type silicon (Si) layer 110. Further, the electrically-conductive plugs 120a1 and 120b1 are embedded in the semiconductor substrate 11. The electrically-conductive plugs 120a1 and 120b1 serve as a transmission path of the electric charge (electron or hole (hole)) from the organic photoelectric conversion section 11G. In this embodiment, the back surface (surface S1) of the semiconductor substrate 11 serves as a light-receiving surface. On the front-surface (surface-S2) side of the semiconductor substrate 11, a plurality of the pixel transistors (including the transfer transistors Tr1 to Tr3) and a peripheral circuit are formed. The pixel transistors correspond, respectively, to the organic photoelectric conversion section 11G and the inorganic photoelectric conversion sections 11B and 11R. The peripheral circuit is configured by, for example, a logic circuit.

Examples of the pixel transistors include a transfer transistor, a reset transistor, an amplifying transistor, and a selection transistor. Each of these pixel transistors is configured, for example, by a MOS transistor, and is formed in a p-type semiconductor well region on the surface-S2 side. A circuit that includes such pixel transistors is formed for each of the photoelectric conversion sections of red, green, and blue. Each of the circuits may have a three-transistor configuration that includes three transistors in total, configured by the transfer transistor, the reset transistor, and the amplifying transistor, for example, among these pixel transistors. Alternatively, each of the circuits may have a four-transistor configuration that includes the selection transistor in addition thereto. Here, illustration and description are given only of the transfer transistors Tr1 to Tr3 among these pixel transistors. Further, the pixel transistors other than the transfer transistors may be shared by the photoelectric conversion sections or by the pixels. Furthermore, a so-called pixel-shared structure may also be applied in which a floating diffusion is shared.

The transfer transistors Tr1 to Tr3 each include a gate electrode (gate electrode TG1, TG2, or TG3) and a floating diffusion (FD 113, 114, or 116). The transfer transistor Tr1 transfers, to a later-described vertical signal line Lsig, a signal electric charge (electron, in this embodiment) corresponding to a green color that is generated in the organic photoelectric conversion section 11G and is accumulated in the electricity storage layer for green 110G. The transfer transistor Tr2 transfers, to the later-described vertical signal line Lsig, a signal electric charge (electron, in this embodiment) corresponding to a blue color that is generated and accumulated in the inorganic photoelectric conversion section 11B. Likewise, the transfer transistor Tr3 transfers, to the later-described vertical signal line Lsig, a signal electric charge (electron, in this embodiment) corresponding to a red color that is generated and accumulated in the inorganic photoelectric conversion section 11R.

The inorganic photoelectric conversion sections 11B and 11R are each a photodiode (Photo Diode) that has a p-n junction. The inorganic photoelectric conversion sections 11B and 11R are formed in order from the surface-S1 side on an optical path inside the semiconductor substrate 11. Among these, the inorganic photoelectric conversion section 11B selectively detects blue light and accumulates the signal electric charge corresponding to the blue color. The inorganic photoelectric conversion section 11B is formed to extend, for example, from a selective region along the surface S1 of the semiconductor substrate 11 to a region near an interface with the multi-layer wiring layer 51. The inorganic photoelectric conversion section 11R selectively detects red light and accumulates the signal electric charge corresponding to the red color. The inorganic photoelectric conversion section 11R is formed, for example, in a region in a lower layer (on the surface-S2 side) than the inorganic photoelectric conversion section 11B. It is to be noted that the blue (B) is a color that corresponds to a wavelength region of 400 nm to 480 nm both inclusive, for example, and the red (R) is a color that corresponds to a wavelength region of 600 nm to 700 nm, for example. It suffices for the inorganic photoelectric conversion sections 11B and 11R to be able to detect light of a portion or an entirety of the respective wavelength regions described above.

FIG. 3(A) illustrates a detailed configuration example of the inorganic photoelectric conversion sections 11B and 11R. FIG. 3(B) corresponds to a configuration in another cross-section in FIG. 3(A). It is to be noted that, in this embodiment, description is given of a case where, out of a pair of an electron and a hole generated by the photoelectric conversion, the electron is read as the signal electric charge (case where an n-type semiconductor region serves as a photoelectric conversion layer). Further, in the drawing, a superscript "+(plus)" attached to "p" or "n" indicates that a p-type or n-type impurity concentration is high. Furthermore, among the pixel transistors, the gate electrodes TG2 and TG3 of the transfer transistors Tr2 and Tr3 are also illustrated.

The inorganic photoelectric conversion section 11B includes, for example, a p-type semiconductor region (hereinafter, simply referred to as a "p-type region", applicable likewise to a case of n-type) 111$p$ that serves as a hole accumulation layer, and an n-type photoelectric conversion layer (n-type region) 111$n$ that serves as an electron accumulation layer. The p-type region 111$p$ and the n-type photoelectric conversion layer 111$n$ are each formed in a selective region near the surface S1. A portion of each of the p-type region 111$p$ and the n-type photoelectric conversion layer bent, and is so formed and extended as to reach an interface with the surface S2. The p-type region 111$p$ is coupled to an unillustrated p-type semiconductor well region on the surface-S1 side. The n-type photoelectric conversion layer 11 in is coupled to the FD 113 (n-type region) of the transfer transistor Tr2 for the blue color. It is to be noted that a p-type region 113$p$ (hole accumulation layer) is formed near an interface between the surface S2 and each of end portions of the p-type region 111$p$ and the n-type photoelectric conversion layer 111$n$ on the surface-S2 side.

The inorganic photoelectric conversion section 11R is so formed as to interpose, for example, an n-type photoelectric conversion layer 112$n$ (electron accumulation layer) between p-type regions 112$p$1 and 112$p$2 (hole accumulation layers) (i.e., has a p-n-p stacked structure). A portion of the n-type photoelectric conversion layer 112$n$ is bent, and is so formed and extended as to reach the interface with the surface S2. The n-type photoelectric conversion layer 112$n$ is coupled to the FD 114 (n-type region) of the transfer transistor Tr3 for the red color. It is to be noted that the p-type region 113$p$ (hole accumulation layer) is formed at least near the interface between the surface S2 and an end portion of the n-type photoelectric conversion layer 111$n$ on the surface-S2 side.

FIG. 4 illustrates a detailed configuration example of the electricity storage layer for green 110G. It is to be noted that description is given here of a case where, out of the pair of the electron and the hole generated by the organic photoelectric conversion section 11G, the electron serves as the signal electric charge, and is read from bottom-electrode-15$a$ side. Further, FIG. 4 also illustrates the gate electrode TG1 of the transfer transistor Tr1 out of the pixel transistors.

The electricity storage layer for green 110E includes an n-type region 115$n$ that serves as an electron accumulation layer. A portion of the n-type region 115$n$ is coupled to the electrically-conductive plug 120$a$1, and accumulates electrons supplied from the bottom-electrode-15$a$ side via the electrically-conductive plug 120$a$1. The n-type region 115$n$ is also coupled to the FD 116 (n-type region) of the transfer transistor Tr1 for the green color. It is to be noted that a p-type region 115$p$ (hole accumulation layer) is formed near an interface between the n-type region 115$n$ and the surface S2.

The electrically-conductive plugs 120$a$1 and 120$b$1, together with the later-described electrically-conductive plugs 120$a$2 and 10$b$2, each function as a connector between the organic photoelectric conversion section 11G and the semiconductor substrate 11, and form a transmission path for electrons or holes generated in the organic photoelectric conversion section 11G. In this embodiment, the electrically-conductive plug 120$a$1 is in electrically-conductive relation to the bottom electrode 15$a$ of the organic photoelectric conversion section 11G, and is coupled to the electricity storage layer for green 110G. The electrically-conductive plug 120$b$1 is in electrically-conductive relation to the top electrode 18 of the organic photoelectric conversion section 11G, and serves as a wiring line for discharge of holes.

These electrically-conductive plugs 120$a$1 and 120$b$1 are each configured, for example, by an electrically-conductive type semiconductor layer, and are each formed to be embedded in the semiconductor substrate 11. In this case, the electrically-conductive plug 120$a$1 may be of an n-type (because it serves as the transmission path of electrons)). The electrically-conductive plug 120$b$1 may be of a p-type (because it serves as the transmission path of holes). Alternatively, the electrically-conductive plugs 120$a$1 and 120$b$1 may each include, for example, an electrically-conductive film material such as tungsten that fills a through-via. In this case, for example, in order to suppress short circuit with silicon, a side surface of the via is desirably covered with an insulating film containing a material such as silicon oxide ($SiO_2$) or silicon nitride (SiN).

The multi-layer wiring layer 51 is formed on the surface S2 of the semiconductor substrate 11. In the multi-layer wiring layer 51, a plurality of wiring lines 51a are provided through an interlayer insulating film 52. In this manner, in the photoelectric conversion element 10A, the multi-layer wiring layer 51 is formed on side opposite to the light-receiving surface, making it possible to achieve a so-called backside illumination type solid-state imaging device. A support substrate 53 containing silicon, for example, is joined to the multi-layer wiring layer 51.

(1-2. Manufacturing Method of Photoelectric Conversion Element)

It is possible to manufacture the photoelectric conversion element 10A, for example, as follows. FIGS. 5A to 7C illustrate a manufacturing method of the photoelectric conversion element 10A in order of processes. It is to be noted that FIGS. 7A to 7C illustrate only a configuration of a main part of the photoelectric conversion element 10A.

First, the semiconductor substrate 11 is formed. Specifically, a so-called SOI substrate is prepared, in which the silicon layer 110 is formed on a silicon base 1101 with a silicon oxide film 1102 being interposed therebetween. It is to be noted that a surface on silicon-oxide-film-1102 side of the silicon layer 110 serves as the back surface (surface S1) of the semiconductor substrate 11. FIGS. 5A and 5B illustrate the structure illustrated in FIG. 1 in a vertically inverted state. Thereafter, as illustrated in FIG. 5A, the electrically-conductive plugs 120a1 and 120b1 are formed in the silicon layer 110. In this situation, it is possible to form the electrically-conductive plugs 120a1 and 120b1, for example, by forming through-vias in the silicon layer 110 and thereafter filling the through-vias with a barrier metal such as silicon nitride as mentioned above and tungsten. Alternatively, for example, an electrically-conductive type impurity semiconductor layer may be formed by ion implantation into the silicon layer 110. In this case, the electrically-conductive plug 120a1 is formed as an n-type semiconductor layer, while the electrically-conductive plug 120b1 is formed as a p-type semiconductor layer. Thereafter, for example, the inorganic photoelectric conversion sections 11B and 11R are formed by ion implantation, in regions of different depths inside the silicon layer 110 (so as to be superposed on each other). The inorganic photoelectric conversion sections 11B and 11R each have the p-type region and n-type region illustrated in FIG. 3A. Further, the electricity storage layer for green 110G is formed by ion implantation in a region adjacent to the electrically-conductive plug 120a1. In this manner, the semiconductor substrate 11 is formed.

Thereafter, the pixel transistors including the transfer transistors Tr1 to Tr3, and the peripheral circuit such as the logic circuit are formed on the surface-S2 side of the semiconductor substrate 11. Thereafter, as illustrated in FIG. 5B, the wiring lines 51a in a plurality of layers are formed on the surface S2 of the semiconductor substrate 11 through the interlayer insulating film 52, to thereby form the multi-layer wiring layer 51. Thereafter, the support substrate 53 including silicon is joined onto the multi-layer wiring layer 51. Thereafter, the silicon base 1101 and the silicon oxide film 1102 are peeled off from the surface-S1 side of the semiconductor substrate 11 to allow the surface S1 of the semiconductor substrate 11 to be exposed.

Thereafter, the organic photoelectric conversion section 11G is formed on the surface S1 of the semiconductor substrate 11. Specifically, as illustrated in FIG. 6A, first, the interlayer insulating film 12 configured by the stacked film of the hafnium oxide film and the silicon oxide film as described above is formed on the surface S1 of the semiconductor substrate 11. For example, the hafnium oxide film is formed by an atomic layer deposition (ALD) method, and thereafter, for example, the silicon oxide film is formed by a plasma chemical vapor deposition (CVD) method. Thereafter, contact holes H1a and H1b are formed at positions facing the respective electrically-conductive plugs 120a1 and 120b1 of the interlayer insulating film 12. The electrically-conductive plugs 120a2 and 120b2 including the above-described material are so formed as to fill the contact holes H1a and H1b, respectively. In this situation, the electrically-conductive plugs 120a2 and 120b2 may each be formed to expand to a region that is desired to be shielded against light (to cover the region that is desired to be shielded against light). Alternatively, a light-shielding layer may be formed in a region separated from the electrically-conductive plugs 120a2 and 120b2.

Thereafter, as illustrated in FIG. 6B, the interlayer insulating film 14 including the above-described material is formed by the plasma CVD method, for example. It is to be noted that, after the formation of the film, a surface of the interlayer insulating film 14 is desirably planarized by a chemical mechanical polishing (CMP) method, for example. Thereafter, contact holes are opened at positions facing the electrically-conductive plugs 120a2 and 120b2 of the interlayer insulating film 14. The contact holes are filled with the above-described material to form the wiring layers 13a and 13b. It is to be noted that thereafter, with the use of the CMP method, for example, a residual wiring layer material (such as tungsten) on the interlayer insulating film 14 is desirably removed. Thereafter, the bottom electrode 15a is formed on the interlayer insulating film 14. Specifically, first, the above-described transparent electrically-conductive film is formed over an entire surface of the interlayer insulating film 14 by a sputtering method, for example. Thereafter, with the use of a photolithography method (performing, for example, exposure, development, and post-bake of a photoresist film), and with the use of, for example, dry etching or wet etching, a selective portion is removed, thus forming the bottom electrode 15a. In this situation, the bottom electrode 15a is formed in a region that faces the wiring layer 13a. Further, in processing the transparent electrically-conductive film, the transparent electrically-conductive film is allowed to remain also in a region that faces the wiring layer 13b, thereby forming the wiring layer 15b, together with the bottom electrode 15a. The wiring layer 15b constitutes a portion of the transmission path of holes.

Thereafter, the insulating film 16 is formed. In this situation, first, the insulating film 16 including the above-described material is formed, for example, by the plasma CVD method over an entire surface of the semiconductor substrate 11 to cover the interlayer insulating film 14, the bottom electrode 15a, and the wiring layer 15b. Thereafter, as illustrated in FIG. 7A, the insulating film 16 formed is polished, for example, by the CMP method. Thus, the bottom electrode 15a and the wiring layer 15b are exposed from the insulating film 16, and a level difference between the bottom electrode 15a and the insulating film 16 are moderated (desirably planarized).

Thereafter, as illustrated in FIG. 7B, the organic photoelectric conversion layer 17 is formed on the bottom electrode 15a. In this situation, the photoelectric conversion material including the above-described material is formed and patterned by a vacuum deposition method with the use of a metal mask, for example. It is to be noted that, as described above, in forming other organic layers (such as the electron blocking layer) as an upper layer or a lower layer of the organic photoelectric conversion layer 17, it is desirable that the layers be formed successively in a vacuum process (through a vacuum consistent process) with the use of the same metal mask. Further, the film-forming method of the organic photoelectric conversion layer 17 is not necessarily limited to the above-described method with the use of the metal mask; any other method, for example, a printing technique, may be used.

Thereafter, as illustrated in FIG. 7C, the top electrode 18 and the protective layer 19 are formed. First, the top electrode 18 configured by the above-described transparent electrically-conductive film is formed, by the vacuum deposition method or the sputtering method, for example, over an entire substrate surface, to cover the upper surface and the side surfaces of the organic photoelectric conversion layer 17. It is to be noted that the top electrode 18 is desirably formed through the vacuum consistent process with the organic photoelectric conversion layer 17, because the organic photoelectric conversion layer 17 is easily varied in characteristics under influences of, for example, moisture, oxygen, and hydrogen. Thereafter (before patterning of the top electrode 18), the protective layer 19 including the above-described material is formed by the plasma CVD method, for example, to cover the upper surface of the top electrode 18. Thereafter, the protective layer 19 is formed on the top electrode 18, and thereafter, the top electrode 18 is processed.

Thereafter, by etching with the use of the photolithography method, a selective portion of each of the top electrode 18 and the protective layer 19 is collectively removed. Thereafter, the contact hole H is formed in the protective layer 19, for example, by the etching with the use of the photolithography method. In this situation, the contact hole H is desirably formed in the non-opposed region to the organic photoelectric conversion layer 17. After the formation of the contact hole H as well, in a similar manner to as described above, a photoresist is peeled off, and cleaning using a chemical solution is performed. Thus, it follows that the top electrode 18 is exposed from the protective layer 19 in the region facing the contact hole H. Therefore, in consideration of generation of a pin hole as described above, the contact hole H is desirably provided by avoiding the region where the organic photoelectric conversion layer 17 is formed. Thereafter, the contact metal layer 20 containing the above-described material is formed using the sputtering method, for example. In this situation, the contact metal layer 20 is so formed on the protective layer 19 as to fill the contact hole H and to extend to the upper surface of the wiring layer 15b. Finally, the planarization layer 21 is formed over the entire surface of the semiconductor substrate 11, and thereafter, the on-chip lens 22 is formed on the planarization layer 21 to complete the photoelectric conversion element 10A illustrated in FIG. 1.

In the photoelectric conversion element 10A as described above, for example, as the unit pixel P of the solid-state imaging device 1, the signal electric charge is acquired as follows. That is, as illustrated in FIG. 8, upon light L entering the photoelectric conversion element 10A, through the on-chip lens 22 (not illustrated in FIG. 8), the light L passes through the organic photoelectric conversion section 11G and the inorganic photoelectric conversion sections 11B and 11R in order, and undergoes the photoelectric conversion of each color of red, green, and blue during the process of passage. FIG. 9 schematically illustrates a flow of acquisition of the signal electric charge (electron) based on the entering light. In what follows, described is specific operation of signal acquisition in each of the photoelectric conversion sections.

(Acquisition of Green Signal by Organic Photoelectric Conversion Section 11G)

Out of the pieces of the light L entering the photoelectric conversion element 10A, first, green light Lg is selectively detected (absorbed) in the organic photoelectric conversion section 11G to undergo the photoelectric conversion. Accordingly, an electron Eg out of the electron-hole pair generated is extracted from the bottom-electrode-15a side, and thereafter, is accumulated into the electricity storage layer for green 110G through a transmission path A (wiring layer 13a and electrically-conductive plugs 120a1 and 120a2). The accumulated electron Eg is transferred to the FD 116 upon reading operation. It is to be noted that a hole Hg is discharged from top-electrode-18 side through a transmission path B (contact metal layer 20, wiring layers 13b and 15b, and electrically-conductive plugs 120b1 and 120b2).

Specifically, the signal electric charge is accumulated as follows. That is, in this embodiment, for example, a predetermined negative potential VL (<0 V) is applied to the bottom electrode 15a, while a potential VU (<VL) lower than the potential VL is applied to the top electrode 18. It is to be noted that the potential VL is supplied, for example, from the wiring line 51a inside the multi-layer wiring layer 51 to the bottom electrode 1:5a through the transmission path A. The potential VL is supplied, for example, from the wiring line 51a inside the multi-layer wiring layer 51 to the top electrode 18 through the transmission path B. Accordingly, in a state where the electric charge is accumulated (where the unillustrated reset transistor and the transfer transistor Tr1 are each in an OFF state), the electron, out of the electron-hole pair generated in the organic photoelectric conversion layer 17, is guided toward the bottom-electrode-15a side having a relatively high potential (the hole is guided toward the top-electrode-18 side). In this manner, the electron Eg is extracted from the bottom electrode 15a, and is accumulated in the electricity storage layer for green 110G (n-type region 115n, in detail) through the transmission path A. Further, the accumulation of the electron Eg also causes fluctuation of the potential VL of the bottom electrode 15a in electrically-conductive relation to the electricity storage layer for green 110G. This amount of the variation in the potential VL, corresponds to a signal potential (here, a potential of a green signal).

Further, upon the reading operation, the transfer transistor Tr1 is turned into an ON state, and the electron Eg accumulated in the electricity storage layer for green 110G is transferred to the FD 116. This causes the green signal based on a light reception amount of the green light Lg to be read by the later-described vertical signal line Lsig through another unillustrated pixel transistor. Thereafter, the unillustrated reset transistor and the transfer transistor Tr1 are turned into an ON state, causing the FD 116 as the n-type region and an electricity storage region of the electricity storage layer for green 110G (n-type region 115n) to be reset to a power supply voltage VDD, for example.

(Acquisition of Blue Signal and Red Signal by Inorganic Photoelectric Conversion Sections 11B and 11R)

Thereafter, blue light and red light of the pieces of light having been transmitted through the organic photoelectric conversion section 11G are absorbed in order, respectively, in the inorganic photoelectric conversion sections 11B and 11R to each undergo the photoelectric conversion. In the inorganic photoelectric conversion section 11B, an electron Eb corresponding to the entering blue light is accumulated in the n-type region (n-type photoelectric conversion layer 111n), and the accumulated electron Ed is transferred to the FD 113 upon the reading operation. It is to be noted that the hole accumulated in the unillustrated p-type region. Likewise, in the inorganic photoelectric conversion section 11R, an electron Er corresponding to the entering red light is accumulated in the n-type region (n-type photoelectric conversion layer 112n), and the accumulated electron Er is transferred to the FD 114 upon the reading operation. It is to be noted that the hole is accumulated in the unillustrated p-type region.

As described above, in the state where the electric charge is accumulated, the negative potential VL is applied to the bottom electrode 15a of the organic photoelectric conversion section 11G. Thus, the p-type region (p-type region 111p in FIG. 2) being the hole accumulation layer of the inorganic photoelectric conversion section 11B tends to have an increased hole concentration. Accordingly, it becomes possible to suppress the occurrence of the dark current at the interface between the p-type region 111p and the interlayer insulating film 12.

Upon the reading operation, similarly to the above-described organic photoelectric conversion section 11G, the transfer transistors Tr2 and Tr3 are turned into an ON state, and the electrons Eb and Er accumulated, respectively, in the n-type photoelectric conversion layers 111n and 112n are transferred, respectively, to the FDs 113 and 114. This causes each of the blue signal based on a light reception amount of the blue light Lb and the red signal based on a light reception amount of the red light Lr to be read by the later-described vertical signal line Lsig through unillustrated another pixel transistor. Thereafter, the unillustrated reset transistor and the transfer transistors Tr2 and Tr3 are turned into an ON state, causing the FDs 113 and 114 as the n-type regions to be reset to the power supply voltage VDD, for example.

In this manner, by stacking the organic photoelectric conversion section 11G and the inorganic photoelectric conversion sections 11B and 11R in the vertical direction, it becomes possible to separate and detect pieces of color light of red, green, and blue, without providing a color filter, allowing for the acquisition of the signal electric charge of each color. This makes it possible to suppress an optical loss (reduction in sensitivity) caused by color light absorption by the color filter as well as occurrence of a false color associated with a pixel interpolation process.

(1-3. Workings and Effects)

In recent years, high sensitivity, low noise, and a high color reproduction characteristic have been desired for photoelectric conversion elements (imaging elements) used in, for example, CCD image sensors or CMOS image sensors. As one of the photoelectric conversion elements that achieve them, there has been developed an imaging device in which an organic photoelectric conversion section and photodiodes (inorganic photoelectric conversion sections) are stacked, as mentioned above. The organic photoelectric conversion section detects, for example, green light to generate a signal electric charge corresponding thereto. The photodiodes detect respective pieces of red light and blue light. This imaging element obtains signals of three colors (R, G, and B) in one pixel, allowing for enhancement in photoelectric conversion efficiency and sensitivity in one pixel.

In the imaging element as mentioned above, it has been known that forming a photoelectric conversion layer as a bulk hetero layer leads to remarkable improvement in the photoelectric conversion efficiency. In the bulk hetero layer, two or more kinds of organic semiconductor materials that differ in energy levels are mixed. The photoelectric conversion efficiency of the bulk hetero layer is largely influenced by a combination of the organic semiconductor materials to be mixed, or a mixture state thereof. Thus, investigations have been made on combinations of various organic semiconductor materials, for purposes of the enhancement in the photoelectric conversion efficiency. However, although general imaging elements are able to selectively absorb specific light (e.g., green light (500 nm to 560 nm)), they have failed in obtaining sufficiently high photoelectric conversion efficiency (external quantum efficiency).

The photoelectric conversion is said to include the following four processes. To begin with, first, an exciton generation process of absorbing light to generate an exciton. Second, an exciton diffusion process in which the exciton reaches an interface between different kinds of materials. Third, a separation process in which the exciton separates itself into carriers at the interface. Fourth, a carrier movement process in which the carriers generated moves to the electrodes. Possible causes of a decrease in the photoelectric conversion efficiency include, in the process as mentioned above, deactivation of the exciton generated, before reaching the interface between the different kinds of materials, and a mismatch of energy levels (HOMO and LUMO) of a plurality of materials that constitute the photoelectric conversion layer. As described above, the photoelectric conversion efficiency of the bulk hetero layer is largely influenced by the combination of the organic semiconductor materials to be mixed, or the mixture state thereof. This is because an aggregate state of the organic semiconductor materials inside the photoelectric conversion layer (bulk hetero layer) has a large influence on the exciton diffusion process.

However, the aggregate state of the organic semiconductor materials inside the photoelectric conversion layer largely changes material by material. Moreover, in a case where the photoelectric conversion layer is formed using a plurality of organic semiconductor materials, the aggregate state of each of the organic semiconductor materials inside the photoelectric conversion layer largely changes with a difference in how the materials to be mixed aggregate, or their interactions.

In order to enhance the photoelectric conversion efficiency, in the separation process of the exciton, it is desirable to enhance not only a HOMO-LUMO difference of the organic semiconductor materials to be mixed, but also an exchange integral to cause carrier movement between molecules of the organic semiconductor materials to be mixed. In other words, it is desirable that an ideal bulk hetero mixture state be achieved at the time of mixing. However, for a reason as mentioned above, it is difficult to predict a bulk hetero mixture state in a case with a combination of the plurality of the organic semiconductor materials.

As a result of a search for a number of material systems to obtain high photoelectric conversion efficiency, this embodiment involves forming the organic photoelectric conversion layer 17 with the use of at least one kind of the DTT derivative. This makes it possible to quickly separate the exciton generated by the light absorption into the carriers at an interface between the DTT derivative and other materials that constitute the organic photoelectric conversion layer 17. Moreover, it is possible to allow the carriers generated to quickly reach, for example, the bottom electrode 15a.

Although reasons for the enhancement in the photoelectric conversion efficiency owing to the use of the DTT derivative are not clear, there are supposed to be two reasons as follows. For one reason, energy levels of the DTT derivative and a light absorber used together (e.g., the subphthalocyanine derivative represented by the forgoing general formula (4)) are considered to have optimal relation. For another reason, an aggregate body of the DTT derivative is able to quickly transport a hole generated by electric charge separation, to the electrode.

The DTT derivative includes at least three sulfur (S) atoms in a condensed molecular skeleton. There occur interactions between the three S atoms included in the condensed molecular skeleton and S atoms included in another condensed molecular skeleton of the derivative. Specifically, in position numbering in the condensed molecular skeleton of the DTT derivative as illustrated in FIG. 10A, there occur S . . . S interactions, as illustrated in, for example, FIG. 10B, between the S atoms at 1-position and 7-position of a DTT derivative and the S atom at 4-position of another DTT derivative. This causes generation of a relatively large bonding force between molecules of the DTT derivative. Accordingly, the aggregate body of the DTT derivative is supposed to easily cause hopping conduction of the hole generated by the electric charge separation.

Although details are described later, in comparison of the DTT derivative with DNTT (refer to a formula (13) described later) as a thienothiophene derivative, the DTT derivative makes it possible to obtain higher photoelectric conversion efficiency than the DNTT. One reason is as follows. In the DNTT, two S atoms are included in a condensed molecular skeleton, causing a single S . . . S interaction generated between molecules. In contrast, the DTT derivative, as described above, includes the three S atoms in the molecular skeleton, causing the two S . . . S interactions between molecules. Thus, the bonding force between the molecules of the DTT derivative is larger than a bonding force between the molecules of the DNTT. In other words, the aggregate body of the DTT derivative allows for easier hopping conduction of the hole generated by the electric charge separation than an aggregate body of the DNTT. It is therefore supposed that the DTT derivative exhibits higher photoelectric conversion efficiency than that of the DNTT.

As described above, in this embodiment, the organic photoelectric conversion layer 17 is formed with the use of the DTT derivative represented by the forgoing general formula (1). This makes it possible to quickly perform the separation of the exciton generated by the light absorption into the carriers, and the movement of the carriers to the electrodes. Hence, it is possible to enhance the photoelectric conversion efficiency.

Furthermore, R1 and R2 of the DTT derivative represented by the forgoing general formula (1) are each, preferably: biphenyl group; terphenyl group; telphenyl group; or a derivative thereof, in each of which phenyl groups or their derivatives are bonded to one another at their para-positions.

For example, forming the organic photoelectric conversion layer 17 as the bulk hetero layer in which the two or more kinds of materials having different energy levels are mixed is effective in obtaining high external quantum efficiency (photoelectric conversion efficiency). In the bulk hetero layer in which the two or more kinds of materials (p-type semiconductor and n-type semiconductor) are mixed and formed into a film, it is desirable that the p-type semiconductor and the n-type semiconductor each form an appropriate degree of grains.

The exciton generated by the light absorption makes the electric charge separation at an interface between the grains of the p-type semiconductor and the n-type semiconductor, to generate the carriers (hole and electron). The carriers generated pass through percolation paths formed by each of the grains, and reach the respective electrodes. At this occasion, grain crystals include a defect, there is formed a slightly-deviated energy level (carrier trap). If the carriers generated are captured by the carrier trap, smooth carrier movement is hindered. This causes easy recombination of the carriers (hole and electron), resulting in lowered external quantum efficiency (photoelectric conversion efficiency). If the carriers generated when the light is turned off is captured by the carrier trap, the carrier movement becomes slow, which is considered to cause lowered responsiveness.

It is to be noted that if the p-type semiconductor and the n-type semiconductor are completely mixed (in a compatibilized state), no percolation paths are formed. This causes immediate recombination and deactivation of the hole and the electron that have been once generated by the electric charge separation. Moreover, if the grains of the p-type semiconductor and the n-type semiconductor are large, with the p-type semiconductor and the n-type semiconductor being considerably spaced away, the exciton generated is deactivated before reaching the interface between the p-type semiconductor and the n-type semiconductor. In general, an exciton diffusion length in an organic semiconductor material is considered to be about 20 nm.

In view of the forgoing, R1 and R2 of the DTT derivative represented by the forgoing general formula (1) are each: biphenyl group; terphenyl group; telphenyl group; or a derivative thereof, in each of which phenyl groups or their derivatives are bonded to one another at their para-positions. This makes it possible to improve crystallinity inside the bulk hetero layer that constitutes the organic photoelectric conversion layer 17. Specifically, the grains of appropriate sizes are formed, while improvement is made in packing of molecules in a grain as an aggregate of the DTT derivative of this embodiment. Hence, it is possible to form the grain of few crystal defects, leading to improvement in movement of macroscopic carriers. In other words, it is possible to reduce the dark current and to obtain high-speed photoresponsiveness, while maintaining a sharp spectroscopic shape. Furthermore, it is possible to enhance the photoelectric conversion efficiency.

Description is given next of a second embodiment and a modification example of the disclosure. It is to be noted that constituent elements corresponding to those of the photoelectric conversion element 10A of the forgoing first embodiment are denoted by the same reference characters, and description thereof is omitted.

2. SECOND EMBODIMENT

Figure 11:
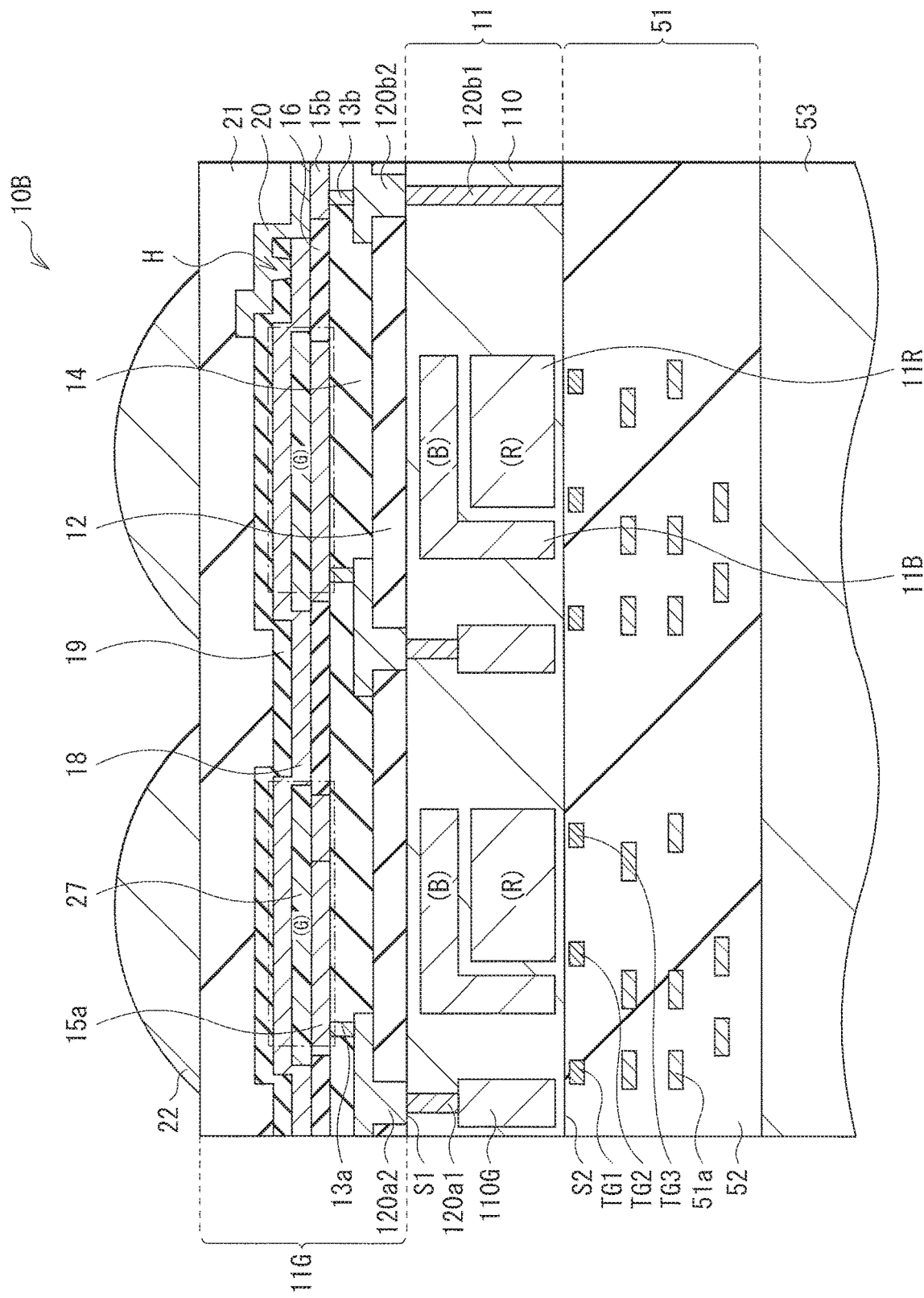
FIG. 11 is a cross-sectional view of a schematic configuration of a photoelectric conversion element according to a second embodiment of the disclosure.

FIG. 11 illustrates a cross-sectional configuration of a photoelectric conversion element (photoelectric conversion element 10B) according to a second embodiment of the disclosure. As with the photoelectric conversion element 10A of the above-described first embodiment, the photoelectric conversion element 10B constitutes the single pixel (unit pixel P) in, for example, the solid-state imaging device (solid-state imaging device 1) such as the CCD image sensor and the CMOS image sensor. FIG. 11 illustrates an example in which the two photoelectric conversion elements 10B are disposed in adjacency. The photoelectric conversion element 10B includes the pixel transistors (inclusive of the transfer transistors Tr1 to Tr3 described later) and the multi-layered wiring layer (multi-layered wiring layer 51), on the front-surface (the surface S2 on the opposite side to the light-receiving surface) side of the semiconductor substrate 11.

The photoelectric conversion element 10B of this embodiment has a structure in which the single organic photoelectric conversion section 11G and the two inorganic photoelectric conversion sections 11B and 11R are stacked in the vertical direction. The organic photoelectric conversion section 11G and the inorganic photoelectric conversion sections 11B and 11R each selectively detect the corresponding one of the pieces of the light of the different wavelength regions to perform the photoelectric conversion. The photoelectric conversion element 10B is different from the photoelectric conversion element 10A of the forgoing first embodiment in that the organic photoelectric conversion section 11G (specifically, an organic photoelectric conversion layer 27) includes a benzodithiophene (BDT)-based derivative out of the polycyclic aromatic compounds.

(2-1. Configuration of Organic Photoelectric Conversion Layer)

The organic photoelectric conversion layer 27 of this embodiment includes one or more kinds of the BDT-based derivative represented by a general formula (2) or a general formula (3) as follows. Moreover, the organic photoelectric conversion layer 27 preferably includes both a p-type semiconductor and an n-type semiconductor. Preferably, for example, one of the p-type semiconductor and the n-type semiconductor is a transparent material, while the other of the p-type semiconductor and the n-type semiconductor is a material that performs photoelectric conversion of light of a selective wavelength region. A film thickness in the stacking direction (hereinafter simply referred to as a thickness) of the organic photoelectric conversion layer 27 is, for example, 50 nm to 500 nm both inclusive.

[Chem. 13]

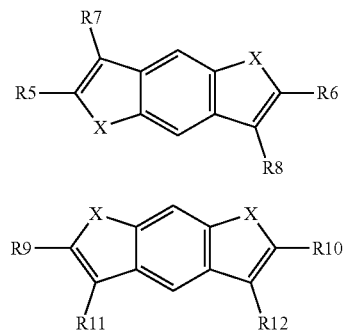

(2)

(3)

where X is any one of oxygen (O), sulfur (S), selenium (Se), and tellurium (Te). R5 to R12 are, each independently: hydrogen atom; halogen atom; linear, branched, or cyclic alkyl group; aryl group; or a derivative thereof. Any adjacent members from among R5 to R12 may form a condensed aliphatic ring or a condensed aromatic ring by being bonded to each other. The condensed aliphatic ring or the condensed aromatic ring may contain one or more atoms of nitrogen (N), sulfur (S), selenium (Se), and tellurium (Te).

The BDT-based derivative is a kind of heteroacene-based compound, and includes, as a hetero atom, a chalcogen element including oxygen (O), sulfur (S), selenium (Se), and tellurium (Te) at X of the forgoing general formula (2) and the general formula (3), as illustrated in, for example, chemical formulae 14 and 15 (chalcogeno-acene-based compound).

[Chem. 14]

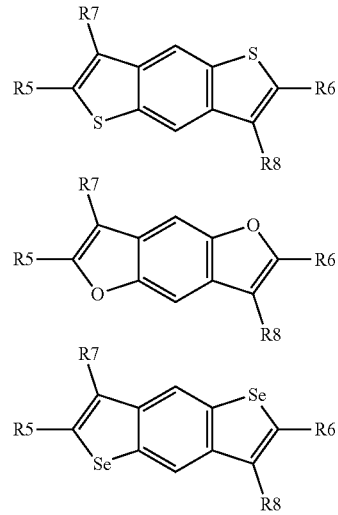

[Chem. 15]

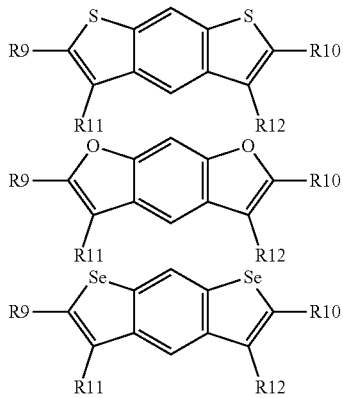

Furthermore, the BDT-based derivative preferably has a similar characteristic to that of the DTT derivative as described above. Specifically, for example, the chalcogeno-acene-based compound is preferably transparent. To be specific, the chalcogeno-acene-based compound is preferably devoid of the maximum absorption wavelength in the wavelength range of 500 nm to 600 nm both inclusive. Moreover, energy levels of a HOMO and a LUMO of the BDT-based derivative are preferably levels at which the photoelectric conversion mechanism smoothly works with respect to other materials that constitute the organic photoelectric conversion layer 27. This is for purposes of the quick separation of the exciton generated in the organic photoelectric conversion layer 27 by the light absorption into the carriers, and furthermore, for purposes of the prompt movement of the carriers generated to, for example, the bottom electrode 15a. Specifically, a HOMO level of the BDT-based derivative is preferably, for example, −6.6 eV to −4.8 eV both inclusive, and more preferably, −6.0 eV to −5.0 eV both inclusive. It is to be noted that an absolute value of the energy level of the HOMO corresponds to the ionization potential, i.e., the energy involved in extracting the electron from the HOMO to the outside (in vacuum). As to the measurement method of the HOMO value, the measurement may be made with, for example, the photoelectron spectroscopy device using the UPS method that includes depositing the thin film made of the organic material on the substrate of the conductive film (e.g., ITO or Si), and irradiating the thin film with the ultraviolet rays.

As such a BDT-based derivative, preferably, R5, R6, R9, and R10 have, each independently, an aryl group. Moreover, R7, R8, R11, and R12 are each preferably a hydrogen atom. Examples of the aryl group include a group having polycyclic aromatic hydrocarbon such as phenyl group, biphenyl group, biphenyl group, terphenyl group, stilbene group, naphthyl group, anthracenyl group, phenanthrene group, pyrenyl group, perylenyl group, tetracenyl group, chrycenyl group, fluorenyl group, acenaphthacenyl group, triphenylene group, fluoranthene group, or a derivative thereof, each of which has a carbon number of 6 to 60 both inclusive. Specifically, examples include substituent groups represented by the following chemical formulae 16 to 20. Among them, R5, R6, R9, and R10 are, each independently, preferably: biphenyl group; terphenyl group; terphenyl group; or a derivative thereof, each of which has a structure in which two or more phenyl groups are covalent-bonded to one another with a single bond. In particular, what includes phenyl groups or their derivatives bonded to one another at their para-positions is desirable. This is because the packing of the molecules is improved in the formation of the bulk hetero layer that constitutes the organic photoelectric conversion layer 27, leading to the easy formation of the grains having few crystal defects.

[Chem. 16]

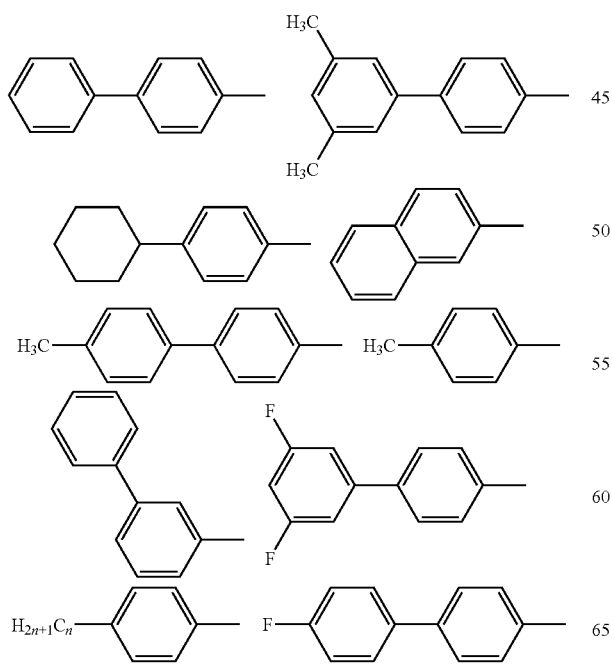

[Chem. 17]

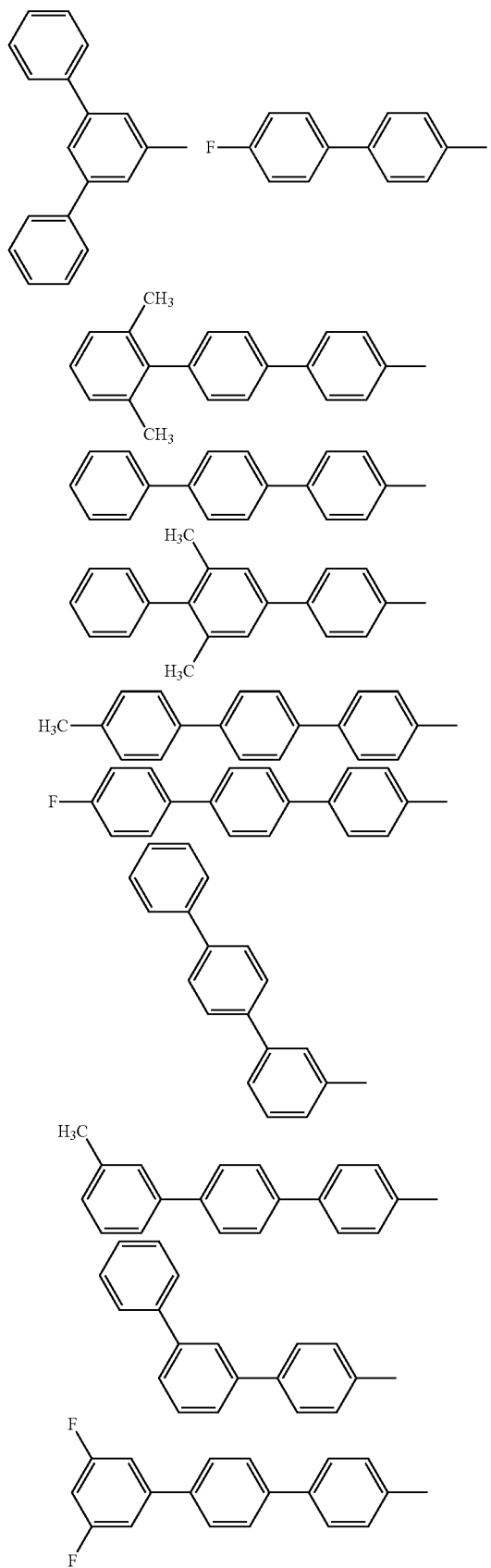

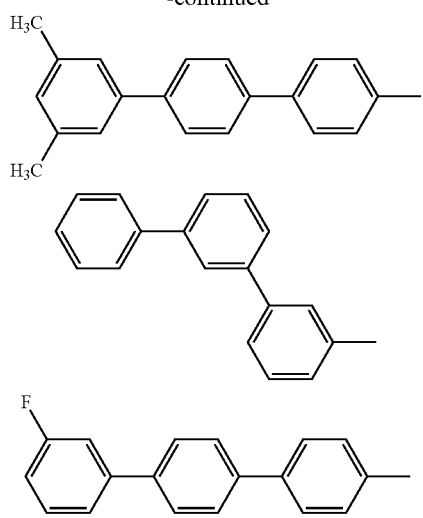
[Chem. 18]
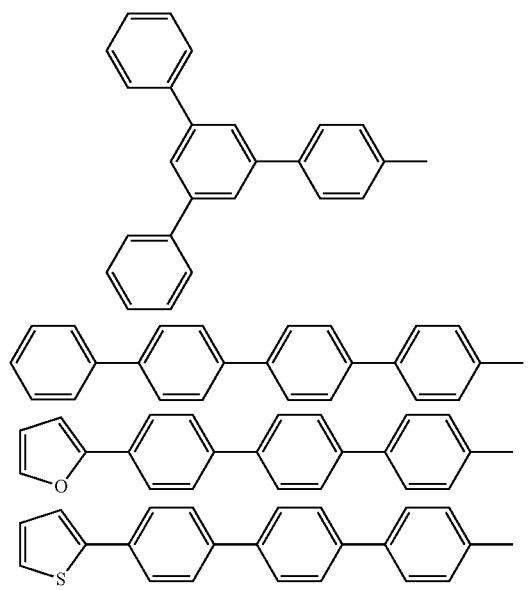
[Chem. 19]
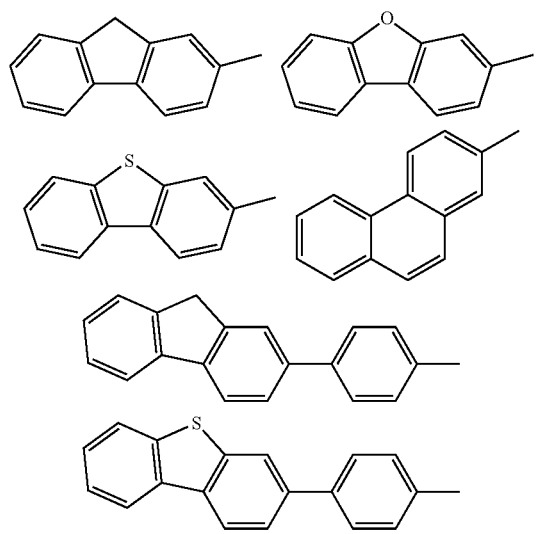
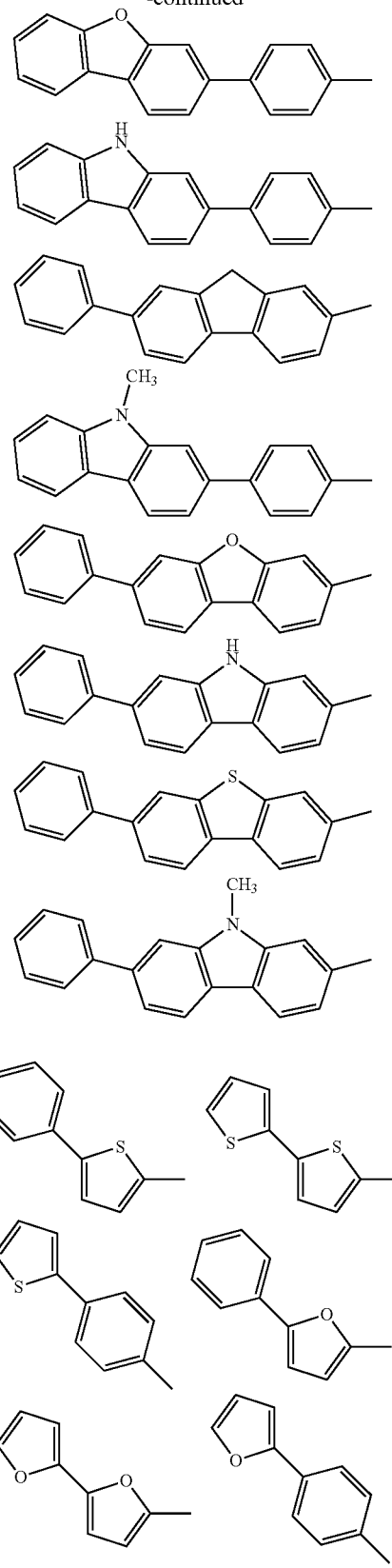
[Chem. 20]
The organic photoelectric conversion layer 27 preferably uses, in addition to the forgoing BDT-based derivative, the material that performs the photoelectric conversion of the light of the selective wavelength region (light absorber). Specifically, the organic semiconductor material is preferably used that has the maximum absorption wavelength in the wavelength region of, for example, 500 nm to 600 nm both inclusive. This makes it possible to selectively perform the photoelectric conversion of the green light in the organic photoelectric conversion section 11G. Examples of such a material include the subphthalocyanine or a derivative thereof represented by the forgoing general formula (4).

The organic photoelectric conversion layer 27 further uses, preferably, for example, C60 fullerene or a derivative thereof represented by the forgoing general formula (5), or C70 fullerene or a derivative thereof represented by the forgoing general formula (6). Using at least one kind out of the fullerene 60 and the fullerene 70 or their derivatives allows for the further enhancement in the photoelectric conversion efficiency and the reduction in the dark current.

The BDT-based derivative, the subphthalocyanine or its derivative, and the fullerene 60, the fullerene 70, or their derivatives as mentioned above function as the p-type semiconductor or the n-type semiconductor, depending on the material to be combined with.

It is to be noted that any other unillustrated layer may be provided between the organic photoelectric conversion layer 27 and the bottom electrode 15a, and between the organic photoelectric conversion layer 27 and the top electrode 18. For example, the underlying film, the hole transport layer, the electron blocking film, the organic photoelectric conversion layer 27, the hole blocking film, the buffer film, the electron transport layer, and the work function adjustment film may be stacked in order from side on which the bottom electrode 15a is disposed. For the electron blocking film, the hole blocking film, the electron transport layer, and the hole transport layer, the compound as mentioned above may be used.

(2-3. Workings and Effects)

As described above, in this embodiment, the organic photoelectric conversion layer 27 is formed with the use of the BDT-based derivative represented by the forgoing general formula (2) or the general formula (3). This makes it possible to quickly perform the separation of the exciton generated by the light absorption into the carriers, and the movement of the carriers to the electrodes. Hence, it is possible to enhance the photoelectric conversion efficiency.

Furthermore, in this embodiment, R5, R6, R9, and R10 of the BDT-based derivative represented by the forgoing general formula (2) and the general formula (3) are each: biphenyl group; terphenyl group; terphenyl group; or a derivative thereof, in each of which phenyl groups or their derivatives are bonded to one another at their para-positions. This leads to the improvement in the crystallinity inside the bulk hetero layer that constitutes the organic photoelectric conversion layer 27. Specifically, improvement is made in packing of molecules in a grain as an aggregate of the chalcogeno-acene-based compound of this embodiment. This makes it possible to form the grain of few crystal defects, leading to the improvement in the movement of the macroscopic carriers. Hence, it is possible to reduce the dark current and to obtain the high-speed photoresponsiveness, while maintaining the sharp spectroscopic shape. Furthermore, it is possible to enhance the photoelectric conversion efficiency even more.

3. MODIFICATION EXAMPLE

Figure 12:
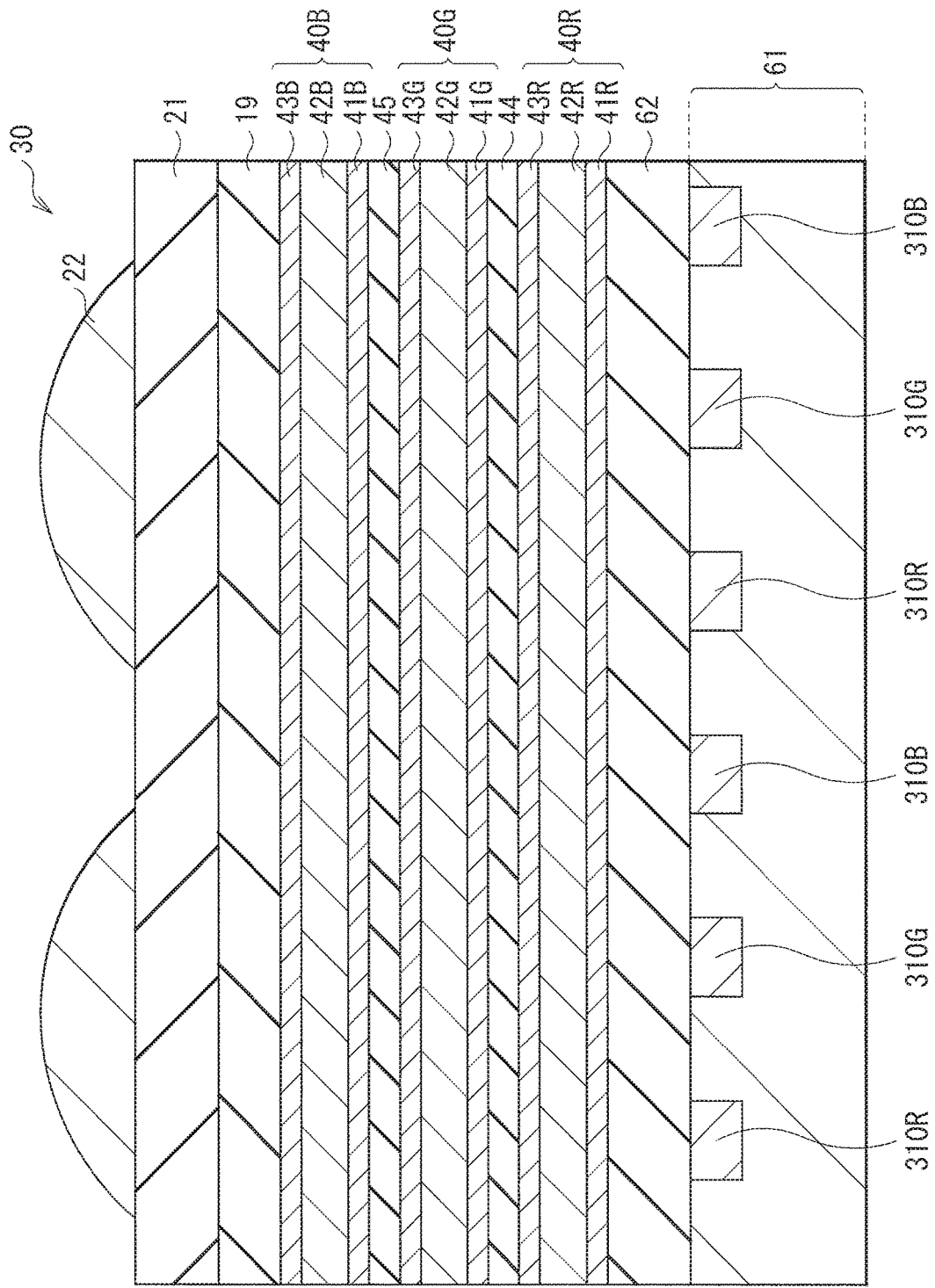
FIG. 12 is a cross-sectional view of a schematic configuration of a photoelectric conversion element according to a modification example of the disclosure.

FIG. 12 illustrates a cross-sectional configuration of a photoelectric conversion element (photoelectric conversion element 30) according to a modification example of the disclosure. As with the photoelectric conversion elements 10A and 10B of, for example, the above-described first embodiment, the photoelectric conversion element 30 constitutes the single pixel (unit pixel P) in, for example, the solid-state imaging device (solid-state imaging device 1) such as the CCD image sensor and the CMOS image sensor. The photoelectric conversion element 30 has a configuration in which a red photoelectric conversion section 40R, a green photoelectric conversion section 40G, and a blue photoelectric conversion section 40B are stacked in this order on a silicon substrate 61, with an insulating layer 62 being interposed therebetween.

The red photoelectric conversion section 40R, the green photoelectric conversion section 40G, and the blue photoelectric conversion section 40B respectively, include organic photoelectric conversion layers 42R(42G, and 42B) between a pair of electrodes, i.e., first electrodes 41R(41G, and 41B) and second electrodes 43R(43G, and 43B). The organic photoelectric conversion layers 42R(42G, and 42B) each include the DTT derivative, making it possible to produce the similar effects to those of the forgoing embodiment.

As mentioned above, the photoelectric conversion element 30 has the configuration in which the red photoelectric conversion section 40R, the green photoelectric conversion section 40G, and the blue photoelectric conversion section 40B are stacked in this order on the silicon substrate 61, with the insulating layer 62 being interposed therebetween. The on-chip lens 22 is provided on the blue photoelectric conversion section 40B, with the protective layer 19 and the planarization layer 21 being interposed therebetween. An electricity storage layer for red 310R, an electricity storage layer for green 310G, and an electricity storage layer for blue 310B are provided inside the silicon substrate 61. Light that enters the on-chip lens undergoes photoelectric conversion at the red photoelectric conversion section 40R, the green photoelectric conversion section 40G, and the blue photoelectric conversion section 40B, causing respective signal electric charges to be transmitted from the red photoelectric conversion section 40R to the electricity storage layer for red 310R, from the green photoelectric conversion section 40G to the electricity storage layer for green 310G, and from the blue photoelectric conversion section 40B to the electricity storage layer for blue 310B. The signal electric charge may be either an electron or a hole that is generated from the photoelectric conversion. In the following, description is made by giving, as an example, a case where the electron is read out as the signal electric charge.

The silicon substrate 61 includes, for example, a p-type silicon substrate. The electricity storage layer for red 310R, the electricity storage layer for green 310G, and the electricity storage layer for blue 310B provided in this silicon substrate 61 include respective n-type semiconductor regions that are provided for accumulation of the electrons (signal electric charges) supplied from the red photoelectric conversion section 40R, the green photoelectric conversion section 40G, and the blue photoelectric conversion section 40B. The respective n-type semiconductor regions of the electricity storage layer for red 310R, the electricity storage layer for green 310G, and the electricity storage layer for blue 310B are formed, for example, by doping the silicon substrate 61 with an n-type impurity such as phosphorus (P) or arsenic (As). It is to be noted that the silicon substrate 61 may be provided on a support substrate (not illustrated) containing glass, for example.

On the silicon substrate 61, provided are pixel transistors that read out the electrons from each of the electricity storage layer for red 310B, the electricity storage layer for green 310G, and the electricity storage layer for blue 310B, and transfer the electrons to, for example, vertical signal lines (vertical signal lines Lsig in FIG. 12 described later). Floating diffusions of the pixel transistors are provided inside the silicon substrate 61. The floating diffusions are coupled to the electricity storage layer for red 310S, the electricity storage layer for green 310G, and the electricity storage layer for blue 310B. The floating diffusions each are configured by an n-type semiconductor region.

The insulating layer 62 includes, for example, silicon oxide, silicon nitride, silicon oxynitride, and hafnium oxide. The insulating layer 62 may include a stack of a plurality of kinds of insulating films. The insulating layer 62 may also include an organic insulating material. This insulating layer 62 is provided with plugs and electrodes. The plugs and the electrodes couple the electricity storage layer for red 310R to the red photoelectric conversion section 40R, couple the electricity storage layer for green 310G to the green photoelectric conversion section 40G, and couple the electricity storage layer for blue 310B to the blue photoelectric conversion section 40B.

The red photoelectric conversion section 40R includes the first electrode 41R, the organic photoelectric conversion layer 42R, and the second electrode 43R in this order from a position close to the silicon substrate 61. The green photoelectric conversion section 40G includes the first electrode 41G, the organic photoelectric conversion layer 42G, and the second electrode 43G in this order from a position close to the red photoelectric conversion section 40R. The blue photoelectric conversion section 40B includes the first electrode 41B, the organic photoelectric conversion layer 42B, and the second electrode 43B in this order from a position close to the green photoelectric conversion section 40G. An insulating layer 34 is provided between the red photoelectric conversion section 40R and the green photoelectric conversion section 40G. An insulating layer 35 is provided between the green photoelectric conversion section 40G and the blue photoelectric conversion section 40B. Red light (of wavelength of, for example, 600 nm inclusive to 700 nm exclusive), green light (of wavelength of, for example, 480 nm inclusive to 600 nm exclusive), and blue light (of wavelength of, for example, 400 nm inclusive to 480 nm exclusive) are selectively, absorbed by, respectively, the red photoelectric conversion section 40R, the green photoelectric conversion section 40G, and the blue photoelectric conversion section 40B, to thereby each generate an electron-hole pair.

The first electrodes 41R 41G, and 41B respectively extract the signal electric charges generated in the organic photoelectric conversion layers 42R, 42G, and 42B. The first electrodes 41R, 41G, and 41B are, for example, provided on the pixel-by-pixel basis. The first electrodes 41R, 41G, and 41B each include, for example, an electrically-conductive material having light-transmissivity, specifically, ITO. The first electrodes 41R 41G, and 41B may each include a tin-oxide-based material or a zinc-oxide-based material, for example. The tin-oxide-based material is tin oxide doped with a dopant. Examples of the zinc-oxide-based material include aluminum zinc oxide in which zinc oxide is doped with aluminum as a dopant, gallium zinc oxide in which zinc oxide is doped with gallium as a dopant, and indium zinc oxide in which zinc oxide is doped with indium as a dopant. Besides, for example, IGZO, CuI, InSbO$_4$, ZnMgO, CuInO$_2$, MgIn$_2$O$_4$, CdO, and ZnSnO$_3$ may be also used. A thickness of each of the first electrodes 41R, 41G, and 41B is, for example, 50 nm to 500 nm.

For example, electron transport layers may be provided between the first electrode 41R, and the organic photoelectric conversion layer 42R, between the first electrode 41G and the organic photoelectric conversion layer 42G, and between the first electrode 41B and the organic photoelectric conversion layer 42B. The electron transport layers promote supply of the electrons generated in the organic photoelectric conversion layers 42R, 42G, and 42B to the first electrodes 41R, 41G, and 41B. The electron transport layers include, for example, titanium oxide or zinc oxide. The electron transport layers may each include a stack of titanium oxide and zinc oxide. A thickness of each of the electron transport layers is, for example, 0.1 nm to 1000 nm, and preferably, 0.5 nm to 300 nm.

The organic photoelectric conversion layers 42R, 42G, and 42B each absorb light of a selective wavelength region to perform photoelectric conversion, and transmit light of other wavelength regions. The organic photoelectric conversion layers 42R, 42G, and 42B preferably include at least one kind out of the polycyclic aromatic compounds (the DTT derivative and the BDT-based derivative) represented by the general formula (1), the general formula (2), and the general formula (3) as mentioned in the forgoing first and second embodiments. Moreover, the organic photoelectric conversion layers 42R, 42G, and 42B preferably include both a p-type semiconductor and an n-type semiconductor. Preferably, one of the p-type semiconductor and the n-type semiconductor is a transparent material, while the other of the p-type semiconductor and the n-type semiconductor is a material that performs the photoelectric conversion of the light of the selective wavelength region. Here, the light of the selective wavelength region means light of a wavelength region of a wavelength of, for example, 600 nm inclusive to 700 nm exclusive for the organic photoelectric conversion layer 42R, light of a wavelength region of a wavelength of, for example, 480 nm inclusive to 600 nm exclusive for the organic photoelectric conversion layer 42G, and light of a wavelength region of a wavelength of, for example, 400 nm inclusive to 480 nm exclusive for the organic photoelectric conversion layer 42B. A thickness of each of the organic photoelectric conversion layers 42R, 42G, and 42B is, for example, 50 nm to 500 nm both inclusive.

The DTT derivative and the BDT-based derivative are preferably the transparent material as mentioned above. Specifically, the DTT derivative and the BDT-based derivative are each preferably devoid of the maximum absorption wavelength in the selective wavelength region in each of the organic photoelectric conversion layers 42R, 42G, and 42B. Moreover, the energy levels of the HOMOs and the LOMOs of the DTT derivative and the BDT-based derivative are preferably the levels at which the photoelectric conversion mechanism smoothly works with respect to other materials that constitute the organic photoelectric conversion layers 42R, 42G, and 42B. This is for purposes of the quick separation of the excitons generated in the organic photoelectric conversion layers 42R, 42G, and 42B by the light absorption, into the carriers, and furthermore, for purposes of the prompt movement of the carriers generated to, for example, the first electrodes 41R, 41G, and 41B. HOMO levels of the DTT derivative and the chalcogeno-acene-based compound in this embodiment are each preferably, for example, −6.6 eV to −4.8 eV both inclusive, and more preferably, −6.0 eV to −5.0 eV both inclusive.

Examples of such a DTT derivative include the compounds represented by the forgoing formulae (1-1) to (1-9). Examples of the BDT-based derivative include formulae (2-1) to (2-3), and (3-1) used in Examples described later.

The organic photoelectric conversion layers 42R, 42G, and 42B preferably uses, in addition to the forgoing DTT derivative or the BDT-based derivative, the above-mentioned material that performs the photoelectric conversion of the light of the selective wavelength region (light absorber). This makes it possible to allow the organic photoelectric conversion layers 42R, 42G, and 42B to selectively perform the photoelectric conversion of the red light, the green light, and the blue light, respectively. Examples of such a material include, for the organic photoelectric conversion layer 42R, subnaphthalocyanine or a derivative thereof represented by the following general formula (7), and phthalocyanine or a derivative thereof represented by the following formula (8). For the organic photoelectric conversion layer 42G, examples include the subphthalocyanine or a derivative thereof represented by the general formula (4) in the forgoing embodiment. For the organic photoelectric conversion layer 42B, examples include coumarine or a derivative thereof represented by the following general formula (9), and porphyrin or a derivative thereof represented by the following general formula (10).

[Chem. 21]

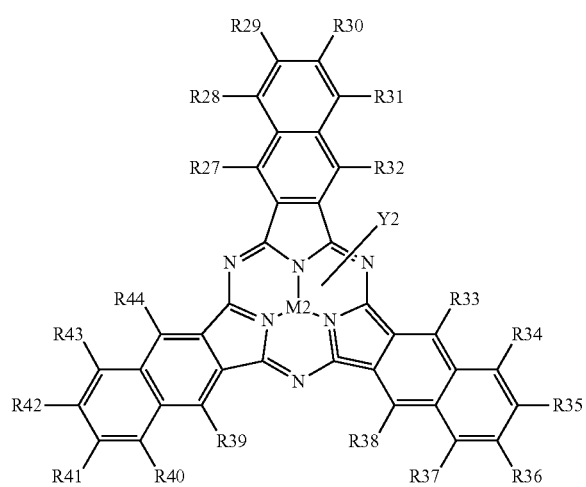

(7)

where R27 to 8441 are, each independently, selected from a group consisting of: hydrogen atom; halogen atom; linear, branched, or cyclic alkyl group; thioalkyl group; thioaryl group; arylsulfonyl group; alkylsafonyl group; amino group; alkylamino group; arylamino group; hydroxy group; alkoxy group; acylamino group; acyloxy group; phenyl group; carboxy group; carboxoamide group; carboalkoxy group; acyl group; sulfonyl group; cyano group; and nitro group. Moreover, any adjacent members from among R27 to R44 may be a portion of a condensed aliphatic ring or a condensed aromatic ring. The condensed aliphatic ring or the condensed aromatic ring may include one or more atoms other than carbon. M2 is boron, or a divalent or trivalent metal. Y2 is any substituent group selected from a group consisting of: halogen; hydroxy group; thiol group; imide group; substituted or unsubstituted alkoxy group; substituted or unsubstituted aryloxy group; substituted or unsubstituted alkyl group; substituted or unsubstituted alkylthio group; and substituted or unsubstituted arylthio group.

[Chem. 22]

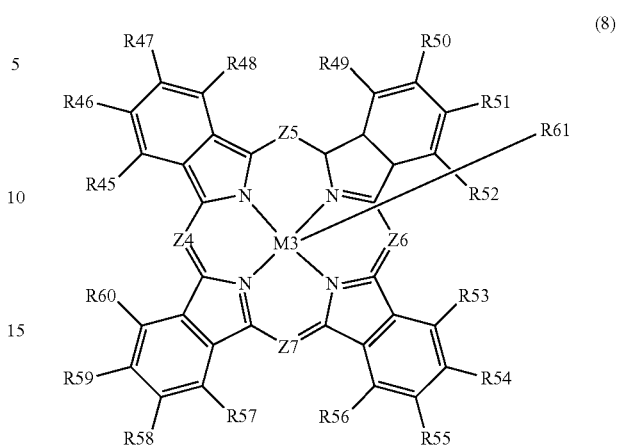

(8)

where R45 to R60 are, each independently: hydrogen atom; halogen atom; linear, branched, or cyclic alkyl group; aryl group; partial fluoroalkyl group; perfluoroalkyl group; silylalkyl group; silylalkoxy group; arylsilyl group; thioalkyl group; thioaryl group; arylsulfonyl group; alkylsulfonyl group; amino group; alkylamino group; arylamino group; hydroxy group; alkoxy group; acylamino group; acyloxy group; carboxy group; carboxoamide group; carboalkoxy group; acyl group; sulfonyl group; cyano group; and nitro group. Any adjacent members from among R45 to R60 may form a condensed aliphatic ring or a condensed aromatic ring by being bonded to each other. The condensed aliphatic ring or the condensed aromatic ring may include one or more atoms other than carbon. Z4 to Z7 are, each independently, a nitrogen atom. R61 is: hydrogen atom; halogen atom; linear, branched, or cyclic alkyl group; aryl group; partial fluoroalkyl group; perfluoroalkyl group; silylalkyl group; silylalkoxy group; arylsilyl group; thioalkyl group; thioaryl group; arylsulfonyl group; alkylsulfonyl group; amino group; alkylamino group; arylamino group; hydroxy group; alkoxy group; acylamino group; acyloxy group; carboxy group; carboxoamide group; carboalkoxy group; acyl group; sulfonyl group; cyano group; and nitro group. M3 is boron, or a divalent or trivalent metal.

[Chem. 23]

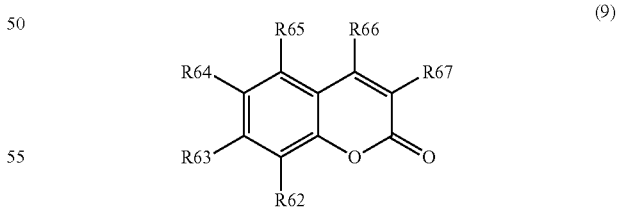

(9)

where R62 to R67 are, each independently: hydrogen atom; halogen atom; linear, branched, or cyclic alkyl group; aryl group; partial fluoroalkyl group; perfluoroalkyl group; silylalkyl group; silylalkoxy group; arylsilyl group; thioalkyl group; thioaryl group; arylsulfonyl group; alkylsulfonyl group; amino group; alkylamino group; arylamino group; hydroxy group; alkoxy group; acylamino group; acyloxy group; carboxy group; carboxoamide group; carboalkoxy group; acyl group; sulfonyl group; cyano group; and nitro group. Any adjacent members from among R62 to R67 may form a condensed aliphatic ring or a condensed aromatic ring by being bonded to each other. The condensed aliphatic ring or the condensed aromatic ring may include one or more atoms other than carbon.

[Chem. 24]

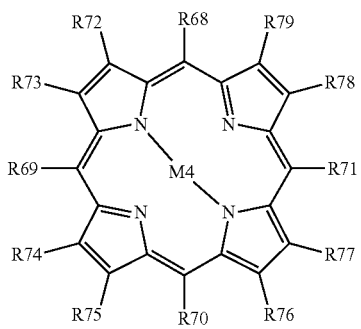

(10)

where R68 to R79 are, each independently: hydrogen atom; halogen atom; linear, branched, or cyclic alkyl group; aryl group; partial fluoroalkyl group; perfluoroalkyl group; silylalkyl group; silylalkoxy group; arylsilyl group; thioalkyl group; thioaryl group; arylsulfonyl group; alkylsulfonyl group; amino group; alkylamino group; arylamino group; hydroxy group; alkoxy group; acylamino group; acyloxy group; carboxy group; carboxoamide group; carboalkoxy group; acyl group; sulfonyl group; cyano group; and nitro group. Any adjacent members from among R68 to R79 may form a condensed aliphatic ring or a condensed aromatic ring by being bonded to each other. The condensed aliphatic ring or the condensed aromatic ring may include one or more atoms other than carbon. M4 is any one of: metal; metal halide; metal oxide; metal hydride; or two hydrogens.

Specific examples of a subnaphthalocyanine derivative include compounds represented by the following formulae (7-1) to (7-3). Specific examples of a phthalocyanine derivative include compounds represented by the following formulae (8-1) and (8-2).

[Chem. 25]

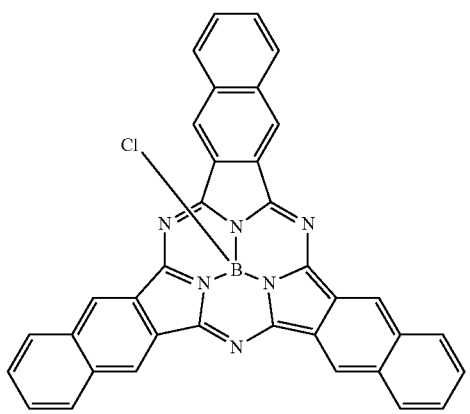

(7-1)

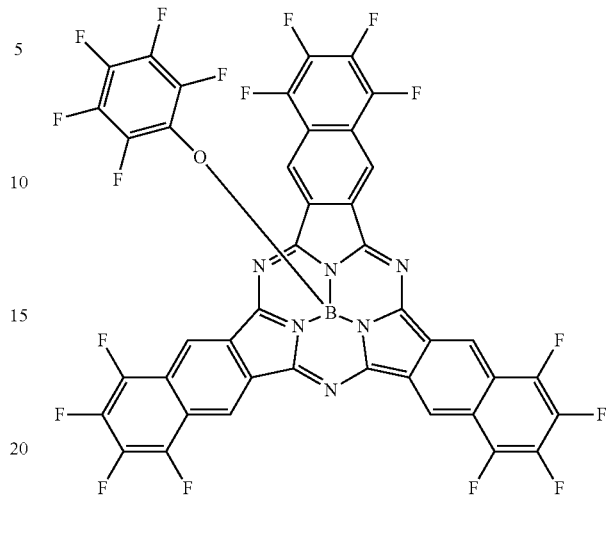

(7-2)

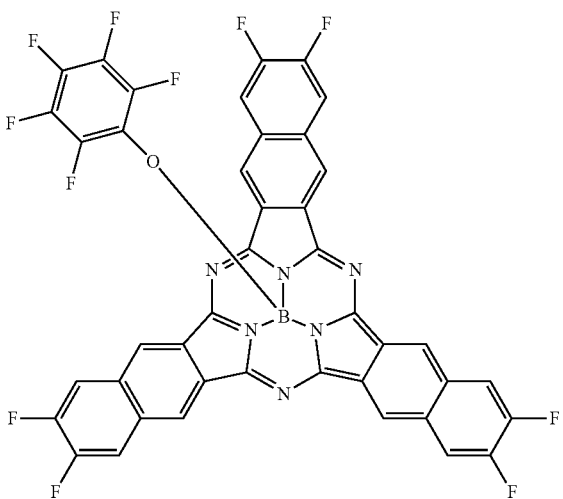

(7-3)

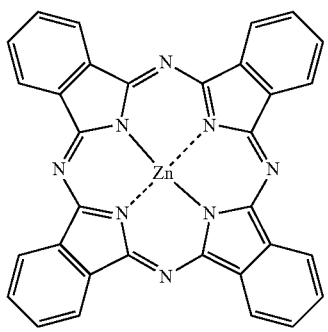

(8-1)

-continued (8-2)

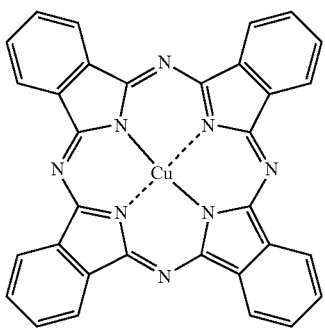

Specific examples of a coumarine derivative include compounds represented by the following formulae (9-1) and (9-2). Specific examples of a porphyrin derivative include compounds represented by the following formulae (10-1) and (10-2).

[Chem. 26]

(9-1)

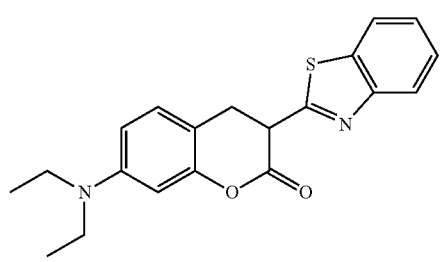

(9-2)

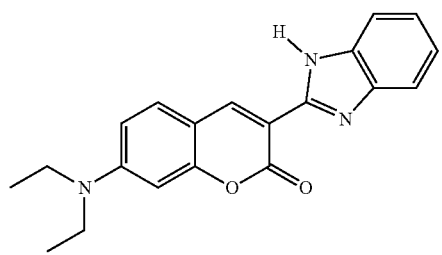

(10-1)

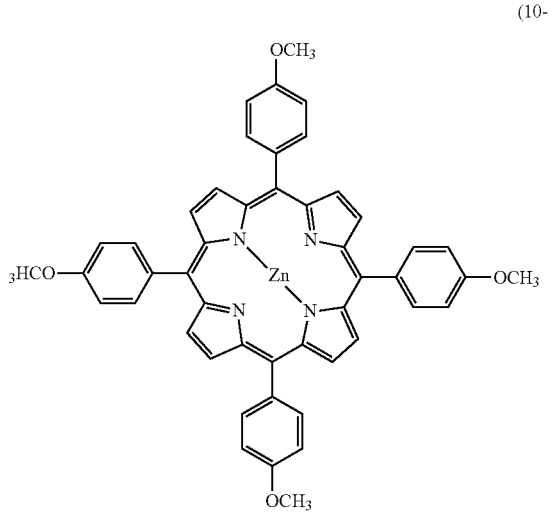

(10-2)

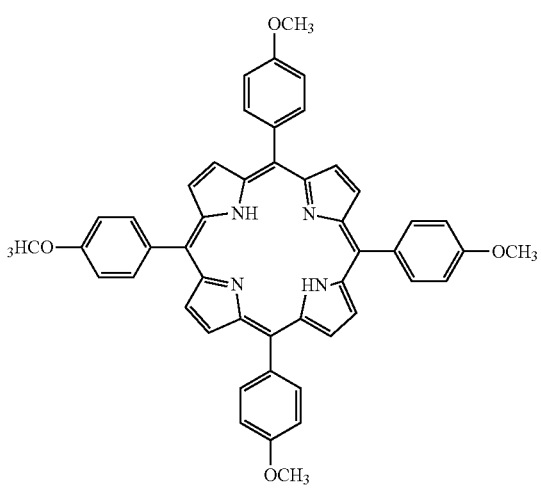

The organic photoelectric conversion layers 42R, 42G, and 42B, preferably, further use C60 fullerene or a derivative thereof represented by the forgoing general formula (5), or C70 fullerene or a derivative thereof represented by the forgoing general formula (6). Using at least one kind of C60 fullerene and C70 fullerene or their derivatives leads to the further enhancement in the photoelectric conversion efficiency as well as the reduction in the dark current.

It is to be noted that the polycyclic aromatic compounds (the DTT derivative or the BDT-based derivative), the subphthalocyanine or its derivative, the naphthalocyanine or its derivative, and the fullerenes or their derivatives as mentioned above function as the p-type semiconductor or the n-type semiconductor, depending on the material to be combined with.

For example, hole transport layers may be provided between the organic photoelectric conversion layer 42R and the second electrode 43R, between the organic photoelectric conversion layer 42G and the second electrode 43G, and between the organic photoelectric conversion layer 42B and the second electrode 43B. The hole transport layers promote supply of the holes generated in the organic photoelectric conversion layers 42R, 42G, and 42B to the second electrodes 43R, 43G, and 43B. The hole transport layers include, for example, molybdenum oxide, nickel oxide, or vanadium oxide. The hole transport layers may include an organic material such as PEDOT (Poly(3,4-ethylenedioxythiophene)) and TPD (N,N'-Bis(3-methylphenyl)-N, N-diphenylbenzidine). A thickness of each of the hole transport layers is, for example, 0.5 nm to 100 nm both inclusive.

The second electrodes 43R, 43G, and 43B respectively extract the holes generated in the organic photoelectric conversion layers 42R, 42G, and 42B. The holes extracted from the second electrodes 43R, 43G, and 43B are discharged to, for example, a p-type semiconductor region (undepicted) inside the silicon substrate 61 through their respective transmission paths (undepicted). The second electrodes 43R, 43G, and 43B include, for example, an electrically-conductive material such as gold, silver, copper, and aluminum. As with the first electrodes 41R, 41G, and 41B, the second electrodes 43R, 43G, and 43B may include a transparent electrically-conductive material. In the photoelectric conversion element 30, the holes extracted from the second electrodes 43R, 43G, and 43B are discharged. Accordingly, in a case where a plurality of the photoelectric conversion elements 30 are disposed in the solid-state imaging device 1 described later, the second electrodes 43R, 43G, and 43B may be provided in common to the photoelectric conversion elements 30 (unit pixels P). A thickness of each of the second electrodes 43R, 43G, and 43B is, for example, 0.5 nm to 100 nm both inclusive.

The insulating layer 44 insulates the second electrode 43R and the first electrode 41G. The insulating layer 45 insulates the second electrode 43G and the first electrode 41B. The insulating layers 44 and 45 include, for example, a metal oxide, a metal sulfide, or an organic substance. Examples of the metal oxide include silicon oxide, aluminum oxide, zirconium oxide, titanium oxide, zinc oxide, tungsten oxide, magnesium oxide, niobium oxide, tin oxide, and gallium oxide. Examples of the metal sulfide include zinc sulfide and magnesium sulfide. A bandgap of a constituent material of the insulating layers 44 and 45 is preferably equal to or larger than 3.0 eV. A thickness of each of the insulating layers 44 and 45 is, for example, 2 nm to 100 nm both inclusive.

The protective layer 19 that covers the second electrode 43B prevents water or other substances from intruding into the red photoelectric conversion section 30R, the green photoelectric conversion section 30G, and the blue photoelectric conversion section 30B. The protective layer 19 includes a material having light-transmissivity. For such a protective layer 19, used is, for example, a monolayer film such as silicon nitride, silicon oxide, and silicon oxynitride, or a stacked layer thereof.

The on-chip lens 22 is provided on the protective layer 19, with the planarization layer 21 being interposed therebetween. For the planarization layer 21, an acryl-based resin material, a styrene-based resin material, an epoxy-based resin material, or other materials may be used. The planarization layer 21 may be provided on an as-needed basis. The protective layer 19 may also serve as the planarization layer 21. The on-chip lens 22 causes light entering from above to converge on the light-receiving surface of each of the red photoelectric conversion section 30R, the green photoelectric conversion section 30G, and the blue photoelectric conversion section 30B.

As described above, the organic photoelectric conversion layers 42R(42G, and 42B) each include the DTT derivative or the BDT-based derivative. This makes it possible to quickly perform the separation of the exciton generated by the light absorption into the carriers, and the movement of the carriers to the electrodes, as with the forgoing embodiments. Hence, it is possible to enhance the photoelectric conversion efficiency.

4. APPLICATION EXAMPLES

Application Example 1

Figure 13:
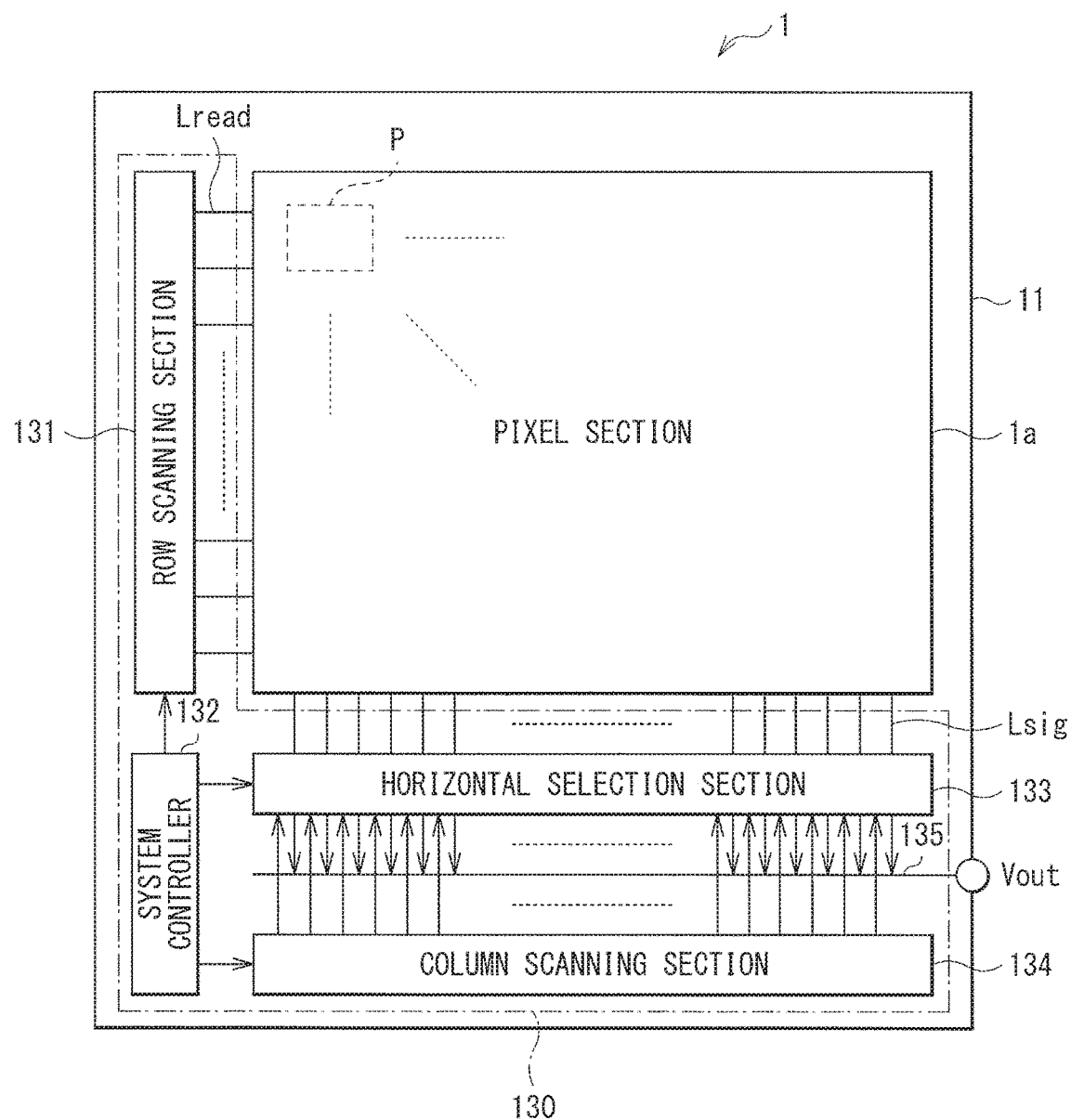
FIG. 13 is a functional block diagram of a solid-state imaging device using the photoelectric conversion element of the disclosure as a pixel.

FIG. 13 illustrates an overall configuration of the solid-state imaging device 1 that uses, as each pixel, the photoelectric conversion element 10A, 10B, or 30 described in the above-described embodiments. The solid-state imaging device 1 is a CMOS imaging sensor. The solid-state imaging device 1 includes, on the semiconductor substrate 11, a pixel section 1a as an imaging area, and a peripheral circuit section 130 in a peripheral region of the pixel section 1a. The peripheral circuit section 130 includes, for example, a row scanning section 131, a horizontal selection section 133, a column scanning section 134, and a system controller 132.

The pixel section 1a includes, for example, a plurality of the unit pixels P (equivalent to, for example, the photoelectric conversion elements 10A) that are two-dimensionally arranged in rows and columns. To the unit pixels P, for example, pixel drive lines Lread (specifically, row selection lines and reset control lines) are wired on a pixel-row basis, and the vertical signal lines Lsig are wired on a pixel-column basis. The pixel drive line Lread transmits a drive signal for signal reading from the pixel. One end of the pixel drive line Lread is coupled to an output terminal corresponding to each row of the row scanning section 131.

The row scanning section 131 is configured by, for example, a shift register and an address decoder. The row scanning section 131 is, for example, a pixel drive section that drives each of the unit pixels P in the pixel section 1a in units of rows. Signals outputted from the respective unit pixels P in the pixel row selected and scanned by the row scanning section 131 are supplied to the horizontal selection section 133 via the respective vertical signal lines Lsig. The horizontal selection section 133 is configured by, for example, an amplifier and a horizontal selection switch that are provided for each vertical signal line Lsig.

The column scanning section 134 is configured by, for example, a shift register and an address decoder. The column scanning section 134 sequentially drives each of the horizontal selection switches in the horizontal selection section 133, while scanning each of the horizontal selection switches in the horizontal selection section 133. The selection and the scanning by the column scanning section 134 causes the signals of the respective pixels that are transmitted via the respective vertical signal lines Lsig to be sequentially outputted to horizontal signal lines 135, and to be transmitted to the outside of the semiconductor substrate 11 through the horizontal signal lines 135.

A circuit part including the row scanning section 131, the horizontal selection section 133, the column scanning section 134, and the horizontal signal lines 135 may be formed directly on the semiconductor substrate 11, or may be provided in an external control IC. Alternatively, the circuit part may be formed on another substrate coupled by, for example, a cable.

The system controller 132 receives, for example, a clock and data that instructs an operation mode. The clock and the data are supplied from the outside of the semiconductor substrate 11. Moreover, the system controller 132 outputs data such as internal information of the solid-state imaging device 1. The system controller 132 further includes a timing generator that generates various timing signals, and performs drive control of peripheral circuits such as the row scanning section 131, the horizontal selection section 133, and the column scanning section 134 on the basis of the various timing signals generated by the timing generator.

Application Example 2

Figure 14:
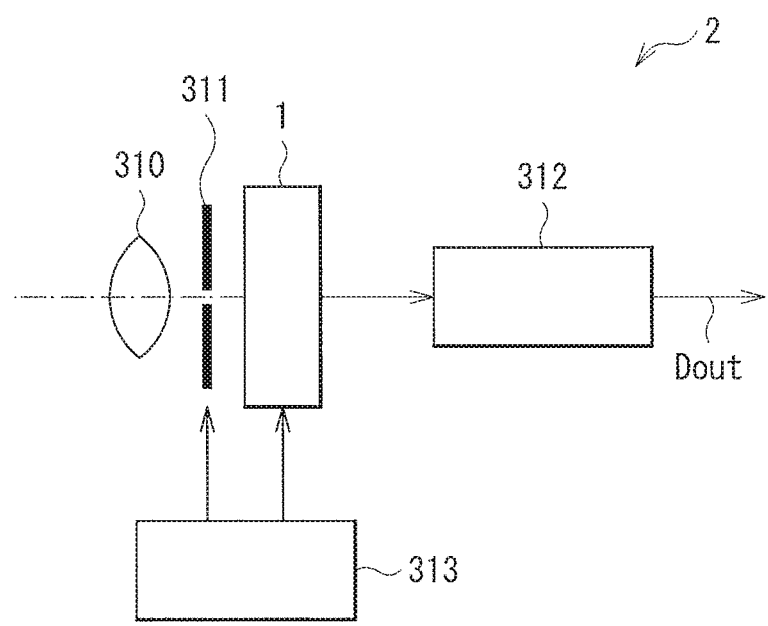
FIG. 14 is a block diagram of a schematic configuration of an electronic apparatus using the solid-state imaging device illustrated in FIG. 13.

The above-described solid-state imaging device 1 is applicable, for example, any type of electronic apparatus having an imaging function, e.g., a camera system such as a digital still camera and a video camera, and a mobile phone having the imaging function. FIG. 14 illustrates a schematic configuration of an electronic apparatus 2 (camera) as an example thereof. This electronic apparatus 2 is, for example, a video camera that is able to photograph a still image or a moving image. The electronic apparatus 2 includes the solid-state imaging device 1, an optical system (optical lens) 310, a shutter unit 311, a drive section 313 that drives the solid-state imaging device 1 and the shutter unit 311, and a signal processing section 312.

The optical system 310 guides image light (entering light) from a subject to the pixel section 1a of the solid-state imaging device 1. The optical system 310 may, include a plurality of optical lenses. The shutter device 311 controls a period in which the solid-state imaging device 1 is irradiated with light and a period in which the solid-state imaging device 1 is shielded against the light. The drive section 313 controls transfer operation of the solid-state imaging device 1 and shutter operation of the shutter unit 311. The signal processing section 312 performs various kinds of signal processing on a signal outputted from the solid-state imaging device 1. An image signal Dout after the signal processing is stored in a storage medium such as memory, or outputted to a monitor, for example.

Application Example 3

Applied Example to In-Vivo Information Acquisition System

Figure 15:
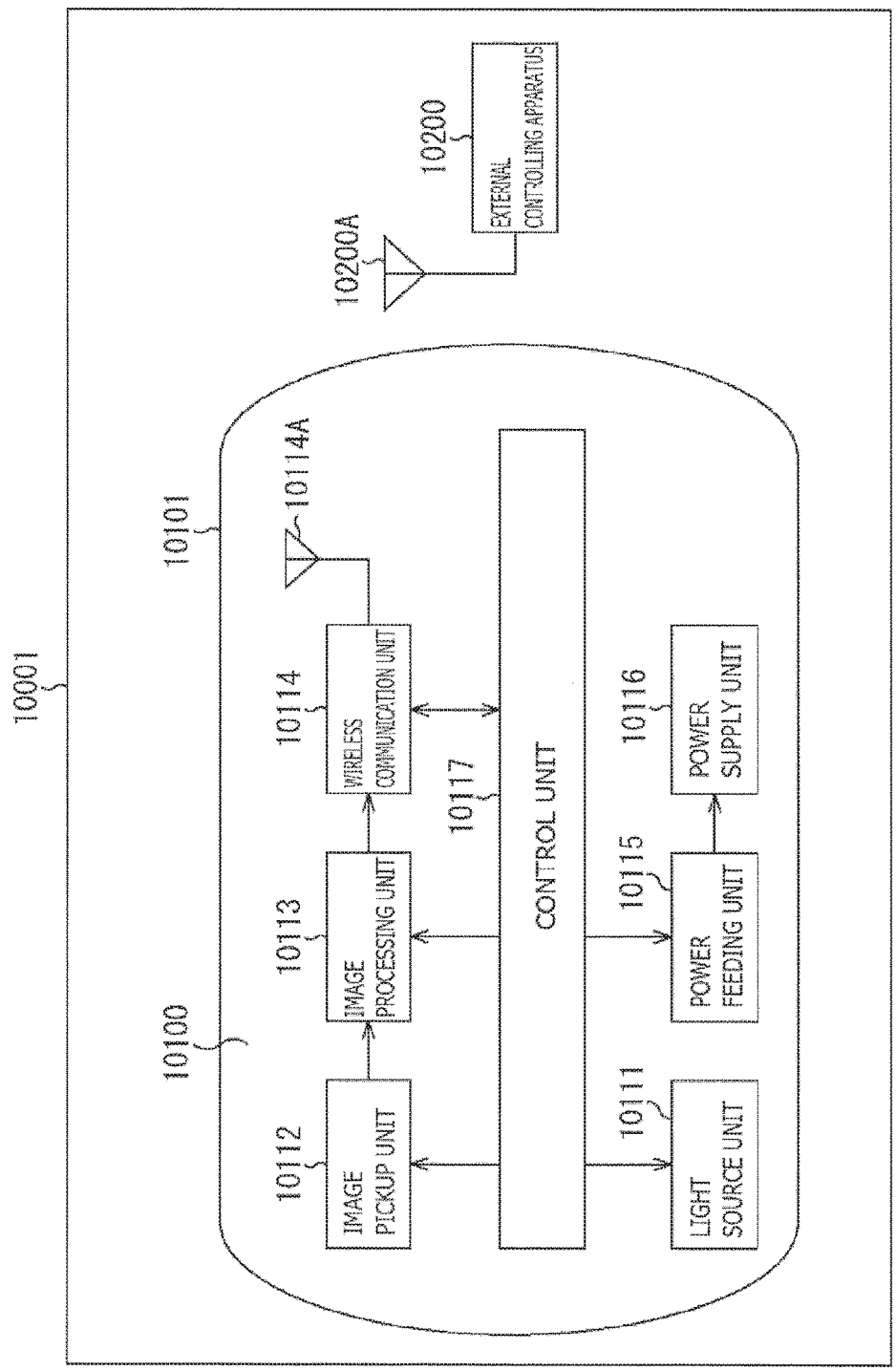
FIG. 15 is a block diagram depicting an example of a schematic configuration of an in-vivo information acquisition system.

FIG. 15 is a block diagram depicting an example of a schematic configuration of an in-vivo information acquisition system of a patient using a capsule type endoscope, to which the technology according to an embodiment of the present disclosure (present technology) be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 15, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

In the forgoing, described is an example of the in-vivo information acquisition system to which the technology according to the disclosure is applicable. The technology according to the disclosure is applicable to, for example, the image pickup unit 10112, in the configuration described above. This makes it possible to obtain a fine image of an operation part, leading to enhancement in precision of an examination.

Application Example 4

Applied Example to Mobile Body

The technology according to the disclosure (the technology) is applicable to various products. For example, the technology according to the disclosure implemented as a device to be mounted on any kind of mobile body such as an automobile, an electric vehicle, a hybrid electric vehicle, a motorcycle, a bicycle, a personal mobility, an airplane, a drone, a vessel, and a robot.

Figure 16:
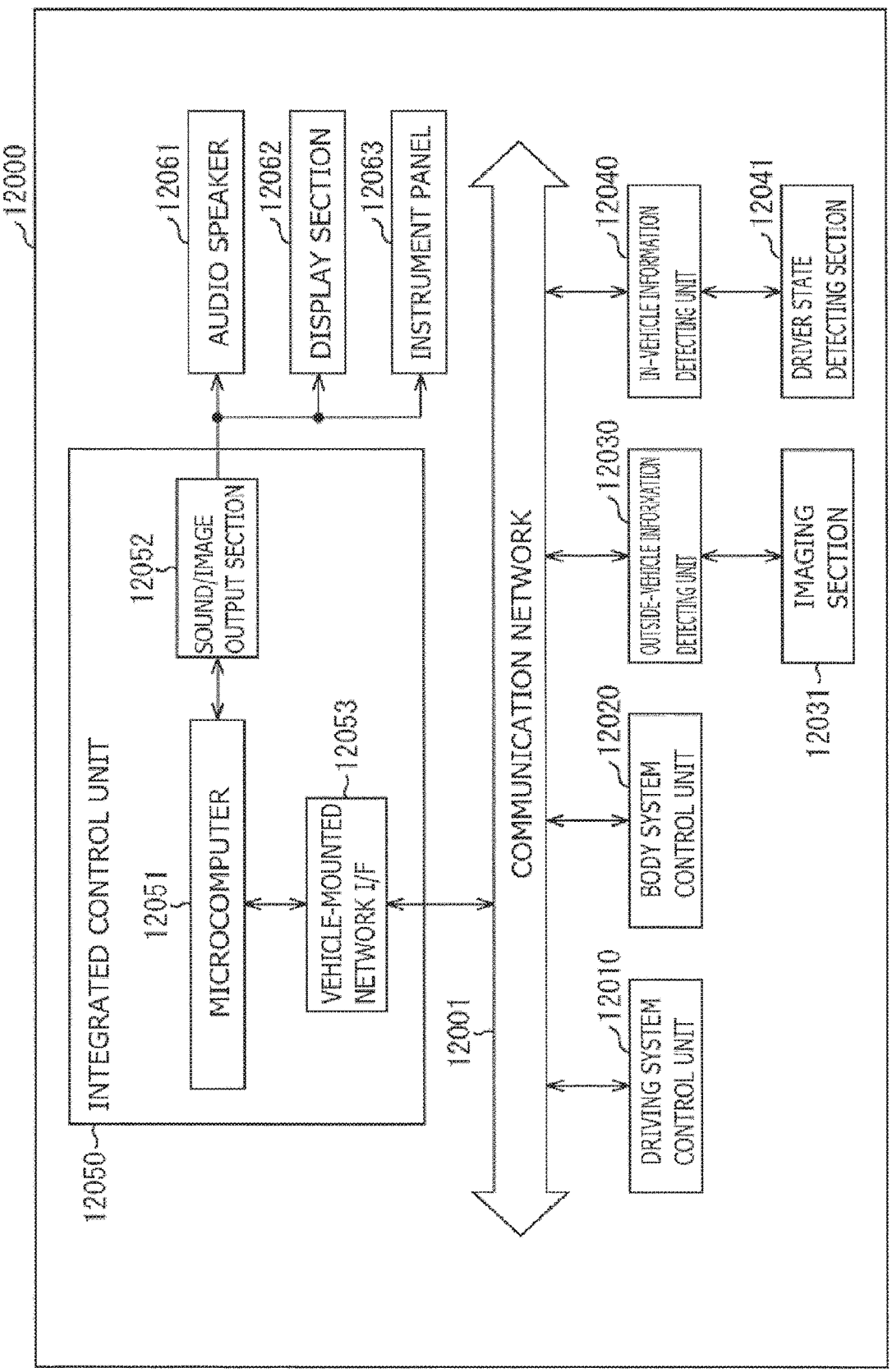
FIG. 16 is a block diagram depicting an example of schematic configuration of a vehicle control system.

FIG. 16 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 16, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

FIG. 17 is a diagram depicting an example of the installation position of the imaging section 12031.

In FIG. 17, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be a infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

5. EXAMPLES

Described next in detail are Examples of the disclosure.

(Experiment 1: Evaluation of Electrical Characteristics in a Case with the Use of DTT Derivative)

Experiment Example 1

First, a glass substrate with an ITO electrode as a bottom electrode was UV/ozone ($O_3$)-cleaned. Thereafter, the substrate was moved to an organic deposition chamber, and an inside of the chamber was decompressed to $1\times10^{-5}$ Pa or less. Thereafter, while rotating a substrate holder, sublimated and purified. BP-DTT (formula (1-2)) and sublimated and purified $F_6$-SubPc-$OC_6F_5$ (formula (4-1)) were deposited on the substrate by a resistive heating method, to a total of 120 nm, with deposition speeds each being maintained at 1 Å/sec. Thus, an organic photoelectric conversion layer was formed. At this occasion, a ratio of the deposition speeds of BP-DTT and $F_6$—SubPc-$OC_6F_5$ was 1:1. Thereafter, as a hole blocking layer, B4PyMPM (formula (11)) was formed into a film at a deposition speed of 0.5 Å/sec to a thickness of 5 nm. Thereafter, as a top electrode, an Al—Si—Cu alloy was deposited to form a film of a thickness of 100 nm. Thus, fabricated was a photoelectric conversion element (Experiment Example 1) including a photoelectric conversion region of 1 mm×1 mm

[Chem. 27]

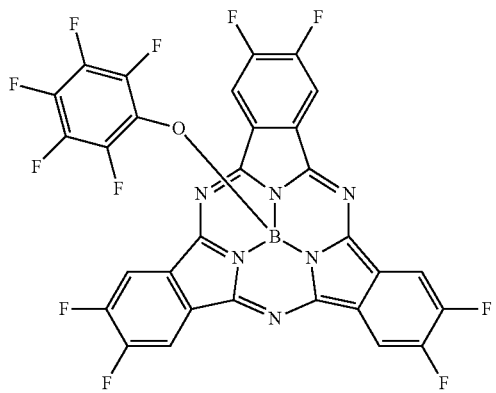

(4-1)

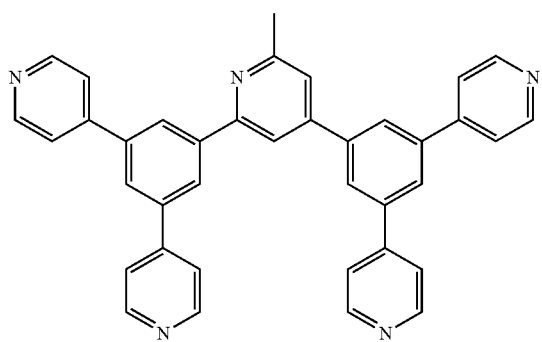

(11)

It is to be noted that BP-DTT (formula 1-2)) may be synthesized as follows.

[Chem. 28]

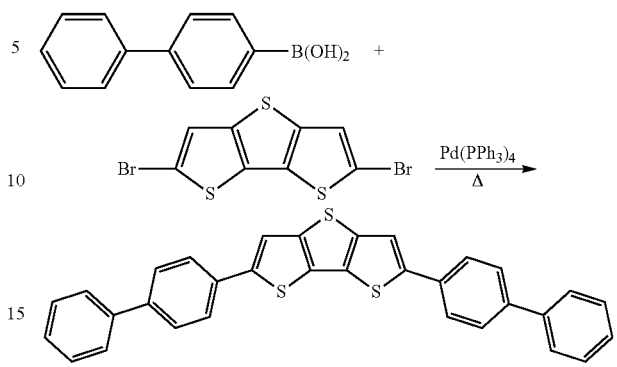

Experiment Examples 2 to 7

Besides, photoelectric conversion elements (Experiment Examples 2 to 4) were fabricated with the use of a similar method to Experiment Example 1 as described above, except for a thickness of the organic photoelectric conversion layer, and except that a constituent material of the organic photoelectric conversion layer was changed from BP-DTT to 2,9-tert-butylquinacridone (BQD) (formula (12)) or DNTT (dinaphtho[2,3-b:2',3'-f]thieno[3,2-b]thiophene, formula (13)). Moreover, photoelectric conversion elements (Experiment Examples 5 to 7) were fabricated to each of which C60 fullerene (formula (5-1)) was further added as the constituent material of the organic photoelectric conversion layer.

Experiment Examples 8 to 22

Furthermore, photoelectric conversion elements (Experiment Examples 8 to 21) were fabricated to each of which an electron blocking layer including αNPD (formula (14)) was added between the bottom electrode and the organic photoelectric conversion layer. Among them, in Experiment Examples 8, 11 to 13, and 15 to 19, and in Experiment Example 22, used was $F_6$-SubPc-$OC_6F_5$ (formula (4-1)) as a second component (light absorber). In Experiment Examples 9, 10, and 14, used was $F_6$-SubPc-F (formula (4-2)) as the second component. In Experiment Examples 20 and 21, used was SubNc-Cl (formula (7-1)) as the second component. Moreover, in Experiment Examples 10 and 15, as a first component, used was DP-DTT (formula (1-1)) instead of BP-DTT (formula (1-2)). In relation to Experiment Examples 11 to 19, and 21, added was C60 fullerene (formula (5-1)) as a third component. Furthermore, a photoelectric conversion element (Experiment Example was fabricated that included an organic photoelectric conversion layer including solely $F_6$-SubPc-$OC_6F_5$ and C60 fullerene.

[Chem. 29]

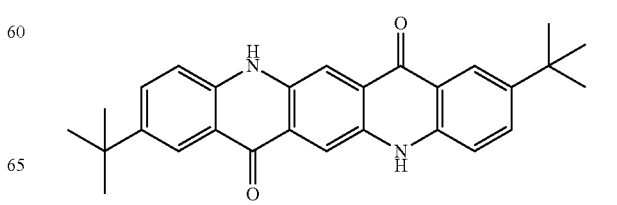

(12)

-continued (13)

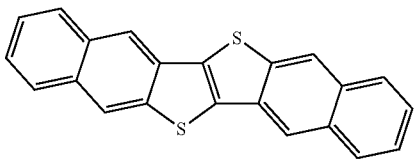

(5-1)

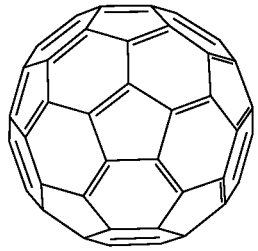

(4-2)

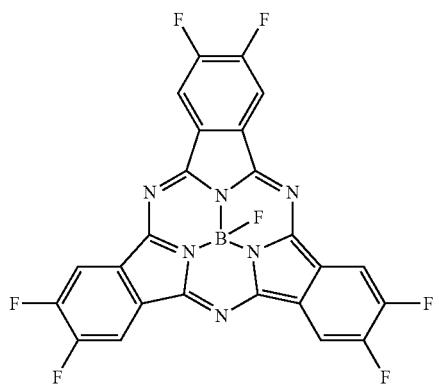

(14)

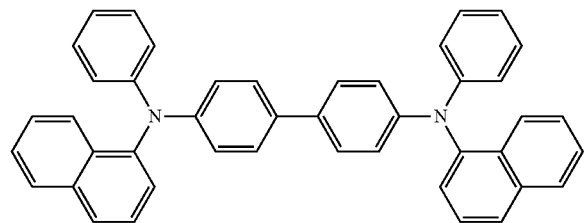

It is to be noted that DP-DTT (formula (1-1)) may be synthesized as follows.

[Chem. 30]

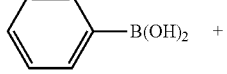

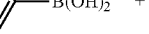

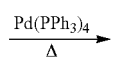

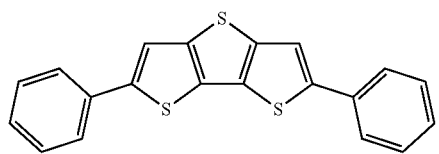

(1-1)

Photoelectric conversion efficiency (external quantum efficiency) of Experiment Examples 1 to 22 was evaluated with the use of a semiconductor parameter analyzer. Specifically, external photoelectric conversion efficiency was calculated from a light current value and a dark current value in a case where a light amount of light (LED light of a wavelength of 560 nm) sent out from a light source toward the photoelectric conversion element through a filter was 1.62 μW/cm$^2$, and where a bias voltage applied between the electrodes was −1 V. Table 1 summarizes a material configuration of each layer and electrical characteristics (external quantum efficiency (EQE) and dark current) of Experiment Examples 1 to 22. It is to be noted that in Experiment Examples 20 and 21, used was LED light of a wavelength of 600 nm.

TABLE 1

| | ELECTRON BLKG. L. | | PHOTOELEC. CONV. L. | | | | | HOLE BLKG. L. | | ELEC. CHAR. | |
|---|---|---|---|---|---|---|---|---|---|---|---|
| | MTL. | THK. (nm) | 1$^{ST}$ COMP. | 2$^{ND}$ COMP. | 3$^{RD}$ COMP. | RATIO (vol %) | THK. (nm) | MTL. | THK. (nm) | EQE (%) | DARK CUR. (A/cm$^2$) |
| EXP. EX. 1 | — | — | FML. (1-2) | FML. (4-1) | — | 50:50 | 120 | FML. (11) | 5 | 54 | 3 × 10$^{-8}$ |
| EXP. EX. 2 | — | — | FML. (1-2) | FML. (4-1) | — | 50:50 | 200 | FML. (11) | 5 | 83 | 1 × 10$^{-8}$ |
| EXP. EX. 3 | — | — | FML. (12) | FML. (4-1) | — | 50:50 | 120 | FML. (11) | 5 | 47 | 1 × 10$^{-8}$ |
| EXP. EX. 4 | — | — | FML. (12) | FML. (4-1) | — | 50:50 | 200 | FML. (11) | 5 | 38 | 0.9 × 10$^{-8}$ |
| EXP. EX. 5 | — | — | FML. (1-2) | FML. (4-1) | FML. (5-1) | 37.5:37.5:25 | 120 | FML. (11) | 5 | 77 | 2 × 10$^{-9}$ |
| EXP. EX. 6 | — | — | FML. (1-2) | FML. (4-1) | FML. (5-1) | 37.5:37.5:25 | 200 | FML. (11) | 5 | 75 | 3 × 10$^{-10}$ |
| EXP. EX. 7 | — | — | FML. (13) | FML. (4-1) | FML. (5-1) | 37.5:37.5:25 | 200 | — | — | 66 | 1 × 10$^{-8}$ |
| EXP. EX. 8 | FML. (14) | 5 | FML. (1-2) | FML. (4-1) | — | 50:50 | 200 | FML. (11) | 5 | 84 | 1 × 10$^{-9}$ |
| EXP. EX. 9 | FML. (14) | 5 | FML. (1-2) | FML. (4-2) | — | 50:50 | 200 | FML. (11) | 5 | 77 | 6 × 10$^{-8}$ |
| EXP. EX. 10 | FML. (14) | 5 | FML. (1-1) | FML. (4-2) | — | 50:50 | 200 | FML. (11) | 5 | 47 | 7 × 10$^{-8}$ |
| EXP. EX. 11 | FML. (14) | 5 | FML. (1-2) | FML. (4-1) | FML. (5-1) | 37.5:37.5:25 | 200 | FML. (11) | 5 | 84 | 2 × 10$^{-9}$ |
| EXP. EX. 12 | FML. (14) | 5 | FML. (1-2) | FML. (4-1) | FML. (5-1) | 50:25:25 | 200 | FML. (11) | 5 | 85 | 3 × 10$^{-9}$ |
| EXP. EX. 13 | FML. (14) | 5 | FML. (1-2) | FML. (4-1) | FML. (5-1) | 25:50:25 | 200 | FML. (11) | 5 | 59 | 1 × 10$^{-9}$ |
| EXP. EX. 14 | FML. (14) | 5 | FML. (1-2) | FML. (4-2) | FML. (5-1) | 37.5:37.5:25 | 200 | FML. (11) | 5 | 77 | 3 × 10$^{-8}$ |
| EXP. EX. 15 | FML. (14) | 5 | FML. (1-1) | FML. (4-1) | FML. (5-1) | 37.5:37.5:25 | 200 | FML. (11) | 5 | 55 | 2 × 10$^{-9}$ |
| EXP. EX. 16 | FML. (14) | 5 | FML. (1-2) | FML. (4-1) | FML. (5-1) | 70:5:25 | 200 | FML. (11) | 5 | 54 | 2 × 10$^{-8}$ |
| EXP. EX. 17 | FML. (14) | 5 | FML. (1-2) | FML. (4-1) | FML. (5-1) | 60:15:25 | 200 | FML. (11) | 5 | 84 | 3 × 10$^{-9}$ |
| EXP. EX. 18 | FML. (14) | 5 | FML. (1-2) | FML. (4-1) | FML. (5-1) | 60:20:20 | 200 | FML. (11) | 5 | 83 | 3 × 10$^{-9}$ |

TABLE 1-continued

| | ELECTRON BLKG. L. | | PHOTOELEC. CONV. L. | | | | HOLE BLKG. L. | | ELEC. CHAR. | |
|---|---|---|---|---|---|---|---|---|---|---|
| | MTL. | THK. (nm) | $1^{ST}$ COMP. | $2^{ND}$ COMP. | $3^{RD}$ COMP. | RATIO (vol %) | THK. (nm) MTL. | THK. (nm) | EQE (%) | DARK CUR. ($A/cm^2$) |
| EXP. EX. 19 | FML. (14) | 5 | FML. (1-2) | FML. (4-1) | FML. (5-1) | 40:40:20 | 200 FML. (11) | 5 | 84 | $3 \times 10^{-9}$ |
| EXP. EX. 20 | FML. (14) | 5 | FML. (1-2) | FML. (7-1) | — | 50:50 | 200 FML. (11) | 5 | 28 | $2 \times 10^{-8}$ |
| EXP. EX. 21 | FML. (14) | 5 | FML. (1-2) | FML. (7-1) | FML. (5-1) | 37.5:37.5:25 | 200 FML. (11) | 5 | 57 | $1.5 \times 10^{-9}$ |
| EXP. EX. 22 | — | — | — | FML. (4-1) | FML. (5-1) | 50:50 | 200 FML. (11) | 5 | 1.1 | $2 \times 10^{-10}$ |

The following was understood from Table 1. First, in relation to Experiment Examples 1 to 4, EQE, increased in Experiment Examples 1 and 2 that used the DTT derivative (BP-DTT, formula (1-2)) as a material of the organic photoelectric conversion layer, as compared to Experiment Examples 3 and 4 that used BQD (formula (12)) instead of BP-DTT. In particular, in Experiment Example 2 with the photoelectric conversion layer formed with a thickness of 200 nm, it was confirmed that EQE increased by twice or more, in comparison with Experiment Example 4 with the same thickness. Moreover, in Experiment Examples 5 and 6 of a so-called ternary system to each of which C60 fullerene was added to BP-DTT and $F_6$—SubPc-OC$_6$F$_5$ as the constituent material of the organic photoelectric conversion layer, the reduction in the dark current was confirmed in addition to the high EQE. In Experiment Example 7 with the use of DNTT (formula (13)) instead of BP-DTT, no reduction in the dark current was confirmed. Accordingly, it is supposed that the reduction in the dark current was caused by, at least, an interaction between BP-DTT and C60 fullerene. Moreover, in Experiment Examples 5 and 6, obtained was higher EQE than that of Experiment Example 7. One reason is as follows. As mentioned above, BP-DTT includes three S atoms in the condensed molecular skeleton, while DNTT includes two S atoms in the condensed molecular skeleton. BP-DTT is, therefore, considered to have a larger S . . . S interaction between molecules. Thus, in Experiment Example and Experiment Example 6 with the use of BP-DTT, generated was more optimal hole transportation than in Experiment Example 7, causing quick transportation of the hole generated by the electric charge separation to the electrode, which was supposed to be a reason for the high EQE.

Among Experiment Examples 8 to 10 in which the electron blocking layer was provided between the bottom electrode and the organic photoelectric conversion layer, and the organic photoelectric conversion layer had a binary-system configuration of the DTT derivative and $F_6$-SubPc-OC$_6$F$_5$ (or $F_6$—SubPc-F), Experiment Example 8 with the organic photoelectric conversion layer including BP-DTT and $F_6$—SubPc-OC$_6$F$_5$ exhibited a most preferable result regarding both the EQE and the dark current. Moreover, in relation to Experiment Example 9 with the organic photoelectric conversion layer including BP-DTT and $F_6$—SubPc-OC$_6$F$_5$ and Experiment Example 10 with the organic photoelectric conversion layer including BP-DTT and $F_6$—SubPc-F, Experiment Example 9 obtained higher EQE. One possible reason is stability of an aggregate body of the DTT derivative, and specifically, stability of arrangement of MT derivative molecules. DP-DTT, having a smaller length of a side chain of the condensed molecular skeleton than that of BP-DTT, is considered to have a larger aggregate force. Therefore, DP-DTT is supposed to have failed to be mixed sufficiently with $F_6$-SubPc-OC$_6$F$_5$ (or $F_6$—SubPc-F) and C60 which were mixed simultaneously, causing phase separation to be advanced. Thus, in Experiment Example 10, there was a decrease in area of an interface between different materials that caused the electric charge separation (interface between the DTT derivative and $F_6$—SubPc-OC$_6$F$_5$ (or $F_6$—SubPc-F)). As a result, efficiency in the electric charge separation lowered, which contributed to the lowered EQE than that of Experiment Example 9, In Experiment Examples 11 to 19 in which the electron blocking layer was provided between the bottom electrode and the organic photoelectric conversion layer, with the organic photoelectric conversion layer having the ternary-system configuration, the EQE and the dark current varied with a volume ratio of BP-DTT, $F_6$—SubPc-OC$_6$F$_5$, and C60 fullerene inside the organic photoelectric conversion layer, and with a combination of the DTT derivative and the subphthalocyanine derivative. From Experiment Examples 11 to 13 and Experiment Examples 16 to 19, it is supposed that a preferable ratio of the DTT derivative inside the photoelectric conversion layer be preferably 37.5 volume % to 60 volume % both inclusive from a viewpoint of the EQE. Both an excessively low ratio and an excessively high ratio cause a decrease in the EQE. This is possibly because the excessively low ratio causes a relative decrease in an ability of the electric charge separation of the DTT derivative, with respect to $F_6$-SubPc-OC$_6$F$_5$. The excessively high ratio causes a relative decrease in a pigment that absorbs light, $F_6$—SubPc-OC$_6$F$_5$, which possibly causes a hindrance in the light absorption.

Moreover, in comparison of Experiment Example 11 with Experiment Example 14, Experiment Example 11 with the use of $F_6$-SubPc-OC$_6$F$_5$ (formula (4-1)) obtained higher EQE and a lower dark current than those of Experiment Example 14 with the use of $F_6$-SubPc-F (formula (4-2)). It follows, therefore, that an aryloxy group (—OC$_6$F$_5$) is preferable to fluorine (F), as a substituent group X of the subphthalocyanine derivative. A reason is not clear, but $F_6$-SubPc-F (formula (4-2)) has higher planarity in a molecular shape than $F_6$-SubPc-OC$_6$F$_5$ (formula (4-1)) in which the X position is substituted by the aryloxy group. This causes a larger overlap of $F_6$-SubPc-F over $F_6$-SubPc-F, resulting in easier aggregation of $F_6$-SubPc-F alone. Thus, a mixture state with BP-DTT was deteriorated, resulting in a decrease in the interface for the electric charge separation.

In comparison of Experiment Example 11 with Experiment Example 15, Experiment Example 11 with the use of BP-DTT (formula (1-2)) exhibited higher EQE than that of Experiment Example 15 with the use of DP-DTT (formula (1-1)). A possible reason is as follows. Because DP-DTT had a higher aggregate characteristic than BP-DTT, DP-DTT failed in obtaining an ideal mixture state with $F_6$-SubPc-OC$_6$F$_5$. Thus, the phase separation advanced, resulting in the decrease in the interface at which the electric charge separation occurs.

Moreover, FIG. 18 illustrates an incident photon-to-current conversion efficiency (IPCE) spectrum (EQE for each wavelength) in a visible region of Experiment Example 1 (BP-DTT: $F_6$—SubPc-OC$_6$F$_5$=50:50 (volume ratio)). FIG.

19 illustrates the EQE in the visible region of the photoelectric conversion element including the organic photoelectric conversion layer (BP-DTT: $F_6$—SubPc-$OC_6F_5$: C60=41:41:18 (volume ratio, with a thickness of 110 nm)) as Experiment Example 23. By forming the organic photoelectric conversion layer by adding C60 to BP-DTT and $F_6$—SubPc-$OC_6F_5$, a sharper spectroscopic shape was obtained. This is possibly because the addition of C60 caused a change in a dispersion state (aggregate state) of the organic semiconductor material inside the organic photoelectric conversion layer. Specifically, a possible reason is homogenous dispersion of $F_6$-SubPc-$OC_6F_5$. Thus, it was understood that the organic photoelectric conversion layer was preferably formed with the ternary system of the DTT derivative, the light absorber, and C60.

It follows that the forgoing is not limited by a kind of the second component (light absorber), because similar results were obtained in Experiment Examples 20 and 21 that used, instead of $F_6$-SubPc-$OC_6F_5$ (formula (4-1)), the subnaphthalocyanine derivative (formula (7-1)) that absorbed the light of the wavelength region of red. It is to be noted that, although not described here, in relation to results of the EQE and the dark current in Experiment Examples 20 and 21, more optimal results were obtained than those of the photoelectric conversion element with the photoelectric conversion layer including solely the subnaphthalocyanine derivative (formula (7-1)) and C60 (formula (5-1)) without using the DTT derivative (BP-DTT) as the first component. (Experiment 2: Evaluation of Electrical Characteristics in a Case with the Use of BDT Derivative)

Experiment Example 24

First, a glass substrate with an ITO electrode as a bottom electrode was UV/ozone ($O_3$)-cleaned. Thereafter, the substrate was moved to the organic deposition chamber, and the inside of the chamber was decompressed to $1×10^{-5}$ Pa or less. Thereafter, while rotating the substrate holder, sublimated and purified BP-rBDT (formula)) and sublimated and purified $F_6$-SubPc-$OC_6F_5$ (formula (4-1)) were deposited on the substrate by the resistive heating method, to a total of 200 nm, with deposition speeds each being maintained at 1 Å/sec. Thus, an organic photoelectric conversion layer was formed. At this occasion, a ratio of the deposition speeds of BP-rBDT and $F_6$—SubPc-$OC_6F_5$ was 1:1. Thereafter, as a hole blocking layer, B4PyMPM (formula (11)) was formed into a film at a deposition speed of 0.5 Å/sec to a thickness of 5 nm. Thereafter, as a top electrode, an Al—Si—Cu alloy was deposited to form a film of a thickness of 100 nm. Thereafter, the film was heated at 150° C. for 60 minutes with the use of a hot plate under a nitrogen ($N_2$) atmosphere.

Thus, fabricated was a photoelectric conversion element (Experiment Example 24) including a photoelectric conversion region of 1 mm×1 mm.

It is to be noted that BP-rBDT (formula 2-2)) synthesized as follows.

[Chem. 31]

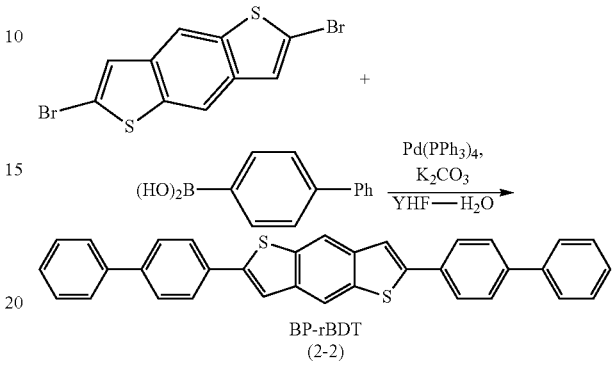

Experiment Examples 25 to 29

Besides, photoelectric conversion elements (Experiment Examples 25 to 29) were fabricated with the use of a similar method to that of forgoing Experiment Example 24, except that a constituent material of the organic photoelectric conversion layer, as the first component, was changed from BP-rBDT to BP-sBDT (formula (3-1); Experiment Example 25), TP-rBDT (formula (2-1); Experiment Example 26), mBP-rBDT (formula (2-3); Experiment Example 27), BP-DTT (formula (1-2); Experiment Example 28), and quinacridone (the following formula (15); Experiment Example 29).

[Chem. 32]

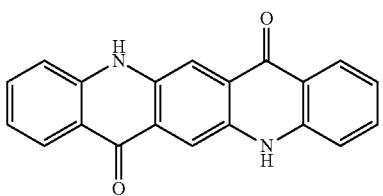

(15)

It is to be d that BP-sBDT (formula 3-1)), TP-rBDT (formula (2-1), and mBP-rBDT (formula (2-3)) may be synthesized as follows.

[Chem. 33]

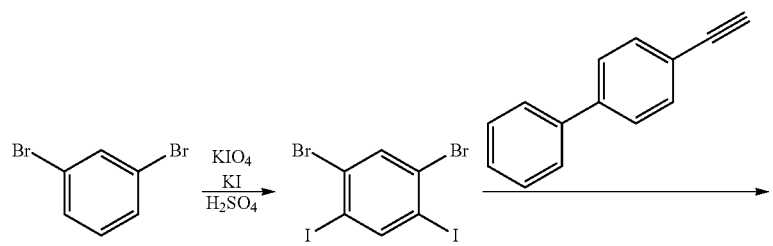

-continued

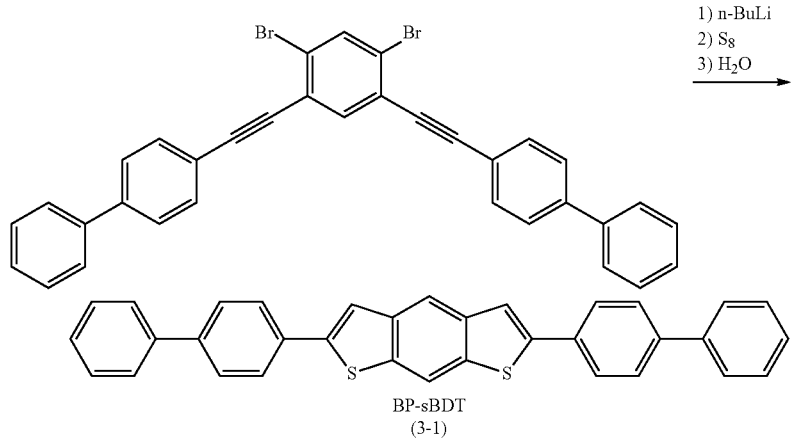

BP-sBDT
(3-1)

[Chem. 34]

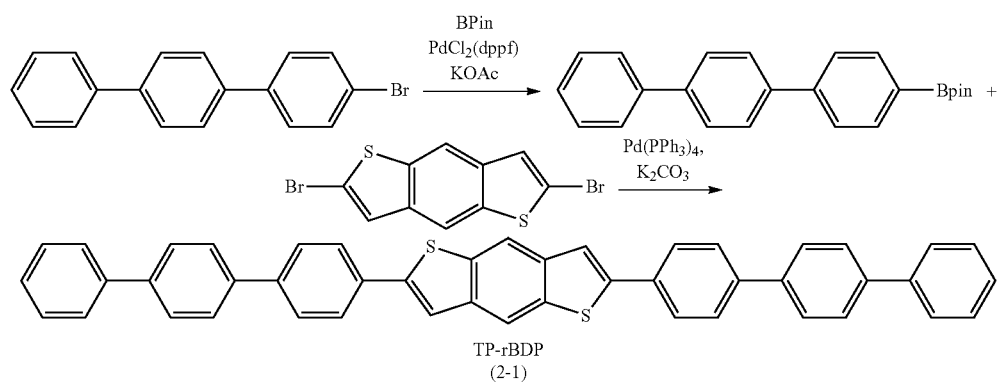

TP-rBDP
(2-1)

[Chem. 35]

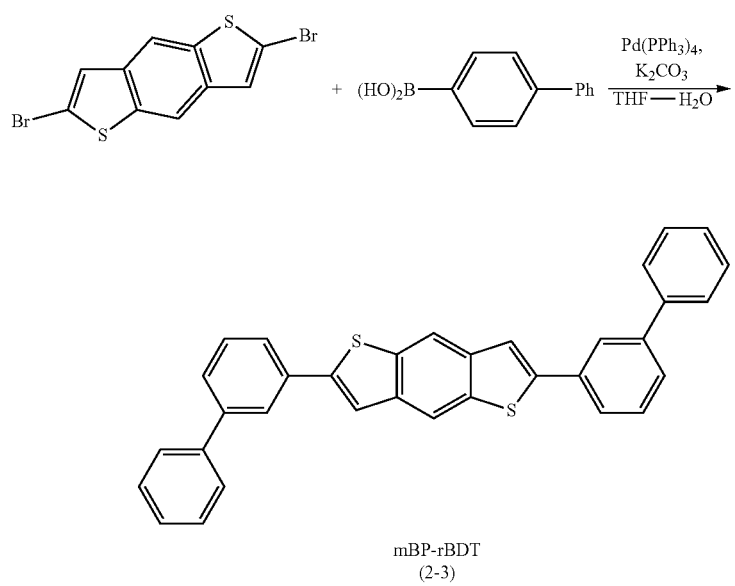

mBP-rBDT
(2-3)

Experiment Examples 30 to 35

Furthermore, photoelectric conversion elements Experiment Examples 30 to 35) were fabricated in which as to the constituent materials of the organic photoelectric conversion layer, C60 fullerene (formula (5-1)) was added as the third component, in addition to the materials used in forgoing Experiment Examples 24 to 29.

Measurement and evaluation of the photoelectric conversion efficiency (external quantum efficiency; EQE) and the dark current of Experiment Examples 24 to 35 were made with the use of a similar method to forgoing Experiment 1. Table 2 summarizes a material configuration of each layer and electrical characteristics (EQ and dark current) in Experiment Examples 24 to 35.

TABLE 2

| | PHOTOELEC. CONV. L. | | | | | ELEC. CHAR. | |
|---|---|---|---|---|---|---|---|
| | $1^{ST}$ COMP. | $2^{ND}$ COMP. | $3^{RD}$ COMP. | RATIO (vol %) | THK. (nm) | EQE (%) | DARK CUR. (A/cm$^2$) |
| EXP. EX. 24 | FML. (2-2) | FML. (4-1) | — | 50:50 | 200 | 88 | $3 \times 10^{-8}$ |
| EXP. EX. 25 | FML. (3-1) | FML. (4-1) | — | 50:50 | 200 | 86 | $1.2 \times 10^{-8}$ |
| EXP. EX. 26 | FML. (2-1) | FML. (4-1) | — | 50:50 | 200 | 88 | $9 \times 10^{-10}$ |
| EXP. EX. 27 | FML. (2-3) | FML. (4-1) | — | 50:50 | 200 | 20 | $2 \times 10^{-8}$ |
| EXP. EX. 28 | FML. (1-2) | FML. (4-1) | — | 50:50 | 200 | 83 | $3 \times 10^{-8}$ |
| EXP. EX. 29 | FML. (15) | FML. (4-1) | — | 50:50 | 200 | 38 | $0.9 \times 10^{-8}$ |
| EXP. EX. 30 | FML. (2-2) | FML. (4-1) | FML. (5-1) | 40:40:20 | 200 | 85 | $1 \times 10^{-10}$ |
| EXP. EX. 31 | FML. (3-1) | FML. (4-1) | FML. (5-1) | 40:40:20 | 200 | 86 | $5 \times 10^{-10}$ |
| EXP. EX. 32 | FML. (2-1) | FML. (4-1) | FML. (5-1) | 40:40:20 | 200 | 88 | $1 \times 10^{-10}$ |
| EXP. EX. 33 | FML. (2-3) | FML. (4-1) | FML. (5-1) | 40:40:20 | 200 | 29 | $4 \times 10^{-10}$ |
| EXP. EX. 34 | FML. (1-2) | FML. (4-1) | FML. (5-1) | 40:40:20 | 200 | 83 | $3 \times 10^{-9}$ |
| EXP. EX. 35 | FML. (15) | FML. (4-1) | FML. (5-1) | 40:40:20 | 200 | 50 | $1 \times 10^{-8}$ |

The following was understood from Table 2. First, EQE was significantly improved in Experiment Examples 24 to 26, and 30 to 32 that used the chalcogeno-acene-based compounds, as compared to Experiment Examples 29 and 35 that used QD in general use. A possible reason is a difference in hole mobility between QD and the chalcogeno-acene-based compounds.

In the organic photoelectric conversion layer in forgoing Experiment Examples 24 to 26, and 30 to 32, the subphthalocyanine derivative having a large light absorption coefficient α mainly absorbs light. The absorbed light generates an exciton in a grain of the subphthalocyanine derivative. The exciton reaches an interface between the grain of the subphthalocyanine derivative and a grain of QD, or between the grain of the subphthalocyanine derivative and a grain of the chalcogeno-acene-based compound. The exciton that has reached the interface performs the electric charge separation with the utilization of an energy difference, to generate carriers (hole and electron). QD or the BDT derivative takes on transportation of the hole, out of the carriers generated.

Measurement of the hole mobility of QD and the BDT derivative (BP-rBDT (formula (2-2)), BP-sBDT (formula (3-1), TP-rBDT (formula (2-1)) was made with the use of a space charge limited current (SCLC) method. The following results were obtained. A measurement method was as follows.

First, a glass substrate with a Pt electrode was UV/O$_3$-cleaned. Thereafter, the substrate was moved to the organic deposition chamber, and the inside of the chamber was decompressed to $1 \times 10^{-5}$ Pa or less. Thereafter, while rotating the substrate holder, MoO$_3$ was formed into a film of 0.8 nm at 0.3 Å/sec. Thereafter, sublimated and purified QD (or BP-rBDT, BP-sBDT, TP-rBDT) was deposited by the resistive heating method, to a total of 100 nm, with a deposition speed being maintained at 0.8 Å/sec. Thereafter, MoO$_3$ was formed into a film of 3 nm at 0.3 Å/sec. Thereafter, as a top electrode, Au was deposited to form a film of a thickness of 100 nm. Area of an organic film formed by the bottom electrode and the top electrode was 0.5 mm×0.5 mm. An I-V curve of a pixel obtained in a dark state was acquired. SCLC fitting was performed to obtain the hole mobility.

With the use of the method as mentioned above, the measurement of the hole mobility of QD and the BDT derivatives (BP-rBDT (formula (2-2)), BP-sBDT (formula (3-1), and TP-rBDT (formula (2-1)) was made. For QD, obtained was $10^{-5}$ cm$^2$/Vs. Meanwhile, for all the BDT derivatives, obtained were $10^{-4}$ cm$^2$/Vs or more, exhibiting a significantly high ability of the hole transportation. In a case with low carrier mobility, recombination of a hole and an electron that once separated is more likely to occur. It is, therefore, supposed that with the forgoing BDT derivatives, it was possible to obtain higher external quantum efficiency than that of QD.

Moreover, Experiment Examples 24 to 26, and 30 to 32 that used the BDT derivatives exhibited higher EQE than those of Experiment Examples 28 and 34 that used the DTT derivative (formula (1-2)).

It is to be noted that the HOMO levels of the BDT derivatives and the DTT derivatives were obtained as follows. First, the BDT derivatives and the DTT derivatives were each deposited on an ITO substrate to form a film of 30 nm. What was obtained was subjected to UPS measurement, to obtain an ionization potential that was considered to serve as the HOMO level. Moreover, a LUMO level of $F_6$-SubPc-OC$_6$F$_5$ was obtained as follows. First, the HOMO level of $F_6$-SubPc-OC$_6$F$_5$ was measured in a similar manner to the forgoing BDT derivatives and the DTT derivatives. Obtained was −6.5 eV. Moreover, an optical bandgap was obtained from an $F_6$-SubPc-OC$_6$F$_5$ thin film. Obtained was 2.0 eV. Thus, the LUMO level of $F_6$-SubPc-OC$_6$F$_5$ was estimated to be −4.5 eV.

It is to be noted that in Experiment Examples 27 and 33 that used mBP-rBDT (formula (2-3)), obtained was an excellent characteristic of the dark current, but the EQE was significantly low. This is possibly because mBP-rBDT, having a bending molecular shape and having difficulty in the packing of molecules, failed to grow into large grains; and ended up in becoming compatible with the subphthalocyanine derivative and the fullerene that were co-deposited. Without grains of certain degrees, the carriers (hole and electron) generated by the electric charge separation are promptly recombined and deactivated, before reaching the electrodes through the percolation paths. It follows, therefore, that R5, R6, R9, and R10 of the chalcogeno-acene-based compound represented by the general formula (2) and the general formula (3) as mentioned above are preferably what takes a linear molecular structure as a whole molecule (e.g., a biphenyl group, a terphenyl group, a telphenyl group, or a derivative thereof).

FIGS. 20 to 23 respectively illustrate IPCE spectra (EQE for each wavelength) in the visible region of Experiment Example 24 (FIG. 20), Experiment Example 30 (FIG. 21), Experiment Example 25 (FIG. 22), and Experiment Example 31 (FIG. 23). In Experiment Examples 24 and 25 with the organic photoelectric conversion layer having the binary system including the BDT derivatives and $F_6$-SubPc-OC$_6$F$_5$, obtained were IPCE spectra in the visible region that were equivalent to those of Experiment Examples 30 and 31 with the organic photoelectric conversion layer having the ternary system including the BDT derivatives, $F_6$—SubPc-$OC_6F_5$, and C60. In other words, it was understood that by forming the organic photoelectric conversion layer with the use of the BDT derivatives, a sharp spectroscopic shape was obtained even in a case with the organic photoelectric conversion layer of the binary system.

(Experiment 3: Comparison Between Biphenyl Group and Terphenyl Group)

Experiment Example 36

First, a glass substrate with an ITO electrode as a bottom electrode was UV/ozone ($O_3$)-cleaned. Thereafter, the submethod to that of forgoing Experiment Example 36, except that the constituent materials of the organic photoelectric conversion layer were changed from BP-DTT to TP-DTT (formula (1-11); Experiment Example 37), BP-rBDT (formula (2-2); Experiment Example 38), and TP-rBDT (formula (2-1); Experiment Example 39). Furthermore, photoelectric conversion elements Experiment Examples 40 to 43) were fabricated that had similar configurations to those of forgoing Experiment Examples 36 to 39 as mentioned above, except that C60 fullerene (formula (5-1)) used in forgoing Experiment Examples 36 to 39 was eliminated.

It is to be noted that TP-DTT (formula (1-11)) may be synthesized as follows.

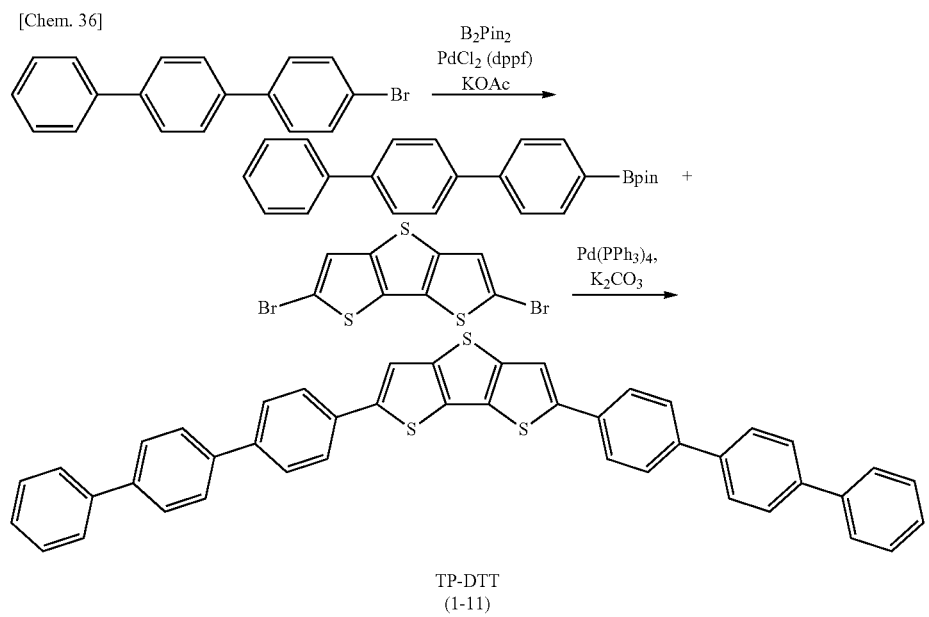

TP-DTT
(1-11)

strate was moved to the organic deposition chamber, and the inside of the chamber was decompressed to $1 \times 10^{-5}$ Pa or less. Thereafter, while rotating the substrate holder, sublimated and purified BP-DTT (formula (1-2)), sublimated and purified $F_6$-SubPc-$OC_6F_5$ (formula (4-1)), and C60 (formula (5-1)) were deposited on the substrate by the resistive heating method, to a total of 200 nm, with deposition speeds being maintained respectively at 0.8 Å/sec, 0.8 Å/sec, and 0.4 Å/sec. Thus, an organic photoelectric conversion layer was formed. At this occasion, a ratio of the deposition speeds of BP-DTT, and $F_6$—SubPc-$OC_6F_5$, and C60 was 2:2:1. Thereafter, as a hole blocking layer, B4PyMPM (formula (11)) was formed into a film at a deposition speed of 0.5 Å/sec to a thickness of 5 nm. Thereafter, as a top electrode, an Al—Si—Cu alloy was deposited to form a film of a thickness of 100 nm. Thus, fabricated was a photoelectric conversion element (Experiment Example 36) including a photoelectric conversion region of 1 mm×<1 mm.

Experiment Examples 37 to 43

Besides, photoelectric conversion elements (Experiment Examples 37 to 39) were fabricated with the use of a similar Evaluation of electrical characteristics (EQE, dark current, and responsiveness) of Experiment Examples 36 to 43 was made. In relation to the EQE and the dark current, measurement was made with the use of a similar method to forgoing Experiment 1. Evaluation of the responsiveness was made by measuring a speed at which the light current value observed during light irradiation with the use of the semiconductor parameter analyzer fell down after a stop of the light irradiation. Specifically, the light amount of the light sent out from the light source toward the photoelectric conversion element through filter was 1.62 μW/cm², while the bias voltage applied between the electrodes was −2.6 V. In this state, the steady-state current was observed, and thereafter, the light irradiation was stopped, to observe how the current attenuated. Thereafter, with area surrounded by a current-time curve and the dark current being set as a benchmark of 100%, time it takes for the area to become 3% was considered as an index of the responsiveness. Table 3 summarizes a material configuration of each layer and electrical characteristics (EQE, dark current, and responsiveness) Experiment Examples 36 to 43. It is to be noted that in relation to the responsiveness, relative values were given, with Experiment Example 43 serving as a reference (100).

TABLE 3

| | $1^{ST}$ COMP. | $2^{ND}$ COMP. | $3^{RD}$ COMP. | PHOTOELEC. CONV. L. RATIO (vol %) | THK. (nm) | ELEC. CHAR. EQE (%) | DARK CUR. (A/cm$^2$) | RESP. |
|---|---|---|---|---|---|---|---|---|
| EXP. EX. 36 | FML. (1-2) | FML. (4-1) | FML. (5-1) | 40:40:20 | 200 | 83 | $1 \times 10^{-8}$ | 6.6 |
| EXP. EX. 37 | FML. (1-11) | FML. (4-1) | FML. (5-1) | 40:40:20 | 200 | 87 | $1.8 \times 10^{-9}$ | 1.98 |
| EXP. EX. 38 | FML. (2-2) | FML. (4-1) | FML. (5-1) | 40:40:20 | 200 | 87 | $1 \times 10^{-10}$ | 0.6 |
| EXP. EX. 39 | FML. (2-1) | FML. (4-1) | FML. (5-1) | 40:40:20 | 200 | 88 | $7 \times 10^{-11}$ | 0.28 |
| EXP. EX. 40 | FML. (1-2) | FML. (4-1) | — | 50:50 | 200 | 54 | $9 \times 10^{-8}$ | 20 |
| EXP. EX. 41 | FML. (1-11) | FML. (4-1) | — | 50:50 | 200 | 88 | $4 \times 10^{-9}$ | 16 |
| EXP. EX. 42 | FML. (2-2) | FML. (4-1) | — | 50:50 | 200 | 86 | $3 \times 10^{-8}$ | 100 |
| EXP. EX. 43 | FML. (2-1) | FML. (4-1) | — | 50:50 | 200 | 88 | $0.9 \times 10^{-9}$ | 2.56 |

The following was understood from Table 3. As to BP-DTT (formula (1-2); Experiment Examples 36 and 40) and BP-rBDT (formula (2-2); Experiment Examples 38 and 42) including the biphenyl group at R1, R2, R5, and R6 in the general formula (1) and the general formula (2) as mentioned above, and as to TP-DTT (formula (1-1); Experiment Examples 37 and 41) and TP-rBDT (formula (2-1); Experiment Examples 39 and 43) including the terphenyl group, whichever used the DTT derivative or the BDT derivative including the terphenyl group obtained more optimal results, with respect to all of the EQE, the dark current, and the responsiveness.

This is possibly because the terphenyl group contributed to improvement in a packing characteristic of molecules, as compared to the biphenyl group, causing easier formation of grains with few crystal defects. It follows, therefore, that in the photoelectric conversion elements 10A and 10B according to the disclosure, among the general formula (1), the general formula (2), and the general formula (3) as mentioned above that constitute the organic photoelectric conversion layers 17 and 27, whichever is preferable in which R1, R2, R5, R6, R9, and R10 are each substituted by the terphenyl group, in particular, a p-terphenyl group.

(Experiment 4: Comparison Between Sulfur Substitution and Oxygen Substitution of BDT-Based Derivative)

First, a glass substrate with an ITO electrode as a bottom electrode was UV/ozone (O$_3$)-cleaned. Thereafter, the substrate was moved to the organic deposition chamber, and the inside of the chamber was decompressed to $1 \times 10^{-5}$ Pa or less. Thereafter, while rotating the substrate holder, sublimated and purified BP-rBDF (formula (7-1)), sublimated and purified. F$_6$—SubPc-OC$_6$F$_5$ (formula (4-1)), and C60 (formula (5-1)) were deposited on the substrate by the resistive heating method, to a total of 200 nm, with deposition speeds being maintained respectively at 0.8 Å/sec, 0.8 Å/sec, and 0.4 Å/sec. Thus, an organic photoelectric conversion layer was formed. At this occasion, a ratio of the deposition speeds of BP-rBDF, F$_6$-SubPc-OC$_6$F$_5$, and C60 was 2:21 Thereafter, as a hole blocking layer, B4PyMPM (formula (11)) was formed into a film at a deposition speed of 0.5 Å/sec to a thickness of 5 nm. Thereafter, as a top electrode, an Al—Si—Cu alloy was deposited to form a film of a thickness of 100 nm. Thus, fabricated was a photoelectric conversion element (Experiment Example 44) including a photoelectric conversion region of 1 mm×1 mm.

Experiment Example 45

A photoelectric conversion element (Experiment Example 45) was fabricated that had a similar configuration to that of forgoing Experiment Example 44, except that C60 fullerene (formula (5-1)) used in Experiment Example 44 was eliminated.

It is to be noted that BP-rBDF (formula (7-1)) may be synthesized as follows.

[Chem. 37]

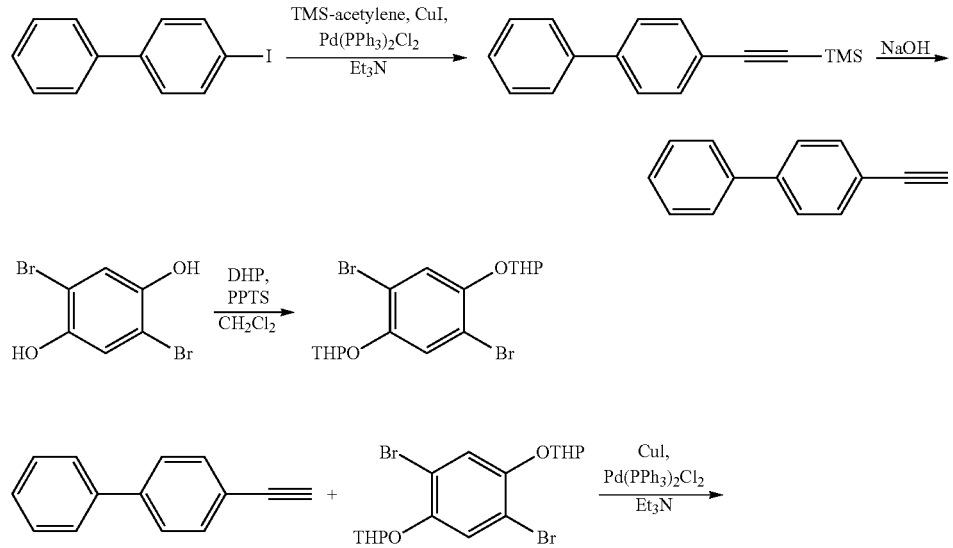

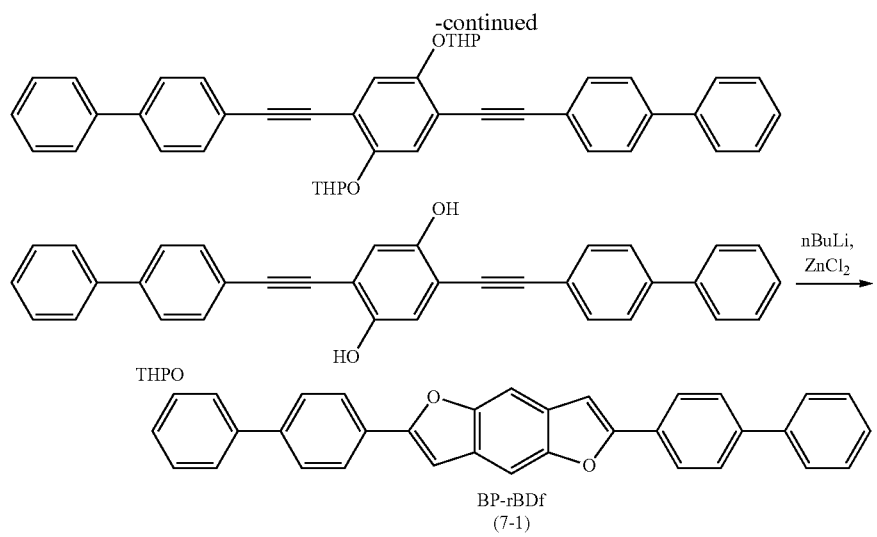

Evaluation of electrical characteristics (EQE, dark current, and responsiveness) of Experiment Examples 44 and 45 was made. In relation to the EQE and the dark current, measurement was made with the use of a similar method to forgoing Experiment 1. Evaluation of the responsiveness was made by measuring the speed at which the light current value observed during the light irradiation with the use of the semiconductor parameter analyzer fell down after the stop of the light irradiation. Specifically, the light amount of the light sent out from the light source t d the photoelectric conversion element through the filter was 1.62 µW/cm$^2$, while the bias voltage applied between the electrodes was −2.6 V. In this state, the steady-state current was observed, and thereafter, the light irradiation was stopped, to observe how the current attenuated. Thereafter, with the area surrounded by the current-time curve and the dark current being set as the benchmark of 100%, the time it takes for the area to become 3% was considered as the index of the responsiveness. Table 4 summarizes a material configuration of each layer and electrical characteristics (EQE, dark current, and responsiveness) Experiment Examples 44 and 45. It is to be noted that in relation to the responsiveness, relative values were given, with Experiment Example 43 serving as the reference (100).

45 that used BP-rBDF (formula (7-1)), a similar tendency to that of Experiment Example 44 was found, as compared to Experiment Example 39 that used BP-rBDT (formula (2-2)).

As to why BP-rBDF (formula (7-1)) including oxygen (O) as the chalcogen element obtained the higher-speed responsiveness than BP-rBDT (formula (2-2)) including sulfur (S) as the chalcogen element, one example was reported by Non-Patent Literature (J. Am. Chem. Soc. 2012, 134, 5448?5451). That is, because an oxygen atom is smaller in an ionic radius than a sulfur atom, an inter-molecular distance in an arrangement of molecules becomes smaller. As a result, a transfer integral between molecules becomes higher, which possibly caused higher mobility. Actually, measurement of the hole mobility of the photoelectric conversion elements of Experiment Examples 38, 42, 44, and 45 was made, by the SCLC method as mentioned above. BP-rBDF (Experiment Examples 44 and 45) exhibited the mobility twice to five times as high as that of corresponding BP-rBDT (Experiment Examples 39 and 42). It follows, from the forgoing, that from a viewpoint of the responsiveness, BP-rBDF (formula (7-1)) including oxygen (O) as the chalcogen element is more optimal than BP-rBDT (formula (2-2)) including sulfur (S) as the chalcogen element.

TABLE 4

| | PHOTOELEC. CONV. L. | | | | | ELEC. CHAR. | |
| --- | --- | --- | --- | --- | --- | --- | --- |
| | $1^{ST}$ COMP. | $2^{ND}$ COMP. | $3^{RD}$ COMP. | RATIO (vol %) | THK. (nm) | EQE (%) | DARK CUR. (A/cm$^2$) | RESP. |
| EXP. EX. 38 | FML. (2-2) | FML. (4-1) | FML. (5 1) | 40:40:20 | 200 | 87 | $1 \times 10^{-10}$ | 0.6 |
| EXP. EX. 44 | FML. (7-1) | FML. (4-1) | FML. (5-1) | 40:40:20 | 200 | 80 | $7 \times 10^{-9}$ | 0.14 |
| EXP. EX. 42 | FML. (2-2) | FML. (4-1) | — | 50:50 | 200 | 86 | $3 \times 10^{-8}$ | 100 |
| EXP. EX. 45 | FML. (7-1) | FML. (4-1) | — | 50:50 | 200 | 81 | $4 \times 10^{-8}$ | 40 |

The following was understood from comparison between Experiment Examples 38 and 44, and comparison between Experiment Examples 42 and 45. In Experiment Example 44 that used BP-rBDF (formula (7-1)) including oxygen (O) as the chalcogen element, obtained were EQE of an equivalent level to, a slightly higher dark current than, and higher-speed responsiveness than, those of Experiment Example 39 that used BP-rBDT (formula (2-2)) including sulfur (S) as the chalcogen element. Likewise, also in Experiment Example Although description has been made by giving the first and second embodiments, the modification example, and Examples as mentioned above, the contents of the disclosure are not limited to the above-mentioned example embodiments and may be modified in a variety of ways. For example, in the forgoing first embodiment, the photoelectric conversion element has the configuration in which the organic photoelectric conversion section 11G that detects the green light, the inorganic photoelectric conversion sections 11B and 11R that respectively detect the blue light and the red light are stacked. However, the contents of the disclosure are by no means limited to such a structure. In other words, an organic photoelectric conversion section may detect the red light or the blue light. An inorganic photoelectric conversion section may detect the green light.

Moreover, the number of organic photoelectric conversion sections, the number of inorganic photoelectric conversion sections, and a ratio thereof are not limitative as well. Two or more organic photoelectric conversion sections may be provided, or color signals of a plurality of colors may be obtained only by the organic photoelectric conversion sections. Furthermore, the organic photoelectric conversion section and the inorganic photoelectric conversion section are not limited to have a vertically-stacked structure, and may be arranged side by side along a substrate surface.

Moreover, the foregoing example embodiments exemplify the configuration of the solid-state imaging device of the backside illumination type; however, the contents of the disclosure are also applicable to a solid-state imaging device of a front side illumination type. Further, the photoelectric conversion element of the disclosure does not have to include all of the constituent elements described in the foregoing embodiments, and may include any other layer, conversely.

It is to be noted that the effects described herein are merely illustrative and non-limiting. Effects to be achieved by the disclosure may be other effects than those described above, or may further include other effects in addition to those described above.

It is to be noted that the disclosure may have the following configurations.

[1]

A photoelectric conversion element including:

a first electrode and a second electrode that are disposed to face each other; and a photoelectric conversion layer that is provided between the first electrode and the second electrode, and contains at least one kind of polycyclic aromatic compound represented by any one of the following general formula (1), the following general formula (2), and the following general formula (3):

[Chem. 1]

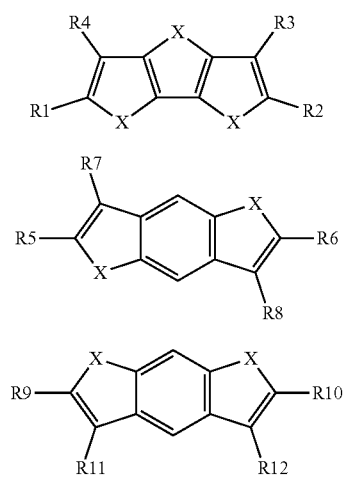

where X is any one of oxygen (O), sulfur (S), selenium (Se), and tellurium (Te). R1 to R12 are, each independently: hydrogen atom; halogen atom; linear, branched, or cyclic alkyl group; aryl group; or a derivative thereof. Any adjacent members from among R1 to R12 may form a condensed aliphatic ring or a condensed aromatic ring by being bonded to each other. The condensed aliphatic ting or the condensed aromatic ring may contain one or more atoms of nitrogen (N), sulfur (S), selenium (Se), and tellurium (Te).

[2]

The photoelectric conversion element according to [1], in which the aryl group is: phenyl group; biphenyl group; triphenyl group; terphenyl group; stilbene group; naphthyl group; anthracenyl group; phenanthrenyl group; pyrenyl group; perylenyl group; tetracenyl group: chrycenyl group; fluorenyl group; acenaphthacenyl group; triphenylene group; fluoranthene group; or a derivative thereof, each of which has a carbon number of 6 to 60 both inclusive.

[3]

The photoelectric conversion element according to [1] or [2], in which R1, R2, R5, R6, R9, and R10 are, each independently: biphenyl group; terphenyl group; terphenyl group; or a derivative thereof.

[4]

The photoelectric conversion element according to any one of [1] to [3], which R3, R4, R7, R8, R11, and R12 are each a hydrogen atom.

[5]

The photoelectric conversion element according to any one of [1] to [4], in which the photoelectric conversion layer contains an organic semiconductor material having a maximum absorption wavelength in a wavelength region of 500 nm to 600 nm both inclusive.

[6]

The photoelectric conversion element according to [5], in which the organic semiconductor material contains at least one kind of subphthalocyanine or a subphthalocyanine derivative.

[7]

The photoelectric conversion element according to any one of [1] to [6], in which the photoelectric conversion layer further contains at least one kind of C60 fullerene or a derivative thereof or C70 fullerene or a derivative thereof.

[8]

The photoelectric conversion element according to any one of [1] to [7], in which a HOMO level of the polycyclic aromatic compound is −6.6 eV to −4.8 eV both inclusive.

[9]

The photoelectric conversion element according to any one of [1] to [8], in which the polycyclic aromatic compound contained in the photoelectric conversion layer is 37.5% to 60% both inclusive by volume ratio.

[10]

A solid-state imaging device in hick pixels each include one or more organic photoelectric conversion sections, the organic photoelectric conversion sections each including:

a first electrode and a second electrode that are disposed to face each other; and a photoelectric conversion layer that is provided between the first electrode and the second electrode, and contains at least one kind of polycyclic aromatic compound represented by any one of the following general formula (1), the following general formula (2), and the following general formula (3):

[Chem. 2]

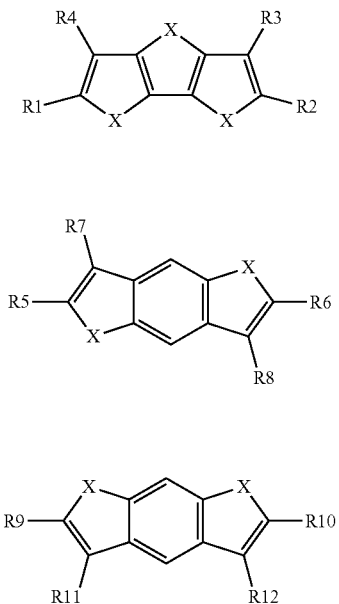

where X is any one of oxygen (O), sulfur (S), selenium (Se), and tellurium (Te). R1 to R12 are, each independently: hydrogen atom; halogen atom; linear, branched, or cyclic alkyl group; aryl group; or a derivative thereof. Any adjacent members from among R1 to R12 may form a condensed aliphatic ring or a condensed aromatic ring by being bonded to each other. The condensed aliphatic ring or the condensed aromatic ring may contain one or more atoms of nitrogen (N), sulfur (S), selenium (Se), and tellurium (Te).

[11]

The solid-state imaging device according to [10], in which, in each of the pixels, the one or more organic photoelectric conversion sections and one or more inorganic photoelectric conversion sections are stacked, the one or more inorganic photoelectric conversion sections performing photoelectric conversion of a different wavelength region from the organic photoelectric conversion sections.

[12]

The solid-state imaging device according to [11], in which the inorganic photoelectric conversion section is formed to be embedded inside a semiconductor substrate, and the organic photoelectric conversion section is provided on first-surface side of the semiconductor substrate.

[13]

The solid-state imaging device according to [12], in which a multi-layer wiring layer is formed on second-surface side of the semiconductor substrate.

[14]

The solid-state imaging device according to [12] or [13], in which the organic photoelectric conversion section performs photoelectric conversion of green light, and the inorganic photoelectric conversion section that performs photoelectric conversion of blue light and the inorganic photoelectric conversion section that performs photoelectric conversion of red light are stacked inside the semiconductor substrate.

[15]

The solid-state imaging device according to any one of [10] to [14], in which, in each of the pixels, plurality of the organic photoelectric conversion sections are stacked, the plurality of the organic photoelectric conversion sections performing photoelectric conversion of different wavelength regions from one another.

This application is based upon and claims priority from Japanese Patent Application Nos. 2016-051022 filed with the Japan Patent Office on Mar. 15, 21316 and 2016-219444 filed with the Japan Patent Office on Nov. 10, 2016, and International Application PCT/JP2017/001354 filed with the Japan Patent Office as a receiving office on Jan. 17, 2017, the entire contents of each of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion element, comprising:
   a first electrode and a second electrode that are disposed to face each other; and
   a photoelectric conversion layer that is provided between the first electrode and the second electrode, and contains at least one kind of polycyclic aromatic compound represented by any one of a following general formula (2), and a following general formula (3):

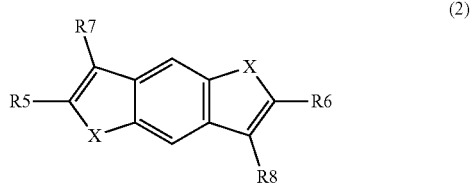

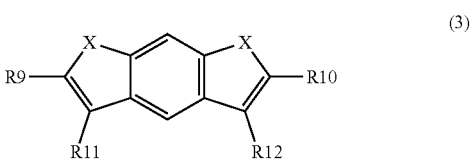

where X is any one of oxygen (O), sulfur (S), selenium (Se), and tellurium (Te);
wherein R7, R8, R11 and R12 are each a hydrogen atom,
wherein R5, R6, R9, and R10 are each independently: a biphenyl group; a terphenyl group; a telphenyl group; or a derivative thereof, each of which has a structure in which two or more phenyl groups are covalent-bonded to one another with a single bond at their para-positions,
wherein the photoelectric conversion layer contains an organic semiconductor material comprising at least one kind of subphthalocyanine or a subphthalocyanine derivative,
wherein the at least one kind of subphthalocyanine or a subphthalocyanine derivative is represented by the following formula (4-1):

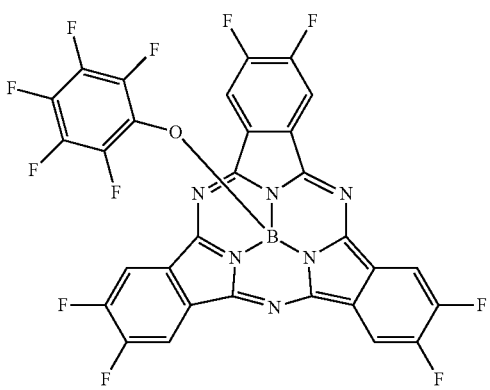

wherein the second electrode is provided above a top portion and around side portions of the photoelectric conversion layer,
wherein the photoelectric conversion layer is a bulk hetero layer, and
wherein the bulk hetero layer comprises at least one of a crystal grain of the at least one kind of polycyclic compound.

2. The photoelectric conversion element according to claim 1, wherein the photoelectric conversion layer contains an organic semiconductor material having a maximum absorption wavelength in a wavelength region of 500 nm to 600 nm both inclusive.

3. The photoelectric conversion element according to claim 1, wherein the at least one kind of polycyclic aromatic compound is devoid of a maximum absorption wavelength in a wavelength region of 500 nm to 600 nm both inclusive.

4. The photoelectric conversion element according to claim 1, wherein the photoelectric conversion layer further contains at least one kind of C60 fullerene or a derivative thereof or C70 fullerene or a derivative thereof.

5. The photoelectric conversion element according to claim 1, wherein a HOMO level of the polycyclic aromatic compound is −6.6 eV to −4.8 eV both inclusive.

6. The photoelectric conversion element according to claim 1, wherein the polycyclic aromatic compound contained in the photoelectric conversion layer is 37.5% to 60% both inclusive by volume ratio.

7. A solid-state imaging device in which pixels each include one or more organic photoelectric conversion sections, the organic photoelectric conversion sections each comprising:
a first electrode and a second electrode that are disposed to face each other; and
a photoelectric conversion layer that is provided between the first electrode and the second electrode, and contains at least one kind of polycyclic aromatic compound represented by any one of a following general formula (2), and a following general formula (3):

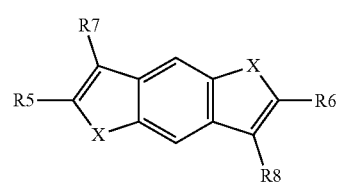

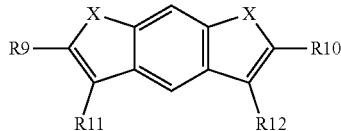

where X is any one of oxygen (O), sulfur (S), selenium (Se), and tellurium (Te);
wherein R7, R8, R11 and R12 are each a hydrogen atom,
wherein R5, R6, R9, and R10 are each independently: a biphenyl group; a terphenyl group; a telphenyl group; or a derivative thereof, each of which has a structure in which two or more phenyl groups are covalent-bonded to one another with a single bond at their para-positions,
wherein the photoelectric conversion layer contains an organic semiconductor material comprising at least one kind of subphthalocyanine or a subphthalocyanine derivative,
wherein the at least one kind of subphthalocyanine or a subphthalocyanine derivative is represented by the following formula (4-1):

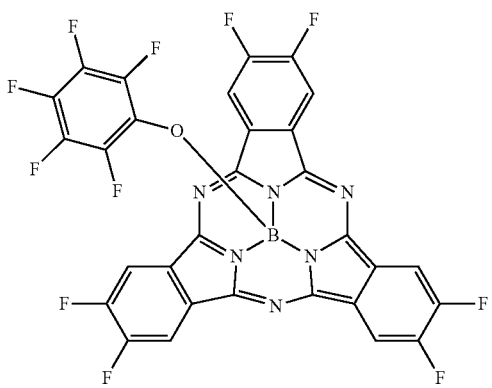

wherein the photoelectric conversion layer is a bulk hetero layer, and
wherein the bulk hetero layer comprises at least one of a crystal grain of the at least one kind of polycyclic compound.

8. The solid-state imaging device according to claim 7, wherein, in each of the pixels, the one or more organic photoelectric conversion sections and one or more inorganic photoelectric conversion sections are stacked, the one or more inorganic photoelectric conversion sections performing photoelectric conversion of a different wavelength region from the organic photoelectric conversion sections.

9. The solid-state imaging device according to claim 8, wherein
the inorganic photoelectric conversion section is formed to be embedded inside a semiconductor substrate, and
the organic photoelectric conversion section is provided on first-surface side of the semiconductor substrate.

10. The solid-state imaging device according to claim 9, wherein a multi-layer wiring layer is formed on a second-surface side of the semiconductor substrate.

11. The solid-state imaging device according to claim 9, wherein
the organic photoelectric conversion section performs photoelectric conversion of green light, and
the inorganic photoelectric conversion section that performs photoelectric conversion of blue light and the inorganic photoelectric conversion section that performs photoelectric conversion of red light are stacked inside the semiconductor substrate.

12. The solid-state imaging device according to claim 7, wherein the at least one kind of polycyclic aromatic compound is devoid of a maximum absorption wavelength in a wavelength region of 500 nm to 600 nm both inclusive.

13. A photoelectric conversion element, comprising:
a first electrode and a second electrode that are disposed to face each other; and
a photoelectric conversion layer that is provided between the first electrode and the second electrode, and contains at least one kind of polycyclic aromatic compound represented by the following general formula (1):

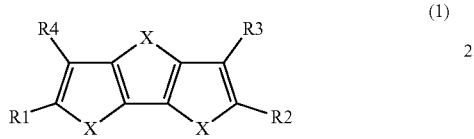

where X is any one of oxygen (O), sulfur (S), selenium (Se), and tellurium (Te);
wherein R3 and R4 are each a hydrogen atom,
wherein R1 and R2 are each independently: a biphenyl group; a terphenyl group; a telphenyl group; or a derivative thereof, each of which has a structure in which two or more phenyl groups are covalent-bonded to one another with a single bond at their para-positions,
wherein the photoelectric conversion layer contains an organic semiconductor material comprising at least one kind of subphthalocyanine or a subsphthalocyanine derivative,
wherein the at least one kind of subphthalocyanine or a subphthalocyanine derivative is represented by the following formula (4-1):

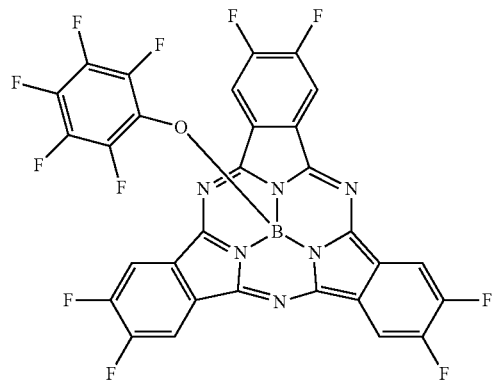

wherein the second electrode is provided above a top portion and around side portions of the photoelectric conversion layer,
wherein the photoelectric conversion layer is a bulk hetero layer, and
wherein the bulk hetero layer comprises at least one of a crystal grain of the at least one kind of polycyclic compound.

14. The photoelectric conversion element according to claim 13, wherein the photoelectric conversion layer contains an organic semiconductor material having a maximum absorption wavelength in a wavelength region of 500 nm to 600 nm both inclusive.

15. The photoelectric conversion element according to claim 13, wherein a HOMO level of the polycyclic aromatic compound is −6.6 eV to −4.8 eV both inclusive.

16. The photoelectric conversion element according to claim 13, wherein the at least one kind of polycyclic aromatic compound is devoid of a maximum absorption wavelength in a wavelength region of 500 nm to 600 nm both inclusive.

* * * * *